United States Patent
Luna

(10) Patent No.: US 9,432,486 B2
(45) Date of Patent: Aug. 30, 2016

(54) SELECTIVE DATA COMPRESSION BY A DISTRIBUTED TRAFFIC MANAGEMENT SYSTEM TO REDUCE MOBILE DATA TRAFFIC AND SIGNALING TRAFFIC

(71) Applicant: Seven Networks, LLC, San Carlos, CA (US)

(72) Inventor: Michael Luna, San Carlos, CA (US)

(73) Assignee: Seven Networks, LLC, Marshall, TX (US)

( * ) Notice: Subject to any disclaimer, the term of this patent is extended or adjusted under 35 U.S.C. 154(b) by 0 days.

(21) Appl. No.: 14/714,257

(22) Filed: May 16, 2015

(65) Prior Publication Data

US 2015/0249727 A1    Sep. 3, 2015

Related U.S. Application Data

(63) Continuation of application No. 13/467,159, filed on May 9, 2012, now Pat. No. 9,060,032, which is a continuation-in-part of application No. 13/274,265, filed on Oct. 14, 2011, now Pat. No. 9,021,048.

(Continued)

(51) Int. Cl.
| | |
|---|---|
| H04L 29/06 | (2006.01) |
| H03M 7/30 | (2006.01) |
| G06F 17/30 | (2006.01) |
| H04L 29/08 | (2006.01) |

(Continued)

(52) U.S. Cl.
CPC ......... *H04L 69/04* (2013.01); *G06F 17/30153* (2013.01); *H03M 7/30* (2013.01); *H03M 7/3084* (2013.01); *H03M 7/3088* (2013.01); *H03M 7/6017* (2013.01); *H04L 67/2828* (2013.01); *H04L 67/42* (2013.01); *H04W 4/005* (2013.01); *H04W 4/02* (2013.01); *H04W 4/12* (2013.01); *H04W 4/20* (2013.01)

(58) Field of Classification Search
CPC ............... H04L 67/2838; H04L 69/04; H04L 29/06176; H04L 43/50; H04L 47/10; H03M 7/30; H03M 7/3088; H03M 7/3084; G06F 17/30153; Y10S 707/99942
See application file for complete search history.

(56) References Cited

U.S. PATENT DOCUMENTS

| | | | |
|---|---|---|---|
| 5,870,722 A * | 2/1999 | Albert | G06Q 20/04 705/39 |
| 6,351,767 B1 | 2/2002 | Batchelder et al. | |

(Continued)

OTHER PUBLICATIONS

Non-Final Office action mailed Dec. 16, 2014 for U.S. Appl. No. 13/467,159.

(Continued)

*Primary Examiner* — Chirag R Patel
(74) *Attorney, Agent, or Firm* — NK Patent Law, PLLC

(57) ABSTRACT

Selective data compression by a distributed traffic management system to reduce mobile and/or signaling traffic are disclosed. In one embodiment, the method can include, for example: compressing an uncompressed data chunk in a data stream to be transmitted over the wireless network to generate a compressed data chunk, comparing sizes of the uncompressed data chunk with the compressed data chunk, transmitting an optimized data stream comprising of the uncompressed data chunk or the compressed data chunk over the wireless network, depending on which is smaller in size. In one embodiment, a header can be included in the optimized data stream to indicate which of uncompressed data chunk and the compressed data chunk is transmitted.

12 Claims, 45 Drawing Sheets

Related U.S. Application Data

(60) Provisional application No. 61/533,021, filed on Sep. 9, 2011, provisional application No. 61/533,007, filed on Sep. 9, 2011, provisional application No. 61/532,857, filed on Sep. 9, 2011, provisional application No. 61/430,828, filed on Jan. 7, 2011, provisional application No. 61/416,033, filed on Nov. 22, 2010, provisional application No. 61/416,020, filed on Nov. 22, 2010, provisional application No. 61/408,854, filed on Nov. 1, 2010, provisional application No. 61/408,846, filed on Nov. 1, 2010, provisional application No. 61/408,839, filed on Nov. 1, 2010, provisional application No. 61/408,829, filed on Nov. 1, 2010, provisional application No. 61/408,826, filed on Nov. 1, 2010, provisional application No. 61/408,820, filed on Nov. 1, 2010, provisional application No. 61/408,858, filed on Nov. 1, 2010.

(51) Int. Cl.
*H04W 4/00* (2009.01)
*H04W 4/02* (2009.01)
*H04W 4/12* (2009.01)
*H04W 4/20* (2009.01)

(56) References Cited

U.S. PATENT DOCUMENTS

| | | | |
|---|---|---|---|
| 6,389,422 B1 | 5/2002 | Doi et al. | |
| 6,871,236 B2 | 3/2005 | Fishman et al. | |
| 7,188,214 B1 * | 3/2007 | Kasriel | G06F 17/30902 707/E17.12 |
| 7,305,252 B2 | 12/2007 | Britt et al. | |
| 7,398,271 B1 | 7/2008 | Borkovsky et al. | |
| 7,443,321 B1 * | 10/2008 | Kaufman | G06F 17/30312 341/106 |
| 7,516,208 B1 | 4/2009 | Kerrison et al. | |
| 7,516,238 B2 | 4/2009 | Key et al. | |
| 7,548,947 B2 | 6/2009 | Kasriel et al. | |
| 7,548,969 B2 | 6/2009 | Tripp et al. | |
| 7,613,792 B2 | 11/2009 | Zervas et al. | |
| 7,769,805 B1 | 8/2010 | Barnes et al. | |
| 7,856,530 B1 | 12/2010 | Mu | |
| 7,899,996 B1 | 3/2011 | Levin-Michael | |
| 7,920,590 B2 * | 4/2011 | Le | H04L 69/04 370/467 |
| 7,937,091 B2 | 5/2011 | Roman et al. | |
| 7,953,934 B2 | 5/2011 | Thomas et al. | |
| 7,970,860 B2 | 6/2011 | Kline et al. | |
| 7,996,487 B2 | 8/2011 | Snyder | |
| 8,005,891 B2 | 8/2011 | Knowles et al. | |
| 8,024,452 B2 | 9/2011 | Shenfield et al. | |
| 8,041,792 B2 | 10/2011 | Donaghey et al. | |
| 8,068,478 B2 * | 11/2011 | Cruz | H04L 12/2854 370/351 |
| 8,306,581 B2 * | 11/2012 | Mohanty | H04W 52/0216 455/127.5 |
| 8,412,932 B2 | 4/2013 | Schneider | |
| 8,577,732 B1 | 11/2013 | Martin et al. | |
| 2001/0032254 A1 | 10/2001 | Hawkins | |
| 2002/0062384 A1 | 5/2002 | Tso | |
| 2002/0078209 A1 | 6/2002 | Peng | |
| 2002/0174189 A1 | 11/2002 | Peng | |
| 2002/0191596 A1 | 12/2002 | Moyano et al. | |
| 2003/0187984 A1 | 10/2003 | Banavar et al. | |
| 2004/0068579 A1 | 4/2004 | Marmigere et al. | |
| 2004/0181550 A1 | 9/2004 | Warsta et al. | |
| 2005/0071451 A1 | 3/2005 | Key et al. | |
| 2005/0120181 A1 | 6/2005 | Arunagirinathan et al. | |
| 2005/0154836 A1 | 7/2005 | Steely et al. | |
| 2005/0165909 A1 | 7/2005 | Cromer et al. | |
| 2005/0185677 A1 | 8/2005 | Christoffersson et al. | |
| 2005/0193096 A1 | 9/2005 | Yu et al. | |
| 2005/0210125 A1 | 9/2005 | Li | |
| 2006/0069742 A1 | 3/2006 | Segre | |
| 2006/0123042 A1 | 6/2006 | Xie et al. | |
| 2006/0139674 A1 * | 6/2006 | Oshima | G06F 3/1209 358/1.13 |
| 2006/0248040 A1 | 11/2006 | Tolvanen et al. | |
| 2006/0277271 A1 | 12/2006 | Morse et al. | |
| 2006/0294223 A1 | 12/2006 | Glasgow et al. | |
| 2007/0106852 A1 | 5/2007 | Lam et al. | |
| 2007/0156842 A1 | 7/2007 | Vermeulen et al. | |
| 2007/0171907 A1 * | 7/2007 | Mansutti | H04L 29/06027 370/389 |
| 2007/0179985 A1 | 8/2007 | Knowles et al. | |
| 2007/0198734 A1 | 8/2007 | Knowles et al. | |
| 2007/0244987 A1 | 10/2007 | Pedersen et al. | |
| 2007/0245010 A1 | 10/2007 | Arn et al. | |
| 2008/0085724 A1 | 4/2008 | Cormier et al. | |
| 2008/0166999 A1 | 7/2008 | Guedalia et al. | |
| 2008/0167019 A1 | 7/2008 | Guedalia et al. | |
| 2008/0183800 A1 | 7/2008 | Herzog et al. | |
| 2008/0229137 A1 * | 9/2008 | Samuels | H04L 69/04 713/600 |
| 2008/0273498 A1 | 11/2008 | Jalil et al. | |
| 2008/0301300 A1 | 12/2008 | Toub | |
| 2009/0077263 A1 | 3/2009 | Koganti et al. | |
| 2009/0187939 A1 | 7/2009 | Lajoie | |
| 2009/0222901 A1 | 9/2009 | Schneider | |
| 2009/0248696 A1 | 10/2009 | Rowles et al. | |
| 2009/0282125 A1 | 11/2009 | Jeide et al. | |
| 2009/0287509 A1 | 11/2009 | Banavar et al. | |
| 2010/0077035 A1 | 3/2010 | Li et al. | |
| 2010/0087167 A1 | 4/2010 | Tsurutome et al. | |
| 2010/0131617 A1 | 5/2010 | Osborne et al. | |
| 2010/0274857 A1 | 10/2010 | Garza et al. | |
| 2011/0040718 A1 | 2/2011 | Tendjoukian et al. | |
| 2011/0065424 A1 | 3/2011 | Estevez et al. | |
| 2011/0137973 A1 | 6/2011 | Wei et al. | |
| 2011/0179138 A1 | 7/2011 | Van Geest et al. | |
| 2011/0208810 A1 | 8/2011 | Li et al. | |
| 2011/0213800 A1 | 9/2011 | Saros et al. | |
| 2011/0264791 A1 | 10/2011 | Luu et al. | |
| 2011/0302154 A1 | 12/2011 | Snyder | |
| 2012/0078996 A1 | 3/2012 | Shah | |
| 2012/0254417 A1 | 10/2012 | Luna | |

OTHER PUBLICATIONS

Non-Final Office action mailed Aug. 1, 2014 for U.S. Appl. No. 13/467,159.

Final Office action mailed Feb. 4, 2015 for U.S. Appl. No. 13/274,501.

Non-Final Office action mailed Jun. 11, 2014 for U.S. Appl. No. 13/274,501.

Final Office action mailed Jun. 28, 2012 for U.S. Appl. No. 13/274,501.

Non-Final Office action mailed Jan. 9, 2012 for U.S. Appl. No. 13/274,501.

Final Office action mailed Feb. 4, 2015 for U.S. Appl. No. 13/274,265.

Non-Final Office action mailed May 1, 2014 for U.S. Appl. No. 13/274,265.

Final Office action mailed Oct. 11, 2012 for U.S. Appl. No. 13/274,265.

Non-Final Office action mailed Jul. 2, 2012 for U.S. Appl. No. 13/274,265.

Non-Final Office action mailed Jan. 3, 2012 for U.S. Appl. No. 13/274,265.

\* cited by examiner

| Traffic Category/Application Category 700 ||
|---|---|
| Interactive traffic | Background traffic |
| User waiting for response | User not waiting for response |
| Application in foreground | Application in background |
| Backlight on | Backlight off |

*FIG. 7*

| Content Category 800 ||
|---|---|
| High priority | Low priority |
| Time critical | Non-time critical |

*FIG. 8*

| Mobile Application/Widget 955 | Local Proxy 965 | Host server 985 Server Cache 935 or Caching Proxy 975 | Application Server/ Content Provider 995 |
|---|---|---|---|
| Polls application server/provider 932 | Poll intercepted 934 | | |
| | Proxy detects that cache content is available for the polled content and is valid and thus retrieves a response to satisfy the poll 936 | | |
| Receives a response to the poll from a cache entry 938 | | | |
| Polls application server/provider 940 | Poll intercepted 942 | | |
| | Proxy detects that cache content is unavailable and decides to setup the polled source for caching 944 | | |
| | Poll request forwarded to the source 946 | | Receives the poll request from the application and provides a response to satisfy the current request 948 |
| Receives the response to satisfy the request from the application server/provider 950 | | | |
| | Tracks polling frequency of the application and sets up a polling schedule for the host server 952 | | |
| | Sends the cache setup to the host server 954 | | |
| | | Receives the cache setup including an identification of the application server/provider to be polled and a polling schedule 956 | |
| | | Polls the Application server/provider to monitor the response to the request 958 | Receives poll from host server and sends the response 960 |
| | | Same response received, pulls the application based on the polling schedule 962 | Receives poll from host server and sends the response 964 |
| | | Detects changed or new response; notifies the local proxy 966 | |
| | | Changed or new response stored in the server cache or the caching proxy 968 | |
| | Receives notification that new or changed data is available; invalidates relevant cache entries 970 | | |
| Polls application server/content provider 972 | Determines that no valid cache entry is available and retrieves the response from the server cache 974 | Receives request for the new response and sends the response to the local proxy 976 | |
| Request satisfied from the server cache or caching proxy 978 | | | |
| Polls application server/content provider 980 | Determines that no valid cache entry is available and forwards the poll to the application server/ provider 982 | | Receives poll from and sends the response 984 |
| Request satisfied from the application server/provider 986 | | | |

*FIG. 9*

| Mobile Application/Widget 1055 | Local Proxy 1065 | Host server 1085 Server Cache 1035 or Caching Proxy 1075 | Application Server/ Content Provider 1095 |
|---|---|---|---|
| Polls application server/provider 1032 | Poll intercepted and proxy determines that a cache defeating mechanism is employed by the server/provider 1034 | | |
| | Proxy detects that cache content is available for the polled content and decides to retrieve a response to satisfy the poll 1036 | | |
| Receives a response to the poll from a cache entry 1038 | | | |
| Polls application server/provider 1040 | Poll intercepted and proxy determines that a cache defeating mechanism is employed by the server/provider 1042 | | |
| | Proxy detects that cache content is unavailable and decides to setup the polled source for caching 1044 | | |
| | Extracts a pattern of an identifier of the request and tracks polling frequency of the application and sets up a polling schedule for the host server 1046 | | |
| | Poll request forwarded to the source 1048 | | Receives the poll request from the application and provides a response to satisfy the current request 1050 |
| Receives the response to satisfy the request from the application server/provider 1052 | Cache the response and store a normalized version of the identifier in association with the received response for future identification and retrieval 1054 | | |
| | Sends the cache setup to the host server, including the identifier or a normalized version of the identifier 1056 | Receives the cache setup including an identification of the application server/provider to be polled and a polling schedule 1058 | |
| | | Polls the Application server/provider to monitor the response to the request 1060 | Receives poll from host server and sends the response 1062 |
| | | Same response received, pulls the application based on the polling schedule 1064 | Receives poll from host server and sends the response 1066 |
| | | Detects changed or new response; notifies the local proxy 1068 | |
| | | Changed or new response stored in the server cache or the caching proxy 1070 | |
| | Receives notification that new or changed data is available; invalidates relevant cache entries 1072 | | |
| Polls application server/content provider 1074 | Determines that no valid cache entry is available and retrieves the response from the server cache 1076 | Receives request for the new response and sends the response to the local proxy 1078 | |
| Request satisfied from the server cache or caching proxy 1080 | | | |
| Polls application server/content provider 1082 | Determines that no valid cache entry is available and forwards the poll to the application server/provider 1084 | | Receives poll from and sends the response 1086 |
| Request satisfied from the application server/provider 1088 | | | |

*FIG. 10*

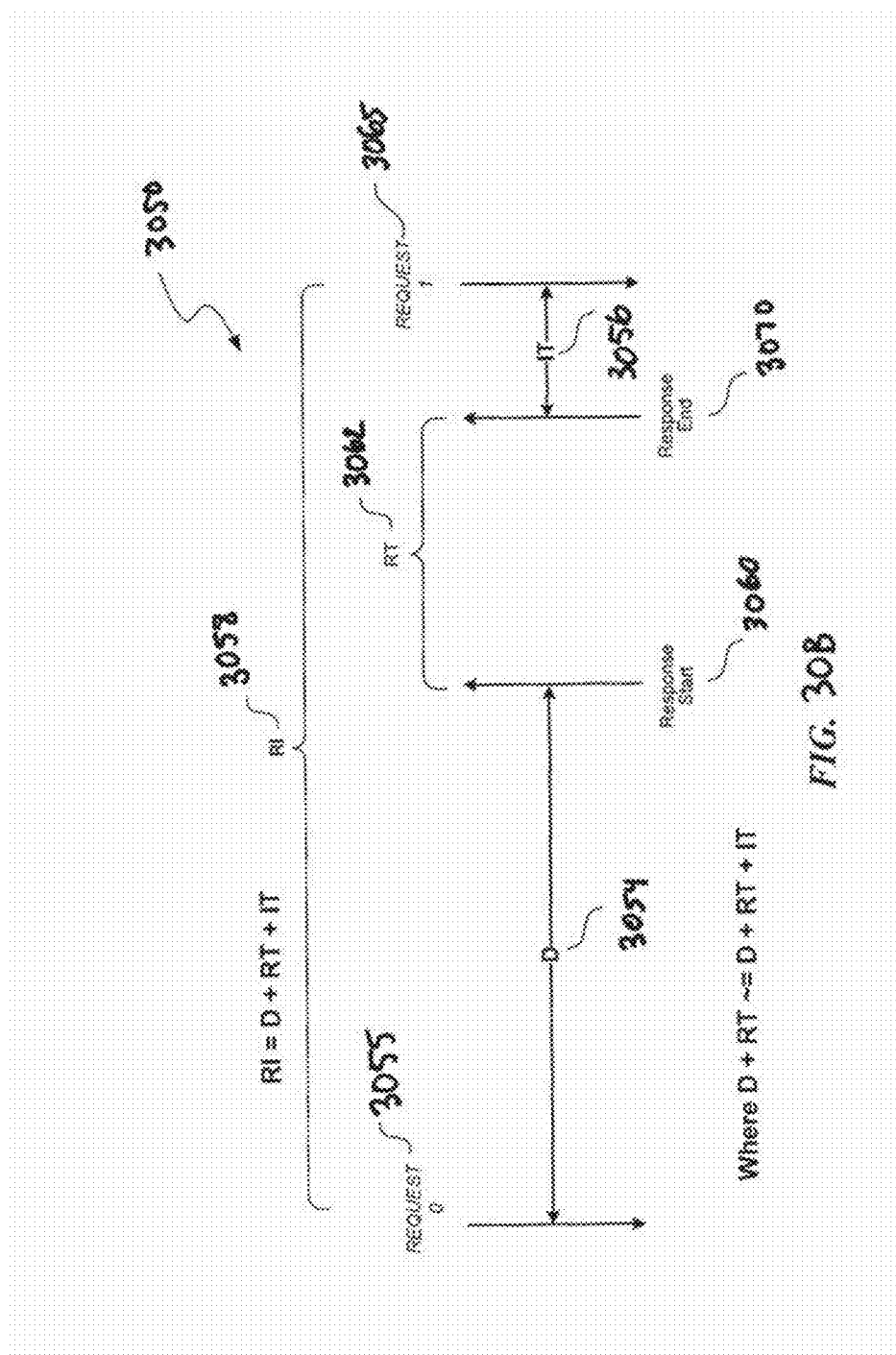

SELECTIVE DATA COMPRESSION BY A DISTRIBUTED TRAFFIC MANAGEMENT SYSTEM TO REDUCE MOBILE DATA TRAFFIC AND SIGNALING TRAFFIC

CROSS-REFERENCE TO RELATED APPLICATIONS

This application is a Continuation and claims the benefit of U.S. patent application Ser. No. 13/467,159 entitled "SELECTIVE DATA COMPRESSION BY A DISTRIBUTED TRAFFIC MANAGEMENT SYSTEM TO REDUCE MOBILE DATA TRAFFIC AND SIGNALING TRAFFIC," which was filed on May 9, 2012, which is a Continuation-In-Part and claims the benefit of U.S. patent application Ser. No. 13/274,265 entitled "Caching Adapted For Mobile Application Behavior and Network Conditions," which was filed on Oct. 14, 2011 which claims the benefit of U.S. Provisional Patent Application No. 61/408,858 entitled "CROSS APPLICATION TRAFFIC COORDINATION", which was filed on Nov. 1, 2010, U.S. Provisional Patent Application No. 61/408,839 entitled "ACTIVITY SESSION AS METHOD OF OPTIMIZING NETWORK RESOURCE USE", which was filed on Nov. 1, 2010, U.S. Provisional Patent Application No. 61/408,829 entitled "DISTRIBUTED POLICY MANAGEMENT", which was filed on Nov. 1, 2010, U.S. Provisional Patent Application No. 61/408,846 entitled "INTELLIGENT CACHE MANAGEMENT IN CONGESTED WIRELESS NETWORKS", which was filed on Nov. 1, 2010, U.S. Provisional Patent Application No. 61/408,854 entitled "INTELLIGENT MANAGEMENT OF NON-CACHEABLE CONTENT IN WIRELESS NETWORKS", which was filed on Nov. 1, 2010, U.S. Provisional Patent Application No. 61/408,826 entitled "ONE WAY INTELLIGENT HEARTBEAT", which was filed on Nov. 1, 2010, U.S. Provisional Patent Application No. 61/408,820 entitled "TRAFFIC CATEGORIZATION AND POLICY DRIVING RADIO STATE", which was filed on Nov. 1, 2010, U.S. Provisional Patent Application No. 61/416,020 entitled "ALIGNING BURSTS FROM SERVER TO CLIENT", which was filed on Nov. 22, 2010, U.S. Provisional Patent Application No. 61/416,033 entitled "POLLING INTERVAL FUNCTIONS", which was filed on Nov. 22, 2010, U.S. Provisional Patent Application No. 61/430,828 entitled "DOMAIN NAME SYSTEM WITH NETWORK TRAFFIC HARMONIZATION", which was filed on Jan. 7, 2011, U.S. Provisional Patent Application No. 61/532,857 entitled "CACHE DEFEAT DETECTION AND CACHING OF CONTENT ADDRESSED BY IDENTIFIERS INTENDED TO DEFEAT CACHE", which was filed on Sep. 9, 2011, U.S. Provisional Patent Application No. 61/533,007 entitled "DISTRIBUTED CACHING IN A WIRELESS NETWORK OF CONTENT DELIVERED FOR A MOBILE APPLICATION OVER A LONG-HELD REQUEST", which was filed on Sep. 9, 2011, and U.S. Provisional Patent Application No. 61/533,021 entitled "APPLICATION AND NETWORK-BASED LONG POLL REQUEST DETECTION AND CACHEABILITY ASSESSMENT THEREFOR", which was filed on Sep. 9, 2011, the contents of which are all incorporated by reference herein.

This application is related to U.S. patent application Ser. No. 13/176,537 entitled "DISTRIBUTED CACHING AND RESOURCE AND MOBILE NETWORK TRAFFIC MANAGEMENT," which was filed on Jul. 5, 2011, the contents of which are herein incorporated by reference.

This application is related to U.S. patent application Ser. No. 13/274,501 entitled "Request and Response Characteristics based Adaptation of Distributed Caching In A Mobile Network", which was filed on Oct. 17, 2011, and the contents of which are herein incorporated by reference.

This application is related to U.S. patent application Ser. No. 13/274,250 entitled "Distributed Caching In A Wireless Network Of Content Delivered For A Mobile Application Over A Long-Held Request", which was filed on Oct. 14, 2011, and the contents of which are herein incorporated by reference.

This application is related to U.S. patent application Ser. No. 13/274,248 entitled "APPLICATION AND NETWORK-BASED LONG POLL REQUEST DETECTION AND CACHEABILITY ASSESSMENT THEREFOR", which was filed on Oct. 14, 2011 and now is U.S. Pat. No. 8,166,164, and the contents of which are herein incorporated by reference.

BACKGROUND

Applications are changing the industry as carriers and handset manufacturers, both, are seeking partnerships with application and content providers to differentiate their products and services. For the network, this can only mean more signaling and bandwidth challenges, on top of the unsolved problems of today. The 4G/LTE network roll out is expected to help with added bandwidth, but it may lead users to use more data neutralizing that benefit. For signaling, though, 4G/LTE won't be a fix for a number of reasons including the flat network design and the fact that the only devices on a 4G network are Smart phones. With a mass migration from a wired world to everything mobile at the forefront of the industry and the network, traffic optimization is going to be a critical part of keeping network performance and user satisfaction very high.

BRIEF DESCRIPTION OF THE DRAWINGS

FIG. 7 depicts a table showing examples of different traffic or application category types which can be used in implementing network access and content delivery policies.

FIG. 8 depicts a table showing examples of different content category types which can be used in implementing network access and content delivery policies.

FIG. 9 depicts an interaction diagram showing how polls having data requests from a mobile device (e.g., any wireless device) to an application server/content provider over a wireless network (or broadband network) can be can be cached on the local proxy and managed by the distributed caching system.

FIG. 10 depicts an interaction diagram showing how polls for content from an application server/content provider which employs cache-defeating mechanisms in identifiers (e.g., identifiers intended to defeat caching) over a wireless network (or broadband network) can be detected and locally cached.

FIG. 30B depicts an example of a timing diagram showing timing characteristics for request-response sequences characteristic of a long poll.

DETAILED DESCRIPTION

Figure 1A:
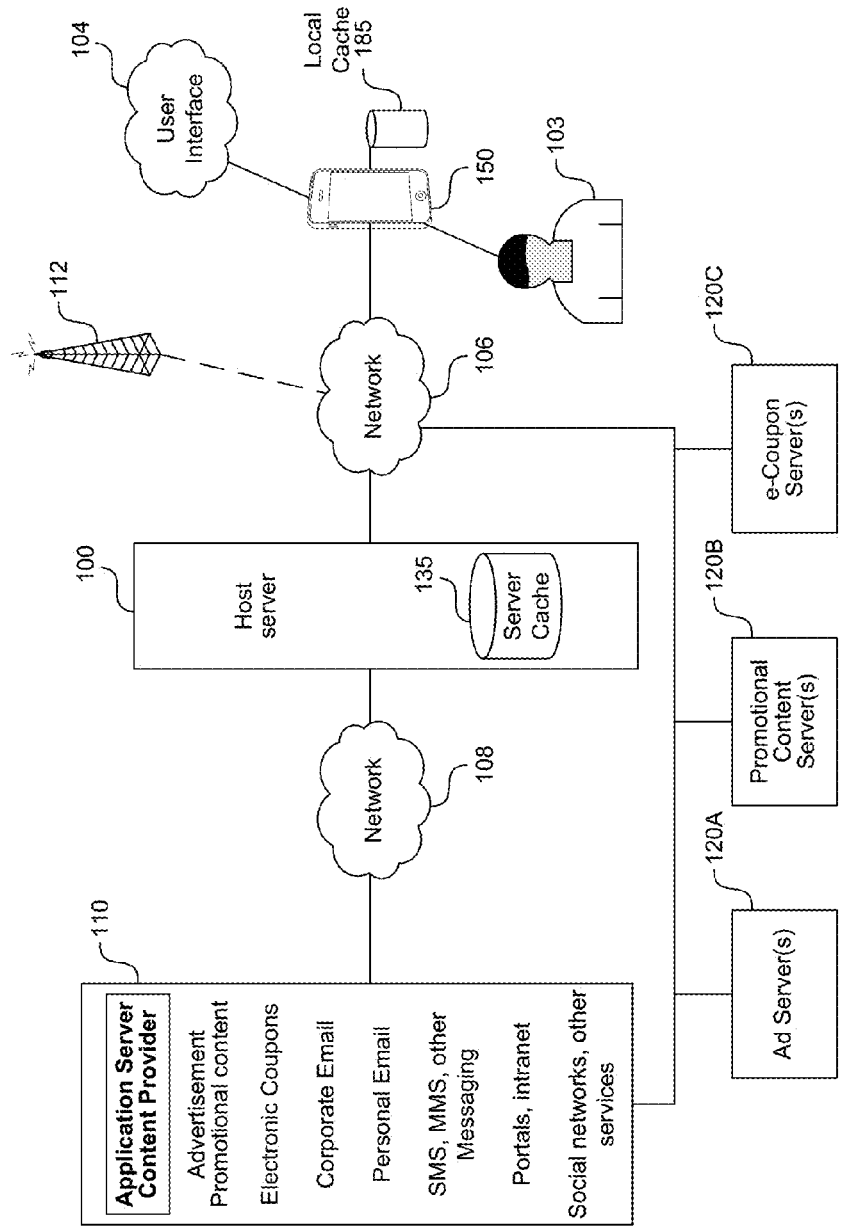
FIG. 1A illustrates an example diagram of a system where a host server facilitates management of traffic, content caching, and/or resource conservation between mobile devices (e.g., wireless devices), an application server or content provider, or other servers such as an ad server, promotional content server, or an e-coupon server in a wireless network (or broadband network) for resource conservation. The host server can further facilitate selective data compression for the reduction of mobile data traffic and signaling traffic.

The following description and drawings are illustrative and are not to be construed as limiting. Numerous specific details are described to provide a thorough understanding of the disclosure. However, in certain instances, well-known or conventional details are not described in order to avoid obscuring the description. References to "one embodiment" or "an embodiment" in the present disclosure can be, but not necessarily are, references to the same embodiment and such references mean at least one of the embodiments.

Reference in this specification to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

The terms used in this specification generally have their ordinary meanings in the art, within the context of the disclosure, and in the specific context where each term is used. Certain terms that are used to describe the disclosure are discussed below, or elsewhere in the specification, to provide additional guidance to the practitioner regarding the description of the disclosure. For convenience, certain terms may be highlighted, for example using italics and/or quotation marks. The use of highlighting has no influence on the scope and meaning of a term; the scope and meaning of a term is the same, in the same context, whether or not it is highlighted. It will be appreciated that same thing can be said in more than one way.

Consequently, alternative language and synonyms may be used for any one or more of the terms discussed herein, nor is any special significance to be placed upon whether or not a term is elaborated or discussed herein. Synonyms for certain terms are provided. A recital of one or more synonyms does not exclude the use of other synonyms. The use of examples anywhere in this specification, including examples of any terms discussed herein, is illustrative only, and is not intended to further limit the scope and meaning of the disclosure or of any exemplified term. Likewise, the disclosure is not limited to various embodiments given in this specification.

Without intent to limit the scope of the disclosure, examples of instruments, apparatus, methods and their related results according to the embodiments of the present disclosure are given below. Note that titles or subtitles may be used in the examples for convenience of a reader, which in no way should limit the scope of the disclosure. Unless otherwise defined, all technical and scientific terms used herein have the same meaning as commonly understood by one of ordinary skill in the art to which this disclosure pertains. In the case of conflict, the present document, including definitions, will control.

Embodiments of the present disclosure include systems and methods of selective data compression to reduce mobile data and signaling traffic.

There are multiple factors that contribute to the proliferation of data: the end-user, mobile devices, wireless devices, mobile applications, and the network. As mobile devices evolve, so do the various elements associated with them-availability, applications, user behavior, location thus changing the way the network interacts with the device and the application.

The disclosed technology provides a comprehensive and end-to-end solution that is able to address each element for operators and devices manufacturers to support both the shift in mobile or wireless devices and the surge in data by leveraging the premise that mobile content has a definable or relevant "freshness" value. The "freshness" of mobile content can be determined, either with certainty, or with some heuristics having a tolerance within which the user experience is enhanced, or not negatively impacted, or negatively impacted but is either not perceptible to the user or within a tolerable threshold level.

The disclosed innovation transparently determines such "freshness" by monitoring, analyzing, and applying rules (which may be heuristically determined) the transactions (requests/responses) between applications (e.g., mobile applications) and the peers (corresponding server or other clients). Moreover, the technology is further able to effectively cache content which may be marked by its originating/host server as being "non-cacheable" and identify some "freshness" value which can then be used in implementing application-specific caching. In general, the "freshness" value has an approximate minimum value which is typically determined using the update interval (e.g., interval with which requests are sent) between the application and its corresponding server/host.

One embodiment of the disclosed technology includes a system that optimizes multiple aspects of the connection with wired and wireless networks and devices through a comprehensive view of device and application activity including: loading, current application needs on a device, controlling the type of access (push vs. pull or hybrid), location, concentration of users in a single area, time of day, how often the user interacts with the application, content or device, and using this information to shape traffic to a cooperative client/server or simultaneously mobile devices without a cooperative client. Because the disclosed server is not tied to any specific network provider it has visibility into the network performance across all service providers. This enables optimizations to be applied to devices regardless of the operator or service provider, thereby enhancing the user experience and managing network utilization while roaming. Bandwidth has been considered a major issue in wireless networks today. More and more research has been done related to the need for additional bandwidth to solve access problems. Many of the performance enhancing solutions and next generation standards, such as those commonly referred to as 3.5G, LTE, 4G, and WiMAX, are focused on providing increased bandwidth. Although partially addressed by the standards, a key problem that remains is lack of bandwidth on the signaling channel more so than the data channel and the standard does not address battery life very well.

Embodiments of the disclosed technology includes, for example, alignment of requests from multiple applications to minimize the need for several polling requests; leverage specific content types to determine how to proxy/manage a connection/content; and applying specific heuristics associated with device, user behavioral patterns (how often they interact with the device/application) and/or network parameters.

Embodiments of the present technology can further include, moving recurring HTTP polls performed by various widgets, RSS readers, etc., to remote network node (e.g., Network Operation Center (NOC)), thus considerably lowering device battery/power consumption, radio channel signaling and bandwidth usage. Additionally, the offloading can be performed transparently so that existing applications do not need to be changed.

In some embodiments, this can be implemented using a local proxy on the mobile device (e.g., any wireless device) which automatically detects recurring requests for the same content (RSS feed, Widget data set) that matches a specific rule (e.g., happens every 15 minutes). The local proxy can automatically cache the content on the mobile device while delegating the polling to the server (e.g., a proxy server operated as an element of a communications network). The server can then notify the mobile/client proxy if the content changes, and if content has not changed (or not changed sufficiently, or in an identified manner or amount) the mobile proxy provides the latest version in its cache to the user (without need to utilize the radio at all). This way the mobile or wireless device (e.g., a mobile phone, smart phone, M2M module/MODEM, or any other wireless devices, etc.) does not need to open (e.g., thus powering on the radio) or use a data connection if the request is for content that is monitored and that has been not flagged as new/changed.

The logic for automatically adding content sources/application servers (e.g., including URLs/content) to be monitored can also check for various factors like how often the content is the same, how often the same request is made (is there a fixed interval/pattern?), which application is requesting the data, etc. Similar rules to decide between using the cache and request the data from the original source may also be implemented and executed by the local proxy and/or server.

For example, when the request comes at an unscheduled/unexpected time (user initiated check), or after every (n) consecutive times the response has been provided from the cache, etc., or if the application is running in the background vs. in a more interactive mode of the foreground. As more and more mobile applications or wireless enabled applications base their features on resources available in the network, this becomes increasingly important. In addition, the disclosed technology allows elimination of unnecessary chatter from the network, benefiting the operators trying to optimize the wireless spectrum usage.

Traffic Categorization and Policy

In some embodiments, the disclosed proxy system is able to establish policies for choosing traffic (data, content, messages, updates, etc.) to cache and/or shape. Additionally, by combining information from observing the application making the network requests, getting explicit information from the application, or knowing the network destination the application is reaching, the disclosed technology can determine or infer what category the transmitted traffic belongs to.

For example, in one embodiment, mobile or wireless traffic can be categorized as: (a1) interactive traffic or (a2) background traffic. The difference is that in (a1) a user is actively waiting for a response, while in (2) a user is not expecting a response. This categorization can be used in conjunction with or in lieu of a second type of categorization of traffic: (b1) immediate, (b2) low priority, (b3) immediate if the requesting application is in the foreground and active.

For example, a new update, message or email may be in the (b1) category to be delivered immediately, but it still is (a2) background traffic—a user is not actively waiting for it. A similar categorization applies to instant messages when they come outside of an active chat session. During an active chat session a user is expecting a response faster. Such user expectations are determined or inferred and factored into when optimizing network use and device resources in performing traffic categorization and policy implementation.

Some examples of the applications of the described categorization scheme, include the following: (a1) interactive traffic can be categorized as (b1) immediate—but (a2) background traffic may also be (b2) or (b3). An example of a low priority transfer is email or message maintenance transaction such as deleting email or other messages or marking email as read at the mail or application server. Such a transfer can typically occur at the earlier of (a) timer exceeding a timeout value (for example, 2 minutes), and (b) data being sent for other purposes.

An example of (b3) is IM presence updates, stock ticker updates, weather updates, status updates, news feeds. When the UI of the application is in the foreground and/or active (for example, as indicated by the backlight of the device/phone being lit or as determined or inferred from the status of other sensors), updates can be considered immediate whenever server has something to push to the device. When the application is not in the foreground or not active, such updates can be suppressed until the application comes to foreground and is active.

With some embodiments, networks can be selected or optimized simultaneously for (a1) interactive traffic and (a2) background traffic.

In some embodiments, as the wireless device or mobile device proxy (separately or in conjunction with the server proxy) is able to categorize the traffic as (for example) (a1) interactive traffic or (a2) background traffic, it can apply different policies to different types of traffic. This means that it can internally operate differently for (a1) and (a2) traffic (for example, by allowing interactive traffic to go through to the network in whole or in part, and apply stricter traffic control to background traffic; or the device side only allows a request to activate the radio if it has received information from the server that the content at the host has been updated, etc.).

When the request does require access over the wireless network, the disclosed technology can request the radio layer to apply different network configurations to different traffic. Depending on the type of traffic and network this may be achieved by different means:

(1) Using 3G/4G for (a1) and 2G/2.5G for (a2);

(2) Explicitly specifying network configuration for different data sets (e.g. in terms of use of FACH (forward access channel) vs. DCH (dedicated channel), or otherwise requesting lower/more network efficient data rates for background traffic); or (3) Utilizing different network access points for different data sets (access points which would be configured to use network resources differently similar to (1) and (2) above).

Additionally, 3GPP Fast Dormancy calls for improvements so that applications, operating systems or the mobile device would have awareness of the traffic type to be more efficient in the future. Embodiments of the disclosed system, having the knowledge of the traffic category and being able to utilize Fast Dormancy appropriately may solve the problem identified in Fast Dormancy. This way the mobile or broadband network does not need to be configured with a compromised configuration that adversely impacts both battery consumption and network signaling resources.

Polling Schedule

Detecting (or determining) a polling schedule allows the proxy server (server-side of the distributed cache system) to be as close as possible with its polls to the application polls. Many applications employ scheduled interval polling (e.g., every 4 hours or every 30 seconds, at another time interval). The client side proxy can detect automatic polls based on time measurements and create a automatic polling profile for an application. As an example, the local proxy attempts to detect the time interval between requests and after 2, 3, 4, or more polls, determines an automatic rate if the time intervals are all within 1 second (or another measure of relative closeness) of each other. If not, the client may collect data from a greater number of polling events (e.g., 10-12 polls) and apply a statistical analysis to determine, compute, or estimate a value for the average interval that is used. The polling profile is delivered to the server where it is used. If it is a frequent manual request, the locally proxy can substitute it with a default interval for this application taken from a profile for non-critical applications.

In some embodiments, the local proxy (e.g., device side proxy) may keep monitoring the application/client polls and update the polling interval. If it changes by more than 30% (or another predetermined/dynamic/conditional value) from the current value, it is communicated to the proxy server (e.g., server-side proxy). This approach can be referred to as the scenario of "lost interest." In some instances, the local proxy can recognize requests made outside of this schedule, consider them "manual," and treat them accordingly.

Application Classes/Modes of Caching

In some embodiments, applications can be organized into three groups or modes of caching. Each mobile client/application can be categorized to be treated as one of these modes, or treated using multiple modes, depending on one or more conditions.

A) Fully cached—local proxy updates (e.g., sends application requests directly over the network to be serviced by the application server/content host) only when the proxy server tells the local proxy to update. In this mode, the local proxy can ignore manual requests and the proxy server uses the detected automatic profile (e.g., sports score applets, Facebook, every 10, 15, 30, or more polls) to poll the application server/content provider.

B) Partially cached—the local proxy uses the local or internal cache for automatic requests (e.g., application automatic refreshes), other scheduled requests but passes through some manual requests (e.g., email download, Ebay or some Facebook requests); and C) Never cached (e.g., real-time stock ticker, sports scores/statuses; however, in some instances, 15 minutes delayed quotes can be safely placed on 30 seconds schedules—B or even A).

The actual application or caching mode classification can be determined based on the rate of content change and critical character of data. Unclassified applications by default can be set as class C.

Backlight and Active Applications

In some embodiments, the local proxy starts by detecting the device backlight status. Requests made with the screen light 'off' can be allowed to use the local cache if a request with identical signature is registered with the proxy server, which is polling the original host server/content server(s) to which the requests are directed. If the screen light is 'on', further detection can be made to determine whether it is a background application or for other indicators that local cache entries can or cannot be used to satisfy the request. When identified, the requests for which local entries can be used may be processed identically to the screen light off situation. Foreground requests can use the aforementioned application classification to assess when cached data is safe to use to process requests.

FIG. 1A illustrates an example diagram of a system where a host server 100 facilitates management of traffic, content caching, and/or resource conservation between mobile devices (e.g., wireless devices 150), and an application server or content provider 110, or other servers such as an ad server 120A, promotional content server 120B, or an e-coupon server 120C in a wireless network (or broadband network) for resource conservation. The host server can further facilitate selective data compression for the reduction of mobile data traffic and signaling traffic.

The client devices 150 can be any system and/or device, and/or any combination of devices/systems that is able to establish a connection, including wired, wireless, cellular connections with another device, a server and/or other systems such as host server 100 and/or application server/content provider 110. Client devices 150 will typically include a display and/or other output functionalities to present information and data exchanged between among the devices 150 and/or the host server 100 and/or application server/content provider 110. The application server/content provider 110 can by any server including third party servers or service/content providers further including advertisement, promotional content, publication, or electronic coupon servers or services. Similarly, separate advertisement servers 120A, promotional content servers 120B, and/or e-Coupon servers 120C as application servers or content providers are illustrated by way of example.

For example, the client devices 150 can include mobile, hand held or portable devices, wireless devices, or non-portable devices and can be any of, but not limited to, a server desktop, a desktop computer, a computer cluster, or portable devices, including a notebook, a laptop computer, a handheld computer, a palmtop computer, a mobile phone, a cell phone, a smart phone, a PDA, a Blackberry device, a Palm device, a handheld tablet (e.g., an iPad or any other tablet), a hand held console, a hand held gaming device or console, any SuperPhone such as the iPhone, and/or any other portable, mobile, hand held devices, or fixed wireless interface such as a M2M device, etc. In one embodiment, the client devices 150, host server 100, and application server 110 are coupled via a network 106 and/or a network 108. In some embodiments, the devices 150 and host server 100 may be directly connected to one another.

The input mechanism on client devices 150 can include touch screen keypad (including single touch, multi-touch, gesture sensing in 2D or 3D, etc.), a physical keypad, a mouse, a pointer, a track pad, motion detector (e.g., including 1-axis, 2-axis, 3-axis accelerometer, etc.), a light sensor, capacitance sensor, resistance sensor, temperature sensor, proximity sensor, a piezoelectric device, device orientation detector (e.g., electronic compass, tilt sensor, rotation sensor, gyroscope, accelerometer), or a combination of the above.

Signals received or detected indicating user activity at client devices 150 through one or more of the above input mechanism, or others, can be used in the disclosed technology in acquiring context awareness at the client device 150. Context awareness at client devices 150 generally includes, by way of example but not limitation, client device 150 operation or state acknowledgement, management, user activity/behavior/interaction awareness, detection, sensing, tracking, trending, and/or application (e.g., mobile applications) type, behavior, activity, operating state, etc.

Context awareness in the present disclosure also includes knowledge and detection of network side contextual data and can include network information such as network capacity, bandwidth, traffic, type of network/connectivity, and/or any other operational state data. Network side contextual data can be received from and/or queried from network service providers (e.g., cell provider 112 and/or Internet service providers) of the network 106 and/or network 108 (e.g., by the host server and/or devices 150). In addition to application context awareness as determined from the client 150 side, the application context awareness may also be received from or obtained/queried from the respective application/service providers 110 (by the host 100 and/or client devices 150).

The host server 100 can use, for example, contextual information obtained for client devices 150, networks 106/108, applications (e.g., mobile applications), application server/provider 110, or any combination of the above, to manage the traffic in the system to satisfy data needs of the client devices 150 (e.g., to satisfy application or any other request including HTTP request). In one embodiment, the traffic is managed by the host server 100 to satisfy data requests made in response to explicit or non-explicit user 103 requests and/or device/application maintenance tasks. The traffic can be managed such that network consumption, for example, use of the cellular network is conserved for effective and efficient bandwidth utilization. In addition, the host server 100 can manage and coordinate such traffic in the system such that use of device 150 side resources (e.g., including but not limited to battery power consumption, radio use, processor/memory use) are optimized with a general philosophy for resource conservation while still optimizing performance and user experience.

For example, in context of battery conservation, the device 150 can observe user activity (for example, by observing user keystrokes, backlight status, or other signals via one or more input mechanisms, etc.) and alters device 150 behaviors. The device 150 can also request the host server 100 to alter the behavior for network resource consumption based on user activity or behavior.

In one embodiment, the traffic management for resource conservation is performed using a distributed system between the host server 100 and client device 150. The distributed system can include proxy server and cache components on the server side 100 and on the device/client side, for example, as shown by the server cache 135 on the server 100 side and the local cache 185 on the client 150 side.

Functions and techniques disclosed for context aware traffic management for resource conservation in networks (e.g., network 106 and/or 108) and devices 150, reside in a distributed proxy and cache system. The proxy and cache system can be distributed between, and reside on, a given client device 150 in part or in whole and/or host server 100 in part or in whole. The distributed proxy and cache system are illustrated with further reference to the example diagram shown in FIG. 1B. Functions and techniques performed by the proxy and cache components in the client device 150, the host server 100, and the related components therein are described, respectively, in detail with further reference to the examples of FIGS. 2-3.

In one embodiment, client devices 150 communicate with the host server 100 and/or the application server 110 over network 106, which can be a cellular network and/or a broadband network. To facilitate overall traffic management between devices 150 and various application servers/content providers 110 to implement network (bandwidth utilization) and device resource (e.g., battery consumption), the host server 100 can communicate with the application server/providers 110 over the network 108, which can include the Internet (e.g., a broadband network).

In general, the networks 106 and/or 108, over which the client devices 150, the host server 100, and/or application server 110 communicate, may be a cellular network, a broadband network, a telephonic network, an open network, such as the Internet, or a private network, such as an intranet and/or the extranet, or any combination thereof. For example, the Internet can provide file transfer, remote log in, email, news, RSS, cloud-based services, instant messaging, visual voicemail, push mail, VoIP, and other services through any known or convenient protocol, such as, but is not limited to the TCP/IP protocol, UDP, HTTP, DNS, FTP, UPnP, NSF, ISDN, PDH, RS-232, SDH, SONET, etc.

The networks 106 and/or 108 can be any collection of distinct networks operating wholly or partially in conjunction to provide connectivity to the client devices 150 and the host server 100 and may appear as one or more networks to the serviced systems and devices. In one embodiment, communications to and from the client devices 150 can be achieved by, an open network, such as the Internet, or a private network, broadband network, such as an intranet and/or the extranet. In one embodiment, communications can be achieved by a secure communications protocol, such as secure sockets layer (SSL), or transport layer security (TLS).

In addition, communications can be achieved via one or more networks, such as, but are not limited to, one or more of WiMax, a Local Area Network (LAN), Wireless Local Area Network (WLAN), a Personal area network (PAN), a Campus area network (CAN), a Metropolitan area network (MAN), a Wide area network (WAN), a Wireless wide area network (WWAN), or any broadband network, and further enabled with technologies such as, by way of example, Global System for Mobile Communications (GSM), Personal Communications Service (PCS), Bluetooth, WiFi, Fixed Wireless Data, 2G, 2.5G, 3G, 4G, IMT-Advanced, pre-4G, LTE Advanced, mobile WiMax, WiMax 2, WirelessMAN-Advanced networks, enhanced data rates for GSM evolution (EDGE), General packet radio service (GPRS), enhanced GPRS, iBurst, UMTS, HSPDA, HSUPA, HSPA, UMTS-TDD, 1xRTT, EV-DO, messaging protocols such as, TCP/IP, SMS, MMS, extensible messaging and presence protocol (XMPP), real time messaging protocol (RTMP), instant messaging and presence protocol (IMPP), instant messaging, USSD, IRC, or any other wireless data networks, broadband networks, or messaging protocols.

Figure 1B:
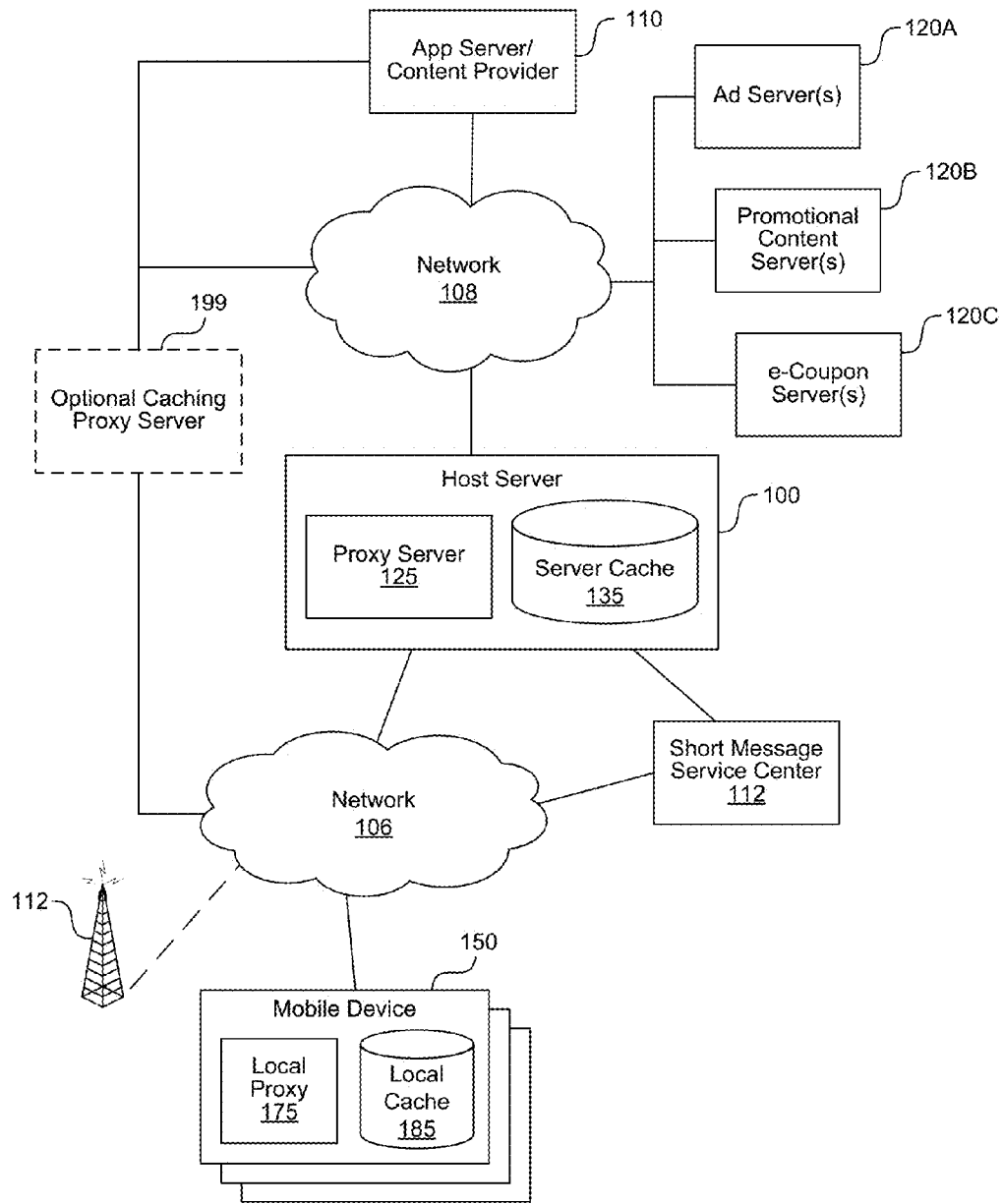
FIG. 1B illustrates an example diagram of a proxy and cache system distributed between the host server and device which facilitates network traffic management between a device, an application server or content provider, or other servers such as an ad server, promotional content server, or an e-coupon server for resource conservation and content caching. The proxy system distributed among the host server and the device can further facilitate selective data compression for the reduction of mobile data traffic and signaling traffic.

FIG. 1B illustrates an example diagram of a proxy and cache system distributed between the host server 100 and device 150 which facilitates network traffic management between the device 150 and an application server or content provider 110, or other servers such as an ad server 120A, promotional content server 120B, or an e-coupon server 120C for resource conservation and content caching. The proxy system distributed among the host server 100 and the device 150 can further facilitate selective data compression for the reduction of mobile data traffic and signaling traffic.

The distributed proxy and cache system can include, for example, the proxy server 125 (e.g., remote proxy) and the server cache, 135 components on the server side. The server-side proxy 125 and cache 135 can, as illustrated, reside internal to the host server 100. In addition, the proxy server 125 and cache 135 on the server-side can be partially or wholly external to the host server 100 and in communication via one or more of the networks 106 and 108. For example, the proxy server 125 may be external to the host server and the server cache 135 may be maintained at the host server 100. Alternatively, the proxy server 125 may be within the host server 100 while the server cache is external to the host server 100. In addition, each of the proxy server 125 and the cache 135 may be partially internal to the host server 100 and partially external to the host server 100. The application server/content provider 110 can by any server including third party servers or service/content providers further including advertisement, promotional content, publication, or electronic coupon servers or services. Similarly, separate advertisement servers 120A, promotional content servers 120B, and/or e-Coupon servers 120C as application servers or content providers are illustrated by way of example.

The distributed system can also, include, in one embodiment, client-side components, including by way of example but not limitation, a local proxy 175 (e.g., a mobile client on a mobile device) and/or a local cache 185, which can, as illustrated, reside internal to the device 150 (e.g., a mobile device).

In addition, the client-side proxy 175 and local cache 185 can be partially or wholly external to the device 150 and in communication via one or more of the networks 106 and 108. For example, the local proxy 175 may be external to the device 150 and the local cache 185 may be maintained at the device 150. Alternatively, the local proxy 175 may be within the device 150 while the local cache 185 is external to the device 150. In addition, each of the proxy 175 and the cache 185 may be partially internal to the host server 100 and partially external to the host server 100.

In one embodiment, the distributed system can include an optional caching proxy server 199. The caching proxy server 199 can be a component which is operated by the application server/content provider 110, the host server 100, or a network service provider 112, and or any combination of the above to facilitate network traffic management for network and device resource conservation. Proxy server 199 can be used, for example, for caching content to be provided to the device 150, for example, from one or more of, the application server/provider 110, host server 100, and/or a network service provider 112. Content caching can also be entirely or partially performed by the remote proxy 125 to satisfy application requests or other data requests at the device 150.

In context aware traffic management and optimization for resource conservation in a network (e.g., cellular or other wireless networks), characteristics of user activity/behavior and/or application behavior at a mobile device (e.g., any wireless device) 150 can be tracked by the local proxy 175 and communicated, over the network 106 to the proxy server 125 component in the host server 100, for example, as connection metadata. The proxy server 125 which in turn is coupled to the application server/provider 110 provides content and data to satisfy requests made at the device 150.

In addition, the local proxy 175 can identify and retrieve mobile device properties, including one or more of, battery level, network that the device is registered on, radio state, or whether the mobile device is being used (e.g., interacted with by a user). In some instances, the local proxy 175 can delay, expedite (prefetch), and/or modify data prior to transmission to the proxy server 125, when appropriate, as will be further detailed with references to the description associated with the examples of FIGS. 2-3.

The local database 185 can be included in the local proxy 175 or coupled to the local proxy 175 and can be queried for a locally stored response to the data request prior to the data request being forwarded on to the proxy server 125. Locally cached responses can be used by the local proxy 175 to satisfy certain application requests of the mobile device 150, by retrieving cached content stored in the cache storage 185, when the cached content is still valid.

Similarly, the proxy server 125 of the host server 100 can also delay, expedite, or modify data from the local proxy prior to transmission to the content sources (e.g., the application server/content provider 110). In addition, the proxy server 125 uses device properties and connection metadata to generate rules for satisfying request of applications on the mobile device 150. The proxy server 125 can gather real time traffic information about requests of applications for later use in optimizing similar connections with the mobile device 150 or other mobile devices.

In general, the local proxy 175 and the proxy server 125 are transparent to the multiple applications executing on the mobile device. The local proxy 175 is generally transparent to the operating system or platform of the mobile device and may or may not be specific to device manufacturers. In some instances, the local proxy 175 is optionally customizable in part or in whole to be device specific. In some embodiments, the local proxy 175 may be bundled into a wireless model, a firewall, and/or a router.

In one embodiment, the host server 100 can in some instances, utilize the store and forward functions of a short message service center (SMSC) 112, such as that provided by the network service provider, in communicating with the device 150 in achieving network traffic management. Note that 112 can also utilize any other type of alternative channel including USSD or other network control mechanisms. As will be further described with reference to the example of FIG. 3, the host server 100 can forward content or HTTP responses to the SMSC 112 such that it is automatically forwarded to the device 150 if available, and for subsequent forwarding if the device 150 is not currently available.

In general, the disclosed distributed proxy and cache system allows optimization of network usage, for example, by serving requests from the local cache 185, the local proxy 175 reduces the number of requests that need to be satisfied over the network 106. Further, the local proxy 175 and the proxy server 125 may filter irrelevant data from the communicated data. In addition, the local proxy 175 and the proxy server 125 can also accumulate low priority data and send it in batches to avoid the protocol overhead of sending individual data fragments. The local proxy 175 and the proxy server 125 can also compress or transcode the traffic, reducing the amount of data sent over the network 106 and/or 108. The signaling traffic in the network 106 and/or 108 can be reduced, as the networks are now used less often and the network traffic can be synchronized among individual applications.

With respect to the battery life of the mobile device 150, by serving application or content requests from the local cache 185, the local proxy 175 can reduce the number of times the radio module is powered up. The local proxy 175 and the proxy server 125 can work in conjunction to accumulate low priority data and send it in batches to reduce the number of times and/or amount of time when the radio is powered up. The local proxy 175 can synchronize the network use by performing the batched data transfer for all connections simultaneously.

Figure 2A:
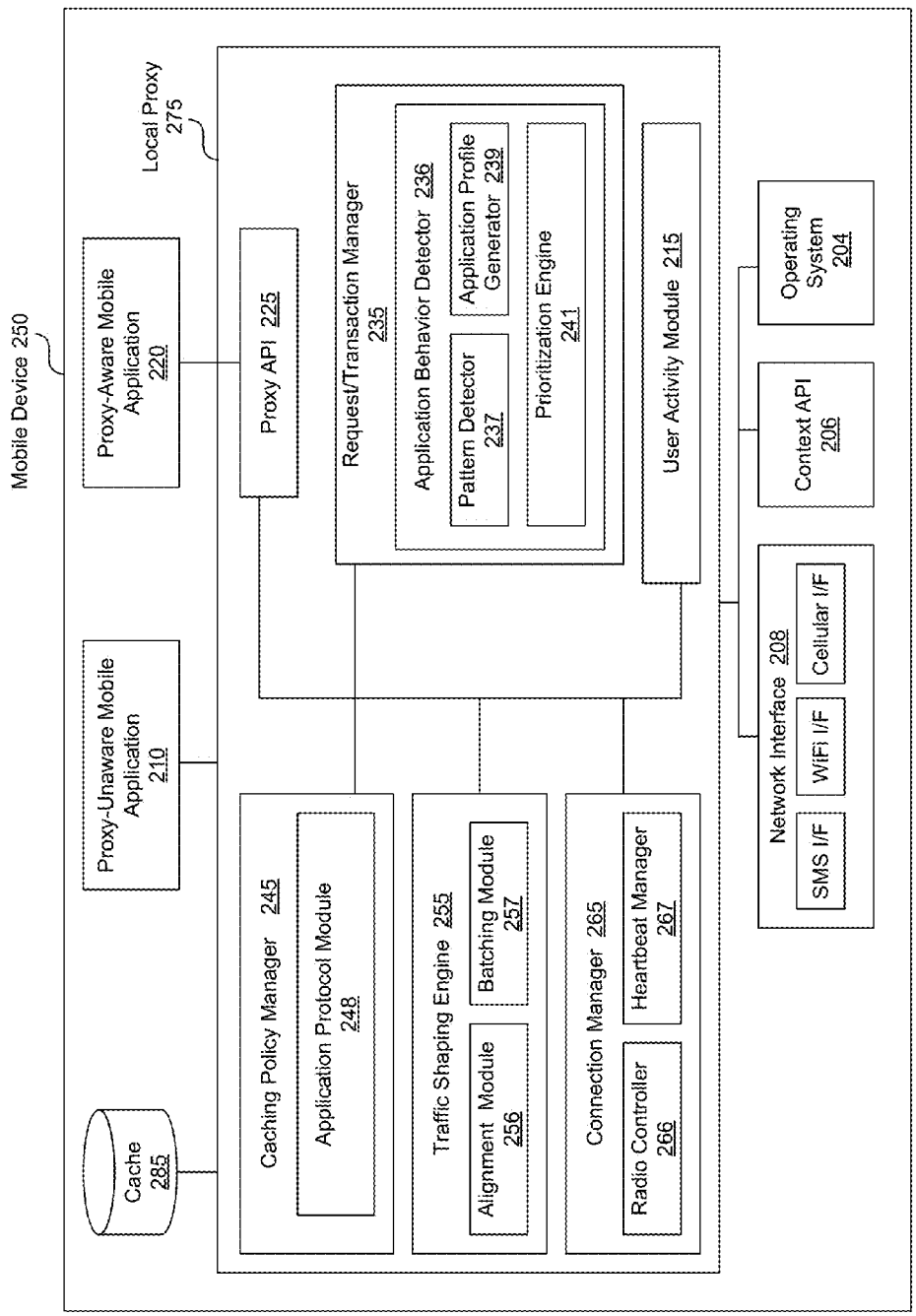
FIG. 2A depicts a block diagram illustrating an example of client-side components in a distributed proxy and cache system residing on a mobile device (e.g., wireless device) that manages traffic in a wireless network (or broadband network) for resource conservation, content caching, and/or traffic management. The client-side proxy (or local proxy) can further categorize mobile traffic and/or implement delivery policies based on application behavior, content priority, user activity, and/or user expectations.

FIG. 2A depicts a block diagram illustrating an example of client-side components in a distributed proxy and cache system residing on a mobile device (e.g., wireless device) 250 that manages traffic in a wireless network (or broadband network) for resource conservation, content caching, and/or traffic management. The client-side proxy (or local proxy 275) can further categorize mobile traffic and/or implement delivery policies based on application behavior, content priority, user activity, and/or user expectations.

The device 250, which can be a portable or mobile device (e.g., any wireless device), such as a portable phone, generally includes, for example, a network interface 208 an operating system 204, a context API 206, and mobile applications which may be proxy-unaware 210 or proxy-aware 220. Note that the device 250 is specifically illustrated in the example of FIG. 2 as a mobile device, such is not a limitation and that device 250 may be any wireless, broadband, portable/mobile or non-portable device able to receive, transmit signals to satisfy data requests over a network including wired or wireless networks (e.g., WiFi, cellular, Bluetooth, LAN, WAN, etc.).

The network interface 208 can be a networking module that enables the device 250 to mediate data in a network with an entity that is external to the host server 250, through any known and/or convenient communications protocol supported by the host and the external entity. The network interface 208 can include one or more of a network adaptor card, a wireless network interface card (e.g., SMS interface, WiFi interface, interfaces for various generations of mobile communication standards including but not limited to 2G, 3G, 3.5G, 4G, LTE, etc.), Bluetooth, or whether or not the connection is via a router, an access point, a wireless router, a switch, a multilayer switch, a protocol converter, a gateway, a bridge, a bridge router, a hub, a digital media receiver, and/or a repeater.

Device 250 can further include, client-side components of the distributed proxy and cache system which can include, a local proxy 275 (e.g., a mobile client of a mobile device) and a cache 285. In one embodiment, the local proxy 275 includes a user activity module 215, a proxy API 225, a request/transaction manager 235, a caching policy manager 245 having an application protocol module 248, a traffic shaping engine 255, and/or a connection manager 265. The traffic shaping engine 255 may further include an alignment module 256 and/or a batching module 257, the connection manager 265 may further include a radio controller 266. The request/transaction manager 235 can further include an application behavior detector 236 and/or a prioritization engine 241, the application behavior detector 236 may further include a pattern detector 237 and/or and application profile generator 239. Additional or less components/modules/engines can be included in the local proxy 275 and each illustrated component.

As used herein, a "module," "a manager," "a handler," a "detector," an "interface," a "controller," a "normalizer," a "generator," an "invalidator," or an "engine" includes a general purpose, dedicated or shared processor and, typically, firmware or software modules that are executed by the processor. Depending upon implementation-specific or other considerations, the module, manager, handler, detector, interface, controller, normalizer, generator, invalidator, or engine can be centralized or its functionality distributed. The module, manager, handler, detector, interface, controller, normalizer, generator, invalidator, or engine can include general or special purpose hardware, firmware, or software embodied in a computer-readable (storage) medium for execution by the processor.

As used herein, a computer-readable medium or computer-readable storage medium is intended to include all mediums that are statutory (e.g., in the United States, under 35 U.S.C. §101), and to specifically exclude all mediums that are non-statutory in nature to the extent that the exclusion is necessary for a claim that includes the computer-readable (storage) medium to be valid. Known statutory computer-readable mediums include hardware (e.g., registers, random access memory (RAM), non-volatile (NV) storage, to name a few), but may or may not be limited to hardware.

In one embodiment, a portion of the distributed proxy and cache system for network traffic management resides in or is in communication with device 250, including local proxy 275 (mobile client) and/or cache 285. The local proxy 275 can provide an interface on the device 250 for users to access device applications and services including email, IM, voice mail, visual voicemail, feeds, Internet, games, productivity tools, or other applications, etc.

Figure 3A:
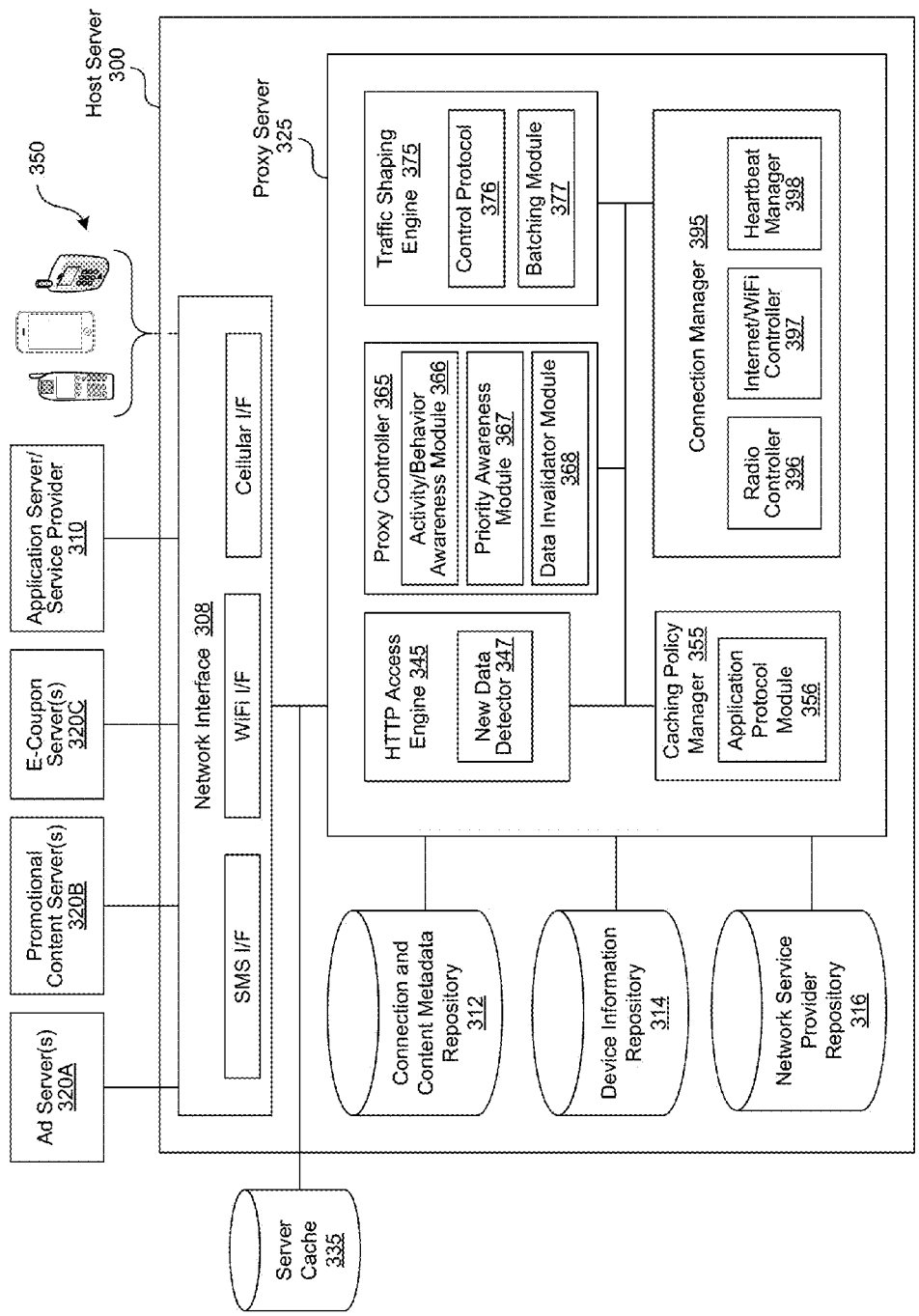
FIG. 3A depicts a block diagram illustrating an example of server-side components in a distributed proxy and cache system that manages traffic in a wireless network (or broadband network) for resource conservation, content caching, and/or traffic management. The server-side proxy (or proxy server) can further categorize mobile traffic and/or implement delivery policies based on application behavior, content priority, user activity, and/or user expectations.

The proxy 275 is generally application independent and can be used by applications (e.g., both proxy-aware and proxy-unaware applications 210 and 220 and other mobile applications) to open TCP connections to a remote server (e.g., the server 100 in the examples of FIGS. 1A-1B and/or server proxy 125/325 shown in the examples of FIG. 1B and FIG. 3A). In some instances, the local proxy 275 includes a proxy API 225 which can be optionally used to interface with proxy-aware applications 220 (or applications (e.g., mobile applications) on a mobile device (e.g., any wireless device)).

The applications 210 and 220 can generally include any user application, widgets, software, HTTP-based application, web browsers, video or other multimedia streaming or downloading application, video games, social network applications, email clients, RSS management applications, application stores, document management applications, productivity enhancement applications, etc. The applications can be provided with the device OS, by the device manufacturer, by the network service provider, downloaded by the user, or provided by others.

One embodiment of the local proxy 275 includes or is coupled to a context API 206, as shown. The context API 206 may be a part of the operating system 204 or device platform or independent of the operating system 204, as illustrated. The operating system 204 can include any operating system including but not limited to, any previous, current, and/or future versions/releases of, Windows Mobile, iOS, Android, Symbian, Palm OS, Brew MP, Java 2 Micro Edition (J2ME), Blackberry, etc.

The context API 206 may be a plug-in to the operating system 204 or a particular client/application on the device 250. The context API 206 can detect signals indicative of user or device activity, for example, sensing motion, gesture, device location, changes in device location, device backlight, keystrokes, clicks, activated touch screen, mouse click or detection of other pointer devices. The context API 206 can be coupled to input devices or sensors on the device 250 to identify these signals. Such signals can generally include input received in response to explicit user input at an input device/mechanism at the device 250 and/or collected from ambient signals/contextual cues detected at or in the vicinity of the device 250 (e.g., light, motion, piezoelectric, etc.).

In one embodiment, the user activity module 215 interacts with the context API 206 to identify, determine, infer, detect, compute, predict, and/or anticipate, characteristics of user activity on the device 250. Various inputs collected by the context API 206 can be aggregated by the user activity module 215 to generate a profile for characteristics of user activity. Such a profile can be generated by the user activity module 215 with various temporal characteristics. For instance, user activity profile can be generated in real-time for a given instant to provide a view of what the user is doing or not doing at a given time (e.g., defined by a time window, in the last minute, in the last 30 seconds, etc.), a user activity profile can also be generated for a 'session' defined by an application or web page that describes the characteristics of user behavior with respect to a specific task they are engaged in on the device 250, or for a specific time period (e.g., for the last 2 hours, for the last 5 hours).

Additionally, characteristic profiles can be generated by the user activity module 215 to depict a historical trend for user activity and behavior (e.g., 1 week, 1 mo., 2 mo., etc.). Such historical profiles can also be used to deduce trends of user behavior, for example, access frequency at different times of day, trends for certain days of the week (weekends or week days), user activity trends based on location data (e.g., IP address, GPS, or cell tower coordinate data) or changes in location data (e.g., user activity based on user location, or user activity based on whether the user is on the go, or traveling outside a home region, etc.) to obtain user activity characteristics.

In one embodiment, user activity module 215 can detect and track user activity with respect to applications, documents, files, windows, icons, and folders on the device 250. For example, the user activity module 215 can detect when an application or window (e.g., a web browser or any other type of application) has been exited, closed, minimized, maximized, opened, moved into the foreground, or into the background, multimedia content playback, etc.

In one embodiment, characteristics of the user activity on the device 250 can be used to locally adjust behavior of the device (e.g., mobile device or any wireless device) to optimize its resource consumption such as battery/power consumption and more generally, consumption of other device resources including memory, storage, and processing power. In one embodiment, the use of a radio on a device can be adjusted based on characteristics of user behavior (e.g., by the radio controller 266 of the connection manager 265) coupled to the user activity module 215. For example, the radio controller 266 can turn the radio on or off, based on characteristics of the user activity on the device 250. In addition, the radio controller 266 can adjust the power mode of the radio (e.g., to be in a higher power mode or lower power mode) depending on characteristics of user activity.

In one embodiment, characteristics of the user activity on device 250 can also be used to cause another device (e.g., other computers, a mobile device, a wireless device, or a non-portable device) or server (e.g., host server 100 and 300 in the examples of FIGS. 1A-B and FIG. 3A) which can communicate (e.g., via a cellular or other network) with the device 250 to modify its communication frequency with the device 250. The local proxy 275 can use the characteristics information of user behavior determined by the user activity module 215 to instruct the remote device as to how to modulate its communication frequency (e.g., decreasing communication frequency, such as data push frequency if the user is idle, requesting that the remote device notify the device 250 if new data, changed, data, or data of a certain level of importance becomes available, etc.).

In one embodiment, the user activity module 215 can, in response to determining that user activity characteristics indicate that a user is active after a period of inactivity, request that a remote device (e.g., server host server 100 and 300 in the examples of FIGS. 1A-B and FIG. 3A) send the data that was buffered as a result of the previously decreased communication frequency.

In addition, or in alternative, the local proxy 275 can communicate the characteristics of user activity at the device 250 to the remote device (e.g., host server 100 and 300 in the examples of FIGS. 1A-B and FIG. 3A) and the remote device determines how to alter its own communication frequency with the device 250 for network resource conservation and conservation of device 250 resources.

One embodiment of the local proxy 275 further includes a request/transaction manager 235, which can detect, identify, intercept, process, manage, data requests initiated on the device 250, for example, by applications 210 and/or 220, and/or directly/indirectly by a user request. The request/transaction manager 235 can determine how and when to process a given request or transaction, or a set of requests/transactions, based on transaction characteristics.

The request/transaction manager 235 can prioritize requests or transactions made by applications and/or users at the device 250, for example by the prioritization engine 241. Importance or priority of requests/transactions can be determined by the request/transaction manager 235 by applying a rule set, for example, according to time sensitivity of the transaction, time sensitivity of the content in the transaction, time criticality of the transaction, time criticality of the data transmitted in the transaction, and/or time criticality or importance of an application making the request.

In addition, transaction characteristics can also depend on whether the transaction was a result of user-interaction or other user-initiated action on the device (e.g., user interaction with a application (e.g., a mobile application)). In general, a time critical transaction can include a transaction resulting from a user-initiated data transfer, and can be prioritized as such. Transaction characteristics can also depend on the amount of data that will be transferred or is anticipated to be transferred as a result of the requested transaction. For example, the connection manager 265, can adjust the radio mode (e.g., high power or low power mode via the radio controller 266) based on the amount of data that will need to be transferred.

In addition, the radio controller 266/connection manager 265 can adjust the radio power mode (high or low) based on time criticality/sensitivity of the transaction. The radio controller 266 can trigger the use of high power radio mode when a time-critical transaction (e.g., a transaction resulting from a user-initiated data transfer, an application running in the foreground, any other event meeting a certain criteria) is initiated or detected.

In general, the priorities can be set by default, for example, based on device platform, device manufacturer, operating system, etc. Priorities can alternatively or in additionally be set by the particular application; for example, the Facebook application (e.g., a mobile application) can set its own priorities for various transactions (e.g., a status update can be of higher priority than an add friend request or a poke request, a message send request can be of higher priority than a message delete request, for example), an email client or IM chat client may have its own configurations for priority. The prioritization engine 241 may include set of rules for assigning priority.

The prioritization engine 241 can also track network provider limitations or specifications on application or transaction priority in determining an overall priority status for a request/transaction. Furthermore, priority can in part or in whole be determined by user preferences, either explicit or implicit. A user, can in general, set priorities at different tiers, such as, specific priorities for sessions, or types, or applications (e.g., a browsing session, a gaming session, versus an IM chat session, the user may set a gaming session to always have higher priority than an IM chat session, which may have higher priority than web-browsing session). A user can set application-specific priorities, (e.g., a user may set Facebook-related transactions to have a higher priority than LinkedIn-related transactions), for specific transaction types (e.g., for all send message requests across all applications to have higher priority than message delete requests, for all calendar-related events to have a high priority, etc.), and/or for specific folders.

The prioritization engine 241 can track and resolve conflicts in priorities set by different entities. For example, manual settings specified by the user may take precedence over device OS settings, network provider parameters/limitations (e.g., set in default for a network service area, geographic locale, set for a specific time of day, or set based on service/fee type) may limit any user-specified settings and/or application-set priorities. In some instances, a manual synchronization request received from a user can override some, most, or all priority settings in that the requested synchronization is performed when requested, regardless of the individually assigned priority or an overall priority ranking for the requested action.

Priority can be specified and tracked internally in any known and/or convenient manner, including but not limited to, a binary representation, a multi-valued representation, a graded representation and all are considered to be within the scope of the disclosed technology.

TABLE I

| Change (initiated on device) | Priority | Change (initiated on server) | Priority |
|---|---|---|---|
| Send email | High | Receive email | High |
| Delete email | Low | Edit email | Often not possible to sync (Low if possible) |
| (Un)read email | Low | | |
| Move message | Low | New email in deleted items | Low |
| Read more | High | | |
| Download attachment | High | Delete an email | Low |
| | | (Un)Read an email | Low |
| New Calendar event | High | Move messages | Low |
| Edit/change Calendar event | High | Any calendar change | High |
| | | Any contact change | High |
| Add a contact | High | Wipe/lock device | High |
| Edit a contact | High | Settings change | High |
| Search contacts | High | Any folder change | High |
| Change a setting | High | Connector restart | High (if no changes nothing is sent) |
| Manual send/receive | High | | |
| IM status change | Medium | Social Network Status Updates | Medium |
| Auction outbid or change notification | High | Severe Weather Alerts | High |
| Weather Updates | Low | News Updates | Low |

Table I above shows, for illustration purposes, some examples of transactions with examples of assigned priorities in a binary representation scheme. Additional assignments are possible for additional types of events, requests, transactions, and as previously described, priority assignments can be made at more or less granular levels, e.g., at the session level or at the application level, etc.

As shown by way of example in the above table, in general, lower priority requests/transactions can include, updating message status as being read, unread, deleting of messages, deletion of contacts; higher priority requests/transactions, can in some instances include, status updates, new IM chat message, new email, calendar event update/cancellation/deletion, an event in a mobile gaming session, or other entertainment related events, a purchase confirmation through a web purchase or online, request to load additional or download content, contact book related events, a transaction to change a device setting, location-aware or location-based events/transactions, or any other events/request/transactions initiated by a user or where the user is known to be, expected to be, or suspected to be waiting for a response, etc.

Inbox pruning events (e.g., email, or any other types of messages), are generally considered low priority and absent other impending events, generally will not trigger use of the radio on the device 250. Specifically, pruning events to remove old email or other content can be 'piggy backed' with other communications if the radio is not otherwise on, at the time of a scheduled pruning event. For example, if the user has preferences set to 'keep messages for 7 days old,' then instead of powering on the device radio to initiate a message delete from the device 250 the moment that the message has exceeded 7 days old, the message is deleted when the radio is powered on next. If the radio is already on, then pruning may occur as regularly scheduled.

The request/transaction manager 235, can use the priorities for requests (e.g., by the prioritization engine 241) to manage outgoing traffic from the device 250 for resource optimization (e.g., to utilize the device radio more efficiently for battery conservation). For example, transactions/requests below a certain priority ranking may not trigger use of the radio on the device 250 if the radio is not already switched on, as controlled by the connection manager 265. In contrast, the radio controller 266 can turn on the radio such a request can be sent when a request for a transaction is detected to be over a certain priority level.

In one embodiment, priority assignments (such as that determined by the local proxy 275 or another device/entity) can be used cause a remote device to modify its communication with the frequency with the mobile device or wireless device. For example, the remote device can be configured to send notifications to the device 250 when data of higher importance is available to be sent to the mobile device or wireless device.

In one embodiment, transaction priority can be used in conjunction with characteristics of user activity in shaping or managing traffic, for example, by the traffic shaping engine 255. For example, the traffic shaping engine 255 can, in response to detecting that a user is dormant or inactive, wait to send low priority transactions from the device 250, for a period of time. In addition, the traffic shaping engine 255 can allow multiple low priority transactions to accumulate for batch transferring from the device 250 (e.g., via the batching module 257). In one embodiment, the priorities can be set, configured, or readjusted by a user. For example, content depicted in Table I in the same or similar form can be accessible in a user interface on the device 250 and for example, used by the user to adjust or view the priorities.

The batching module 257 can initiate batch transfer based on certain criteria. For example, batch transfer (e.g., of multiple occurrences of events, some of which occurred at different instances in time) may occur after a certain number of low priority events have been detected, or after an amount of time elapsed after the first of the low priority event was initiated. In addition, the batching module 257 can initiate batch transfer of the cumulated low priority events when a higher priority event is initiated or detected at the device 250. Batch transfer can otherwise be initiated when radio use is triggered for another reason (e.g., to receive data from a remote device such as host server 100 or 300). In one embodiment, an impending pruning event (pruning of an inbox), or any other low priority events, can be executed when a batch transfer occurs.

In general, the batching capability can be disabled or enabled at the event/transaction level, application level, or session level, based on any one or combination of the following: user configuration, device limitations/settings, manufacturer specification, network provider parameters/limitations, platform-specific limitations/settings, device OS settings, etc. In one embodiment, batch transfer can be initiated when an application/window/file is closed out, exited, or moved into the background; users can optionally be prompted before initiating a batch transfer; users can also manually trigger batch transfers.

In one embodiment, the local proxy 275 locally adjusts radio use on the device 250 by caching data in the cache 285. When requests or transactions from the device 250 can be satisfied by content stored in the cache 285, the radio controller 266 need not activate the radio to send the request to a remote entity (e.g., the host server 100, 300, as shown in FIG. 1A and FIG. 3A or a content provider/application server such as the server/provider 110 shown in the examples of FIG. 1A and FIG. 1B). As such, the local proxy 275 can use the local cache 285 and the cache policy manager 245 to locally store data for satisfying data requests to eliminate or reduce the use of the device radio for conservation of network resources and device battery consumption.

In leveraging the local cache, once the request/transaction manager 225 intercepts a data request by an application on the device 250, the local repository 285 can be queried to determine if there is any locally stored response, and also determine whether the response is valid. When a valid response is available in the local cache 285, the response can be provided to the application on the device 250 without the device 250 needing to access the cellular network or wireless broadband network.

If a valid response is not available, the local proxy 275 can query a remote proxy (e.g., the server proxy 325 of FIG. 3A) to determine whether a remotely stored response is valid. If so, the remotely stored response (e.g., which may be stored on the server cache 135 or optional caching server 199 shown in the example of FIG. 1B) can be provided to the mobile device, possibly without the mobile device 250 needing to access the cellular network, thus relieving consumption of network resources.

If a valid cache response is not available, or if cache responses are unavailable for the intercepted data request, the local proxy 275, for example, the caching policy manager 245, can send the data request to a remote proxy (e.g., server proxy 325 of FIG. 3A) which forwards the data request to a content source (e.g., application server/content provider 110 of FIG. 1A) and a response from the content source can be provided through the remote proxy, as will be further described in the description associated with the example host server 300 of FIG. 3A. The cache policy manager 245 can manage or process requests that use a variety of protocols, including but not limited to HTTP, HTTPS, IMAP, POP, SMTP, XMPP, and/or ActiveSync. The caching policy manager 245 can locally store responses for data requests in the local database 285 as cache entries, for subsequent use in satisfying same or similar data requests.

The caching policy manager 245 can request that the remote proxy monitor responses for the data request and the remote proxy can notify the device 250 when an unexpected response to the data request is detected. In such an event, the cache policy manager 245 can erase or replace the locally stored response(s) on the device 250 when notified of the unexpected response (e.g., new data, changed data, additional data, etc.) to the data request. In one embodiment, the caching policy manager 245 is able to detect or identify the protocol used for a specific request, including but not limited to HTTP, HTTPS, IMAP, POP, SMTP, XMPP, and/or ActiveSync. In one embodiment, application specific handlers (e.g., via the application protocol module 246 of the caching policy manager 245) on the local proxy 275 allows for optimization of any protocol that can be port mapped to a handler in the distributed proxy (e.g., port mapped on the proxy server 325 in the example of FIG. 3A).

In one embodiment, the local proxy 275 notifies the remote proxy such that the remote proxy can monitor responses received for the data request from the content source for changed results prior to returning the result to the device 250, for example, when the data request to the content source has yielded same results to be returned to the mobile device. In general, the local proxy 275 can simulate application server responses for applications on the device 250, using locally cached content. This can prevent utilization of the cellular network for transactions where new/changed data is not available, thus freeing up network resources and preventing network congestion.

In one embodiment, the local proxy 275 includes an application behavior detector 236 to track, detect, observe, monitor, applications (e.g., proxy-aware and/or unaware applications 210 and 220) accessed or installed on the device 250. Application behaviors, or patterns in detected behaviors (e.g., via the pattern detector 237) of one or more applications accessed on the device 250 can be used by the local proxy 275 to optimize traffic in a wireless network needed to satisfy the data needs of these applications.

For example, based on detected behavior of multiple applications, the traffic shaping engine 255 can align content requests made by at least some of the applications over the network (wireless network) (e.g., via the alignment module 256). The alignment module 256 can delay or expedite some earlier received requests to achieve alignment. When requests are aligned, the traffic shaping engine 255 can utilize the connection manager to poll over the network to satisfy application data requests. Content requests for multiple applications can be aligned based on behavior patterns or rules/settings including, for example, content types requested by the multiple applications (audio, video, text, etc.), device (e.g., mobile or wireless device) parameters, and/or network parameters/traffic conditions, network service provider constraints/specifications, etc.

In one embodiment, the pattern detector 237 can detect recurrences in application requests made by the multiple applications, for example, by tracking patterns in application behavior. A tracked pattern can include, detecting that certain applications, as a background process, poll an application server regularly, at certain times of day, on certain days of the week, periodically in a predictable fashion, with a certain frequency, with a certain frequency in response to a certain type of event, in response to a certain type user query, frequency that requested content is the same, frequency with which a same request is made, interval between requests, applications making a request, or any combination of the above, for example.

Such recurrences can be used by traffic shaping engine 255 to offload polling of content from a content source (e.g., from an application server/content provider 110 of FIG. 1A) that would result from the application requests that would be performed at the mobile device or wireless device 250 to be performed instead, by a proxy server (e.g., proxy server 125 of FIG. 1B or proxy server 325 of FIG. 3A) remote from the device 250. Traffic shaping engine 255 can decide to offload the polling when the recurrences match a rule. For example, there are multiple occurrences or requests for the same resource that have exactly the same content, or returned value, or based on detection of repeatable time periods between requests and responses such as a resource that is requested at specific times during the day. The offloading of the polling can decrease the amount of bandwidth consumption needed by the mobile device 250 to establish a wireless (cellular or other wireless broadband) connection with the content source for repetitive content polls.

As a result of the offloading of the polling, locally cached content stored in the local cache 285 can be provided to satisfy data requests at the device 250, when content change is not detected in the polling of the content sources. As such, when data has not changed, application data needs can be satisfied without needing to enable radio use or occupying cellular bandwidth in a wireless network. When data has changed and/or new data has been received, the remote entity to which polling is offloaded, can notify the device 250. The remote entity may be the host server 300 as shown in the example of FIG. 3A.

In one embodiment, the local proxy 275 can mitigate the need/use of periodic keep-alive messages (heartbeat messages) to maintain TCP/IP connections, which can consume significant amounts of power thus having detrimental impacts on mobile device battery life. The connection manager 265 in the local proxy (e.g., the heartbeat manager 267) can detect, identify, and intercept any or all heartbeat (keep-alive) messages being sent from applications.

The heartbeat manager 267 can prevent any or all of these heartbeat messages from being sent over the cellular, or other network, and instead rely on the server component of the distributed proxy system (e.g., shown in FIG. 1B) to generate the and send the heartbeat messages to maintain a connection with the backend (e.g., application server/provider 110 in the example of FIG. 1A).

The local proxy 275 generally represents any one or a portion of the functions described for the individual managers, modules, and/or engines. The local proxy 275 and device 250 can include additional or less components; more or less functions can be included, in whole or in part, without deviating from the novel art of the disclosure.

Figure 2B:
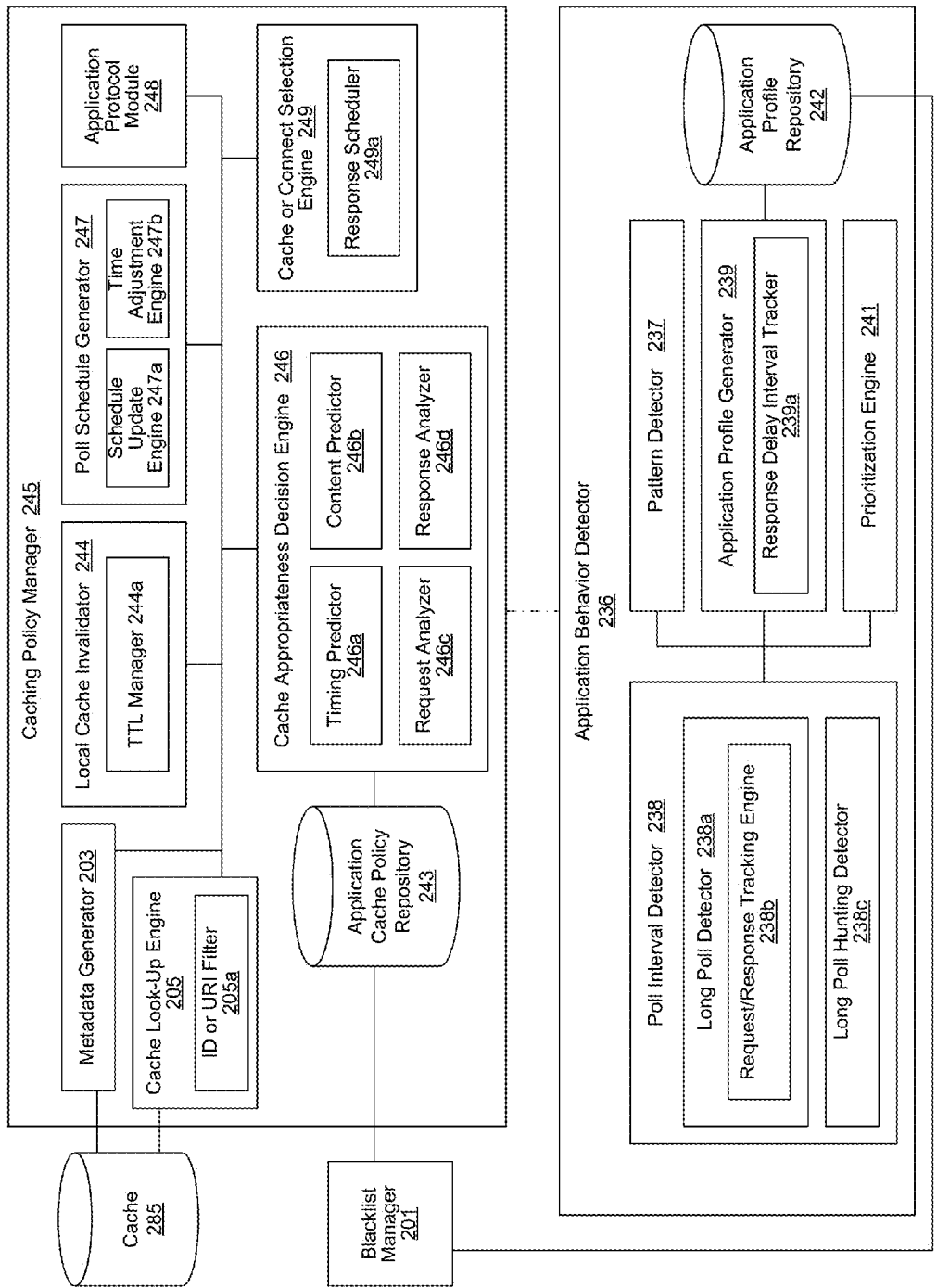
FIG. 2B depicts a block diagram illustrating a further example of components in the cache system shown in the example of FIG. 2A which is capable of caching and adapting caching strategies for mobile application behavior and/or network conditions. Components capable of detecting long poll requests and managing caching of long polls are also illustrated.

FIG. 2B depicts a block diagram illustrating a further example of components in the cache system shown in the example of FIG. 2A which is capable of caching and adapting caching strategies for mobile application behavior and/or network conditions.

In one embodiment, the caching policy manager 245 includes a metadata generator 203, a cache look-up engine 205, a cache appropriateness decision engine 246, a poll schedule generator 247, an application protocol module 248, a cache or connect selection engine 249 and/or a local cache invalidator 244. The cache appropriateness decision engine 246 can further include a timing predictor 246a, a content predictor 246b, a request analyzer 246c, and/or a response analyzer 246d, and the cache or connect selection engine 249 includes a response scheduler 249a. The metadata generator 203 and/or the cache look-up engine 205 are coupled to the cache 285 (or local cache) for modification or addition to cache entries or querying thereof.

The cache look-up engine 205 may further include an ID or URI filter 205a, the local cache invalidator 244 may further include a TTL manager 244a, and the poll schedule generator 247 may further include a schedule update engine 247a and/or a time adjustment engine 247b. One embodiment of caching policy manager 245 includes an application cache policy repository 243. In one embodiment, the application behavior detector 236 includes a pattern detector 237, a poll interval detector 238, an application profile generator 239, and/or a priority engine 241. The poll interval detector 238 may further include a long poll detector 238a having a response/request tracking engine 238b. The poll interval detector 238 may further include a long poll hunting detector 238c. The application profile generator 239 can further include a response delay interval tracker 239a.

The pattern detector 237, application profile generator 239, and the priority engine 241 were also described in association with the description of the pattern detector shown in the example of FIG. 2A. One embodiment further includes an application profile repository 242 which can be used by the local proxy 275 to store information or metadata regarding application profiles (e.g., behavior, patterns, type of HTTP requests, etc.)

The cache appropriateness decision engine 246 can detect, assess, or determine whether content from a content source (e.g., application server/content provider 110 in the example of FIG. 1B) with which a mobile device 250 interacts and has content that may be suitable for caching.

For example, the decision engine 246 can use information about a request and/or a response received for the request initiated at the mobile device 250 to determine cacheability, potential cacheability, or non-cacheability. In some instances, the decision engine 246 can initially verify whether a request is directed to a blacklisted destination or whether the request itself originates from a blacklisted client or application. If so, additional processing and analysis may not be performed by the decision engine 246 and the request may be allowed to be sent over the air to the server to satisfy the request. The black listed destinations or applications/clients (e.g., mobile applications) can be maintained locally in the local proxy (e.g., in the application profile repository 242) or remotely (e.g., in the proxy server 325 or another entity).

In one embodiment, the decision engine 246, for example, via the request analyzer 246*c*, collects information about an application or client request generated at the mobile device 250. The request information can include request characteristics information including, for example, request method. For example, the request method can indicate the type of HTTP request generated by the mobile application or client. In one embodiment, response to a request can be identified as cacheable or potentially cacheable if the request method is a GET request or POST request. Other types of requests (e.g., OPTIONS, HEAD, PUT, DELETE, TRACE, or CONNECT) may or may not be cached. In general, HTTP requests with uncacheable request methods will not be cached.

Request characteristics information can further include information regarding request size, for example. Responses to requests (e.g., HTTP requests) with body size exceeding a certain size will not be cached. For example, cacheability can be determined if the information about the request indicates that a request body size of the request does not exceed a certain size. In some instances, the maximum cacheable request body size can be set to 8092 bytes. In other instances, different values may be used, dependent on network capacity or network operator specific settings, for example.

In some instances, content from a given application server/content provider (e.g., the server/content provider 110 of FIG. 1B) is determined to be suitable for caching based on a set of criteria, for example, criteria specifying time criticality of the content that is being requested from the content source. In one embodiment, the local proxy (e.g., the local proxy 175 or 275 of FIG. 1B and FIG. 2A) applies a selection criteria to store the content from the host server which is requested by an application as cached elements in a local cache on the mobile device to satisfy subsequent requests made by the application.

The cache appropriateness decision engine 246, further based on detected patterns of requests sent from the mobile device 250 (e.g., by a mobile application or other types of clients on the device 250) and/or patterns of received responses, can detect predictability in requests and/or responses. For example, the request characteristics information collected by the decision engine 246, (e.g., the request analyzer 246*c*) can further include periodicity information between a request and other requests generated by a same client on the mobile device or other requests directed to the same host (e.g., with similar or same identifier parameters).

Periodicity can be detected, by the decision engine 246 or the request analyzer 246*c*, when the request and the other requests generated by the same client occur at a fixed rate or nearly fixed rate, or at a dynamic rate with some identifiable or partially or wholly reproducible changing pattern. If the requests are made with some identifiable pattern (e.g., regular intervals, intervals having a detectable pattern, or trend (e.g., increasing, decreasing, constant, etc.) the timing predictor 246*a* can determine that the requests made by a given application on a device is predictable and identify it to be potentially appropriate for caching, at least from a timing standpoint.

An identifiable pattern or trend can generally include any application or client behavior which may be simulated either locally, for example, on the local proxy 275 on the mobile device 250 or simulated remotely, for example, by the proxy server 325 on the host 300, or a combination of local and remote simulation to emulate application behavior.

In one embodiment, the decision engine 246, for example, via the response analyzer 246*d*, can collect information about a response to an application or client request generated at the mobile device 250. The response is typically received from a server or the host of the application (e.g., mobile application) or client which sent the request at the mobile device 250. In some instances, the mobile client or application can be the mobile version of an application (e.g., social networking, search, travel management, voicemail, contact manager, email) or a web site accessed via a web browser or via a desktop client.

For example, response characteristics information can include an indication of whether transfer encoding or chunked transfer encoding is used in sending the response. In some instances, responses to HTTP requests with transfer encoding or chunked transfer encoding are not cached, and therefore are also removed from further analysis. The rationale here is that chunked responses are usually large and non-optimal for caching, since the processing of these transactions may likely slow down the overall performance. Therefore, in one embodiment, cacheability or potential for cacheability can be determined when transfer encoding is not used in sending the response.

In addition, the response characteristics information can include an associated status code of the response which can be identified by the response analyzer 246*d*. In some instances, HTTP responses with uncacheable status codes are typically not cached. The response analyzer 246*d* can extract the status code from the response and determine whether it matches a status code which is cacheable or uncacheable. Some cacheable status codes include by way of example: 200—OK, 301—Redirect, 302—Found, 303—See other, 304—Not Modified, 307Temporary Redirect, or 500—Internal server error. Some uncacheable status codes can include, for example, 403—Forbidden or 404—Not found.

In one embodiment, cacheability or potential for cacheability can be determined if the information about the response does not indicate an uncacheable status code or indicates a cacheable status code. If the response analyzer 246*d* detects an uncacheable status code associated with a given response, the specific transaction (request/response pair) may be eliminated from further processing and determined to be uncacheable on a temporary basis, a semi-permanent, or a permanent basis. If the status code indicates cacheability, the transaction (e.g., request and/or response pair) may be subject to further processing and analysis to confirm cacheability, as shown in the example flow charts of FIGS. 9-13.

Response characteristics information can also include response size information. In general, responses can be cached locally at the mobile device 250 if the responses do not exceed a certain size. In some instances, the default maximum cached response size is set to 115 KB. In other instances, the max cacheable response size may be different and/or dynamically adjusted based on operating conditions, network conditions, network capacity, user preferences, network operator requirements, or other application-specific, user specific, and/or device-specific reasons. In one embodiment, the response analyzer 246d can identify the size of the response, and cacheability or potential for cacheability can be determined if a given threshold or max value is not exceeded by the response size.

Furthermore, response characteristics information can include response body information for the response to the request and other response to other requests generated by a same client on the mobile device, or directed to a same content host or application server. The response body information for the response and the other responses can be compared, for example, by the response analyzer 246d, to prevent the caching of dynamic content (or responses with content that changes frequently and cannot be efficiently served with cache entries, such as financial data, stock quotes, news feeds, real-time sporting event activities, etc.), such as content that would no longer be relevant or up-to-date if served from cached entries.

The cache appropriateness decision engine 246 (e.g., the content predictor 246b) can definitively identify repeatability or identify indications of repeatability, potential repeatability, or predictability in responses received from a content source (e.g., the content host/application server 110 shown in the example of FIGS. 1A-B). Repeatability can be detected by, for example, tracking at least two responses received from the content source and determines if the two responses are the same. For example, cacheability can be determined, by the response analyzer 246d, if the response body information for the response and the other responses sent by the same mobile client or directed to the same host/server are same or substantially the same. The two responses may or may not be responses sent in response to consecutive requests. In one embodiment, hash values of the responses received for requests from a given application are used to determine repeatability of content (with or without heuristics) for the application in general and/or for the specific request. Additional same responses may be required for some applications or under certain circumstances.

Repeatability in received content need not be 100% ascertained. For example, responses can be determined to be repeatable if a certain number or a certain percentage of responses are the same, or similar. The certain number or certain percentage of same/similar responses can be tracked over a select period of time, set by default or set based on the application generating the requests (e.g., whether the application is highly dynamic with constant updates or less dynamic with infrequent updates). Any indicated predictability or repeatability, or possible repeatability, can be utilized by the distributed system in caching content to be provided to a requesting application or client on the mobile device 250.

In one embodiment, for a long poll type request, the local proxy 175 can begin to cache responses on a third request when the response delay times for the first two responses are the same, substantially the same, or detected to be increasing in intervals. In general, the received responses for the first two responses should be the same, and upon verifying that the third response received for the third request is the same (e.g., if R0=R1=R2), the third response can be locally cached on the mobile device. Less or more same responses may be required to begin caching, depending on the type of application, type of data, type of content, user preferences, or carrier/network operator specifications.

Increasing response delays with same responses for long polls can indicate a hunting period (e.g., a period in which the application/client on the mobile device is seeking the longest time between a request and response that a given network will allow), as detected by the long poll hunting detector 238c of the application behavior detector 236.

An example can be described below using T0, T1, T2, where T indicates the delay time between when a request is sent and when a response (e.g., the response header) is detected/received for consecutive requests:

T0=Response0($t$)−Request0($t$)=180 s. (+/− tolerance)
T1=Response1($t$)−Request1($t$)=240 s. (+/− tolerance)
T2=Response2($t$)−Request2($t$)=500 s. (+/− tolerance)

In the example timing sequence shown above, T0<T1<T2, this may indicate a hunting pattern for a long poll when network timeout has not yet been reached or exceeded. Furthermore, if the responses R0, R1, and R2 received for the three requests are the same, R2 can be cached. In this example, R2 is cached during the long poll hunting period without waiting for the long poll to settle, thus expediting response caching (e.g., this is optional accelerated caching behavior which can be implemented for all or select applications).

As such, the local proxy 275 can specify information that can be extracted from the timing sequence shown above (e.g., polling schedule, polling interval, polling type) to the proxy server and begin caching and to request the proxy server to begin polling and monitoring the source (e.g., using any of T0, T1, T2 as polling intervals but typically T2, or the largest detected interval without timing out, and for which responses from the source is received will be sent to the proxy server 325 of FIG. 3A for use in polling the content source (e.g., application server/service provider 310)).

However, if the time intervals are detected to be getting shorter, the application (e.g., mobile application)/client may still be hunting for a time interval for which a response can be reliably received from the content source (e.g., application/server server/provider 110 or 310), and as such caching typically should not begin until the request/response intervals indicate the same time interval or an increasing time interval, for example, for a long poll type request.

An example of handling a detected decreasing delay can be described below using T0, T1, T2, T3, and T4 where T indicates the delay time between when a request is sent and when a response (e.g., the response header) is detected/received for consecutive requests:

T0=Response0($t$)−Request0($t$)=160 s. (+/− tolerance)
T1=Response1($t$)−Request1($t$)=240 s. (+/− tolerance)
T2=Response2($t$)−Request2($t$)=500 s. (+/− tolerance)
T3=Time out at 700 s. (+/− tolerance)
T4=Response4($t$)−Request4($t$)=600 (+/− tolerance)

If a pattern for response delays T1<T2<T3>T4 is detected, as shown in the above timing sequence (e.g., detected by the long poll hunting detector 238c of the application behavior detector 236), it can be determined that T3 likely exceeded the network time out during a long poll hunting period. In Request 3, a response likely was not received since the connection was terminated by the network, application, server, or other reason before a response was sent or available. On Request 4 (after T4), if a response (e.g., Response 4) is detected or received, the local proxy 275 can then use the response for caching (if the content repeatability condition is met). The local proxy can also use T4 as the poll interval in the polling schedule set for the proxy server to monitor/poll the content source.

Note that the above description shows that caching can begin while long polls are in hunting mode in the event of detecting increasing response delays, as long as responses are received and not timed out for a given request. This can be referred to as the optional accelerated caching during long poll hunting. Caching can also begin after the hunting mode (e.g., after the poll requests have settled to a constant or near constant delay value) has completed. Note that hunting may or may not occur for long polls and when hunting occurs; the proxy 275 can generally detect this and determine whether to begin to cache during the hunting period (increasing intervals with same responses) or wait until the hunt settles to a stable value.

In one embodiment, the timing predictor 246a of the cache appropriateness decision engine 246 can track timing of responses received from outgoing requests from an application (e.g., mobile application) or client to detect any identifiable patterns which can be partially wholly reproducible, such that locally cached responses can be provided to the requesting client on the mobile device 250 in a manner that simulates content source (e.g., application server/content provider 110 or 310) behavior. For example, the manner in which (e.g., from a timing standpoint) responses or content would be delivered to the requesting application/client on the device 250. This ensures preservation of user experience when responses to application or mobile client requests are served from a local and/or remote cache instead of being retrieved/received directly from the content source (e.g., application, content provider 110 or 310).

In one embodiment, the decision engine 246 or the timing predictor 246a determines the timing characteristics a given application (e.g., mobile application) or client from, for example, the request/response tracking engine 238b and/or the application profile generator 239 (e.g., the response delay interval tracker 239a). Using the timing characteristics, the timing predictor 246a determines whether the content received in response to the requests are suitable or are potentially suitable for caching. For example, poll request intervals between two consecutive requests from a given application can be used to determine whether request intervals are repeatable (e.g., constant, near constant, increasing with a pattern, decreasing with a pattern, etc.) and can be predicted and thus reproduced at least some of the times either exactly or approximated within a tolerance level.

In some instances, the timing characteristics of a given request type for a specific application, for multiple requests of an application, or for multiple applications can be stored in the application profile repository 242. The application profile repository 242 can generally store any type of information or metadata regarding application request/response characteristics including timing patterns, timing repeatability, content repeatability, etc.

The application profile repository 242 can also store metadata indicating the type of request used by a given application (e.g., long polls, long-held HTTP requests, HTTP streaming, push, COMET push, etc.) Application profiles indicating request type by applications can be used when subsequent same/similar requests are detected, or when requests are detected from an application which has already been categorized. In this manner, timing characteristics for the given request type or for requests of a specific application which has been tracked and/or analyzed, need not be reanalyzed.

Application profiles can be associated with a time-to-live (e.g., or a default expiration time). The use of an expiration time for application profiles, or for various aspects of an application or request's profile can be used on a case by case basis. The time-to-live or actual expiration time of application profile entries can be set to a default value or determined individually, or a combination thereof. Application profiles can also be specific to wireless networks, physical networks, network operators, or specific carriers.

One embodiment includes an application blacklist manager 201. The application blacklist manager 201 can be coupled to the application cache policy repository 243 and can be partially or wholly internal to local proxy or the caching policy manager 245. Similarly, the blacklist manager 201 can be partially or wholly internal to local proxy or the application behavior detector 236. The blacklist manager 201 can aggregate, track, update, manage, adjust, or dynamically monitor a list of destinations of servers/host that are 'blacklisted,' or identified as not cached, on a permanent or temporary basis. The blacklist of destinations, when identified in a request, can potentially be used to allow the request to be sent over the (cellular) network for servicing. Additional processing on the request may not be performed since it is detected to be directed to a blacklisted destination.

Blacklisted destinations can be identified in the application cache policy repository 243 by address identifiers including specific URIs or patterns of identifiers including URI patterns. In general, blacklisted destinations can be set by or modified for any reason by any party including the user (owner/user of mobile device 250), operating system/mobile platform of device 250, the destination itself, network operator (of cellular network), Internet service provider, other third parties, or according to a list of destinations for applications known to be uncacheable/not suited for caching. Some entries in the blacklisted destinations may include destinations aggregated based on the analysis or processing performed by the local proxy (e.g., cache appropriateness decision engine 246).

For example, applications or mobile clients on the mobile device for which responses have been identified as non-suitable for caching can be added to the blacklist. Their corresponding hosts/servers may be added in addition to or in lieu of an identification of the requesting application/client on the mobile device 250. Some or all of such clients identified by the proxy system can be added to the blacklist. For example, for all application clients or applications that are temporarily identified as not being suitable for caching, only those with certain detected characteristics (based on timing, periodicity, frequency of response content change, content predictability, size, etc.) can be blacklisted.

The blacklisted entries may include a list of requesting applications or requesting clients on the mobile device (rather than destinations) such that, when a request is detected from a given application or given client, it may be sent through the network for a response, since responses for blacklisted clients/applications are in most circumstances not cached.

A given application profile may also be treated or processed differently (e.g., different behavior of the local proxy 275 and the remote proxy 325) depending on the mobile account associated with a mobile device from which the application is being accessed. For example, a higher paying account, or a premier account may allow more frequent access of the wireless network or higher bandwidth allowance thus affecting the caching policies implemented between the local proxy 275 and proxy server 325 with an emphasis on better performance compared to conservation of resources. A given application profile may also be treated or processed differently under different wireless network conditions (e.g., based on congestion or network outage, etc.).

Note that cache appropriateness can be determined, tracked, and managed for multiple clients or applications on the mobile device 250. Cache appropriateness can also be determined for different requests or request types initiated by a given client or application on the mobile device 250. The caching policy manager 245, along with the timing predictor 246a and/or the content predictor 246b which heuristically determines or estimates predictability or potential predictability, can track, manage and store cacheability information for various application or various requests for a given application. Cacheability information may also include conditions (e.g., an application can be cached at certain times of the day, or certain days of the week, or certain requests of a given application can be cached, or all requests with a given destination address can be cached) under which caching is appropriate which can be determined and/or tracked by the cache appropriateness decision engine 246 and stored and/or updated when appropriate in the application cache policy repository 243 coupled to the cache appropriateness decision engine 246.

The information in the application cache policy repository 243 regarding cacheability of requests, applications, and/or associated conditions can be used later on when same requests are detected. In this manner, the decision engine 246 and/or the timing and content predictors 246a/b need not track and reanalyze request/response timing and content characteristics to make an assessment regarding cacheability. In addition, the cacheability information can in some instances be shared with local proxies of other mobile devices by way of direct communication or via the host server (e.g., proxy server 325 of host server 300).

For example, cacheability information detected by the local proxy 275 on various mobile devices can be sent to a remote host server or a proxy server 325 on the host server (e.g., host server 300 or proxy server 325 shown in the example of FIG. 3A, host 100 and proxy server 125 in the example of FIGS. 1A-B). The remote host or proxy server can then distribute the information regarding application-specific, request-specific cacheability information and/or any associated conditions to various mobile devices or their local proxies in a wireless network or across multiple wireless networks (same service provider or multiple wireless service providers) for their use.

In general, the selection criteria for caching can further include, by way of example but not limitation, the state of the mobile device indicating whether the mobile device is active or inactive, network conditions, and/or radio coverage statistics. The cache appropriateness decision engine 246 can in any one or any combination of the criteria, and in any order, identifying sources for which caching may be suitable.

Once application servers/content providers having identified or detected content that is potentially suitable for local caching on the mobile device 250, the cache policy manager 245 can proceed to cache the associated content received from the identified sources by storing content received from the content source as cache elements in a local cache (e.g., local cache 185 or 285 shown in the examples of FIG. 1B and FIG. 2A, respectively) on the mobile device 250.

The response can be stored in the cache 285 (e.g., also referred as the local cache) as a cache entry. In addition to the response to a request, the cached entry can include response metadata having additional information regarding caching of the response. The metadata may be generated by the metadata generator 203 and can include, for example, timing data such as the access time of the cache entry or creation time of the cache entry. Metadata can include additional information, such as any information suited for use in determining whether the response stored as the cached entry is used to satisfy the subsequent response. For example, metadata information can further include, request timing history (e.g., including request time, request start time, request end time), hash of the request and/or response, time intervals or changes in time intervals, etc.

The cache entry is typically stored in the cache 285 in association with a time-to-live (TTL), which for example may be assigned or determined by the TTL manager 244a of the cache invalidator 244. The time-to-live of a cache entry is the amount of time the entry is persisted in the cache 285 regardless of whether the response is still valid or relevant for a given request or client/application on the mobile device 250. For example, if the time-to-live of a given cache entry is set to 12 hours, the cache entry is purged, removed, or otherwise indicated as having exceeded the time-to-live, even if the response body contained in the cache entry is still current and applicable for the associated request.

A default time-to-live can be automatically used for all entries unless otherwise specified (e.g., by the TTL manager 244a), or each cache entry can be created with its individual TTL (e.g., determined by the TTL manager 244a based on various dynamic or static criteria). Note that each entry can have a single time-to-live associated with both the response data and any associated metadata. In some instances, the associated metadata may have a different time-to-live (e.g., a longer time-to-live) than the response data.

The content source having content for caching can, in addition or in alternate, be identified to a proxy server (e.g., proxy server 125 or 325 shown in the examples of FIG. 1B and FIG. 3A, respectively) remote from and in wireless communication with the mobile device 250 such that the proxy server can monitor the content source (e.g., application server/content provider 110) for new or changed data. Similarly, the local proxy (e.g., the local proxy 175 or 275 of FIG. 1B and FIG. 2A, respectively) can identify to the proxy server that content received from a specific application server/content provider is being stored as cached elements in the local cache 285.

Once content has been locally cached, the cache policy manager 245, upon receiving future polling requests to contact the application server/content host (e.g., 110 or 310), can retrieve the cached elements from the local cache to respond to the polling request made at the mobile device 250 such that a radio of the mobile device is not activated to service the polling request. For example, the cache look-up engine 205 can query the cache 285 to identify the response to be served to a response. The response can be served from the cache in response to identifying a matching cache entry and also using any metadata stored with the response in the cache entry. The cache entries can be queried by the cache look-up engine using a URI of the request or another type of identifier (e.g., via the ID or URI filter 205a). The cache-lookup engine 205 can further use the metadata (e.g., extract any timing information or other relevant information) stored with the matching cache entry to determine whether response is still suited for use in being served to a current request.

Note that the cache-look-up can be performed by the engine 205 using one or more of various multiple strategies. In one embodiment, multiple cook-up strategies can be executed sequentially on each entry store din the cache 285, until at least one strategy identifies a matching cache entry. The strategy employed to performing cache look-up can include a strict matching criteria or a matching criteria which allows for non-matching parameters.

For example, the look-up engine 205 can perform a strict matching strategy which searches for an exact match between an identifier (e.g., a URI for a host or resource) referenced in a present request for which the proxy is attempting to identify a cache entry and an identifier stored with the cache entries. In the case where identifiers include URIs or URLs, the matching algorithm for strict matching will search for a cache entry where all the parameters in the URLs match. For example:

Example 1.
  1. Cache contains entry for http://test.com/products/
  2. Request is being made to URI http://test.com/products/
Strict strategy will find a match, since both URIs are same.

Example 2.
  1. Cache contains entry for http://test.com/products/?query=all
  2. Request is being made to URI http://test.com/products/?query=sub Under the strict strategy outlined above, a match will not be found since the URIs differ in the query parameter.

In another example strategy, the look-up engine 205 looks for a cache entry with an identifier that partially matches the identifier references in a present request for which the proxy is attempting to identify a matching cache entry. For example, the look-up engine 205 may look for a cache entry with an identifier which differs from the request identifier by a query parameter value. In utilizing this strategy, the look-up engine 205 can collect information collected for multiple previous requests (e.g., a list of arbitrary parameters in an identifier) to be later checked with the detected arbitrary parameter in the current request. For example, in the case where cache entries are stored with URI or URL identifiers, the look-up engine searches for a cache entry with a URI differing by a query parameter. If found, the engine 205 can examine the cache entry for information collected during previous requests (e.g. a list of arbitrary parameters) and checked whether the arbitrary parameter detected in or extracted from the current URI/URL belongs to the arbitrary parameters list.

Example 1.
  1. Cache contains entry for http://test.com/products/?query=all, where query is marked as arbitrary.
  2. Request is being made to URI http://text.com/products/?query=sub
Match will be found, since query parameter is marked as arbitrary.

Example 2.
  1. Cache contains entry for http://test.com/products/?query=all, where query is marked as arbitrary.
  2. Request is being made to URI http://test.com/products/?query=sub&sort=asc
Match will not be found, since current request contains sort parameter which is not marked as arbitrary in the cache entry.

Additional strategies for detecting cache hit may be employed. These strategies can be implemented singly or in any combination thereof. A cache-hit can be determined when any one of these strategies determines a match. A cache miss may be indicated when the look-up engine 205 determines that the requested data cannot be served from the cache 285, for any reason. For example, a cache miss may be determined when no cache entries are identified for any or all utilized look-up strategies.

Cache miss may also be determined when a matching cache entry exists but determined to be invalid or irrelevant for the current request. For example, the look-up engine 205 may further analyze metadata (e.g., which may include timing data of the cache entry) associated with the matching cache entry to determine whether it is still suitable for use in responding to the present request.

When the look-up engine 205 has identified a cache hit (e.g., an event indicating that the requested data can be served from the cache), the stored response in the matching cache entry can be served from the cache to satisfy the request of an application/client.

By servicing requests using cache entries stored in cache 285, network bandwidth and other resources need not be used to request/receive poll responses which may have not changed from a response that has already been received at the mobile device 250. Such servicing and fulfilling application (e.g., mobile application) requests locally via cache entries in the local cache 285 allows for more efficient resource and mobile network traffic utilization and management since the request need not be sent over the wireless network further consuming bandwidth. In general, the cache 285 can be persisted between power on/off of the mobile device 250, and persisted across application/client refreshes and restarts.

For example, the local proxy 275, upon receipt of an outgoing request from its mobile device 250 or from an application or other type of client on the mobile device 250, can intercept the request and determine whether a cached response is available in the local cache 285 of the mobile device 250. If so, the outgoing request is responded to by the local proxy 275 using the cached response on the cache of the mobile device. As such, the outgoing request can be filled or satisfied without a need to send the outgoing request over the wireless network, thus conserving network resources and battery consumption.

In one embodiment, the responding to the requesting application/client on the device 250 is timed to correspond to a manner in which the content server would have responded to the outgoing request over a persistent connection (e.g., over the persistent connection, or long-held HTTP connection, long poll type connection, that would have been established absent interception by the local proxy). The timing of the response can be emulated or simulated by the local proxy 275 to preserve application behavior such that end user experience is not affected, or minimally affected by serving stored content from the local cache 285 rather than fresh content received from the intended content source (e.g., content host/application server 110 of FIGS. 1A-B). The timing can be replicated exactly or estimated within a tolerance parameter, which may go unnoticed by the user or treated similarly by the application so as to not cause operation issues.

For example, the outgoing request can be a request for a persistent connection intended for the content server (e.g., application server/content provider of examples of FIGS. 1A-1B). In a persistent connection (e.g., long poll, COMET-style push or any other push simulation in asynchronous HTTP requests, long-held HTTP request, HTTP streaming, or others) with a content source (server), the connection is held for some time after a request is sent. The connection can typically be persisted between the mobile device and the server until content is available at the server to be sent to the mobile device. Thus, there typically can be some delay in time between when a long poll request is sent and when a response is received from the content source. If a response is not provided by the content source for a certain amount of time, the connection may also terminate due to network reasons (e.g., socket closure) if a response is not sent.

Thus, to emulate a response from a content server sent over a persistent connection (e.g., a long poll style connection), the manner of response of the content server can be simulated by allowing a time interval to elapse before responding to the outgoing request with the cached response. The length of the time interval can be determined on a request by request basis or on an application by application (client by client basis), for example.

In one embodiment, the time interval is determined based on request characteristics (e.g., timing characteristics) of an application on the mobile device from which the outgoing request originates. For example, poll request intervals (e.g., which can be tracked, detected, and determined by the long poll detector 238a of the poll interval detector 238) can be used to determine the time interval to wait before responding to a request with a local cache entry and managed by the response scheduler 249a.

One embodiment of the cache policy manager 245 includes a poll schedule generator 247 which can generate a polling schedule for one or more applications on the mobile device 250. The polling schedule can specify a polling interval that can be employed by an entity which is physically distinct and/or separate from the mobile device 250 in monitoring the content source for one or more applications (such that cached responses can be verified periodically by polling a host server (host server 110 or 310) to which the request is directed) on behalf of the mobile device. One example of such an external entity which can monitor the content at the source for the mobile device 250 is a proxy server (e.g., proxy server 125 or 325 shown in the examples of FIG. 1B and FIGS. 3A-C).

The polling schedule (e.g., including a rate/frequency of polling) can be determined, for example, based on the interval between the polling requests directed to the content source from the mobile device. The polling schedule or rate of polling may be determined at the mobile device 250 (by the local proxy). In one embodiment, the poll interval detector 238 of the application behavior detector 236 can monitor polling requests directed to a content source from the mobile device 250 in order to determine an interval between the polling requests made from any or all application (e.g., mobile application).

For example, the poll interval detector 238 can track requests and responses for applications or clients on the device 250. In one embodiment, consecutive requests are tracked prior to detection of an outgoing request initiated from the application (e.g., mobile application) on the mobile device 250 by the same mobile client or application (e.g., mobile application). The polling rate can be determined using request information collected for the request for which the response is cached. In one embodiment, the rate is determined from averages of time intervals between previous requests generated by the same client which generated the request. For example, a first interval may be computed between the current request and a previous request, and a second interval can be computed between the two previous requests. The polling rate can be set from the average of the first interval and the second interval and sent to the proxy server in setting up the caching strategy.

Alternate intervals may be computed in generating an average; for example, multiple previous requests in addition to two previous requests may be used, and more than two intervals may be used in computing an average. In general, in computing intervals, a given request need not have resulted in a response to be received from the host server/ content source in order to use it for interval computation. In other words, the timing characteristics of a given request may be used in interval computation, as long as the request has been detected, even if the request failed in sending, or if the response retrieval failed.

One embodiment of the poll schedule generator 247 includes a schedule update engine 247a and/or a time adjustment engine 247b. The schedule update engine 247a can determine a need to update a rate or polling interval with which a given application server/content host from a previously set value, based on a detected interval change in the actual requests generated from a client or application (e.g., mobile application) on the mobile device 250.

For example, a request for which a monitoring rate was determined may now be sent from the application (e.g., mobile application) or client at a different request interval. The scheduled update engine 247a can determine the updated polling interval of the actual requests and generate a new rate, different from the previously set rate to poll the host at on behalf of the mobile device 250. The updated polling rate can be communicated to the remote proxy (proxy server 325) over the cellular network for the remote proxy to monitor the given host. In some instances, the updated polling rate may be determined at the remote proxy or remote entity which monitors the host.

In one embodiment, the time adjustment engine 247b can further optimize the poll schedule generated to monitor the application server/content source (110 or 310). For example, the time adjustment engine 247b can optionally specify a time to start polling to the proxy server. For example, in addition to setting the polling interval at which the proxy server is to monitor the application, server/content host can also specify the time at which an actual request was generated at the mobile client/application.

However, in some cases, due to inherent transmission delay or added network delays or other types of latencies, the remote proxy server receives the poll setup from the local proxy with some delay (e.g., a few minutes, or a few seconds). This has the effect of detecting response change at the source after a request is generated by the mobile client/ application causing the invalidate of the cached response to occur after it has once again been served to the application after the response is no longer current or valid.

To resolve this non-optimal result of serving the out-dated content once again before invalidating it, the time adjustment engine 247b can specify the time (t0) at which polling should begin in addition to the rate, where the specified initial time t0 can be specified to the proxy server 325 as a time that is less than the actual time when the request was generated by the mobile app/client. This way, the server polls the resource slightly before the generation of an actual request by the mobile client such that any content change can be detected prior to an actual application request. This prevents invalid or irrelevant out-dated content/response from being served once again before fresh content is served.

In one embodiment, an outgoing request from a mobile device 250 is detected to be for a persistent connection (e.g., a long poll, COMET style push, and long-held (HTTP) request) based on timing characteristics of prior requests from the same application or client on the mobile device 250. For example, requests and/or corresponding responses can be tracked by the request/response tracking engine 238b of the long poll detector 238a of the poll interval detector 238.

The timing characteristics of the consecutive requests can be determined to set up a polling schedule for the application or client. The polling schedule can be used to monitor the content source (content source/application server) for content changes such that cached content stored on the local cache in the mobile device 250 can be appropriately managed (e.g., updated or discarded). In one embodiment, the timing characteristics can include, for example, a response delay time ('D') and/or an idle time ('IT'). In one embodiment, the response/request tracking engine 238b can track requests and responses to determine, compute, and/or estimate, the timing diagrams for applicant or client requests.

For example, the response/request tracking engine 238b detects a first request (Request 0) initiated by a client on the mobile device and a second request (Request 1) initiated by the client on the mobile device after a response is received at the mobile device responsive to the first request. The second request is one that is subsequent to the first request.

In one embodiment, the response/request tracking engine 238b can track requests and responses to determine, compute, and/or estimate the timing diagrams for applicant or client requests. The response/request tracking engine 238b can detect a first request initiated by a client on the mobile device and a second request initiated by the client on the mobile device after a response is received at the mobile device responsive to the first request. The second request is one that is subsequent to the first request.

The response/request tracking engine 238b further determines relative timings between the first, second requests, and the response received in response to the first request. In general, the relative timings can be used by the long poll detector 238a to determine whether requests generated by the application are long poll requests.

Note that in general, the first and second requests that are used by the response/request tracking engine 238b in computing the relative timings are selected for use after a long poll hunting period has settled or in the event when long poll hunting does not occur. Timing characteristics that are typical of a long poll hunting period can be, for example, detected by the long poll hunting detector 238c. In other words, the requests tracked by the response/request tracking engine 238b and used for determining whether a given request is a long poll occurs after the long poll has settled.

In one embodiment, the long poll hunting detector 238c can identify or detect hunting mode, by identifying increasing request intervals (e.g., increasing delays). The long poll hunting detector 238a can also detect hunting mode by detecting increasing request intervals, followed by a request with no response (e.g., connection timed out), or by detecting increasing request intervals followed by a decrease in the interval. In addition, the long poll hunting detector 238c can apply a filter value or a threshold value to request-response time delay value (e.g., an absolute value) above which the detected delay can be considered to be a long poll request-response delay. The filter value can be any suitable value characteristic of long polls and/or network conditions (e.g., 2 s, 5 s, 10 s, 15 s, 20 s. etc.) and can be used as a filter or threshold value.

The response delay time ('D') refers to the start time to receive a response after a request has been sent and the idle refers to time to send a subsequent request after the response has been received. In one embodiment, the outgoing request is detected to be for a persistent connection based on a comparison (e.g., performed by the tracking engine 238b) of the response delay time relative ('D') or average of ('D') (e.g., any average over any period of time) to the idle time ('IT'), for example, by the long poll detector 238a. The number of averages used can be fixed, dynamically adjusted, or changed over a longer period of time. For example, the requests initiated by the client are determined to be long poll requests if the response delay time interval is greater than the idle time interval (D>IT or D>>IT). In one embodiment, the tracking engine 238b of the long poll detector computes, determines, or estimates the response delay time interval as the amount of time elapsed between time of the first request and initial detection or full receipt of the response.

In one embodiment, a request is detected to be for a persistent connection when the idle time ('IT') is short since persistent connections, established in response to long poll requests or long poll HTTP requests for example, can also be characterized in detecting immediate or near-immediate issuance of a subsequent request after receipt of a response to a previous request (e.g., IT~0). As such, the idle time ('IT') can also be used to detect such immediate or near-immediate re-request to identify long poll requests. The absolute or relative timings determined by the tracking engine 238b are used to determine whether the second request is immediately or near-immediately re-requested after the response to the first request is received. For example, a request may be categorized as a long poll request if D+RT+IT~D+RT since IT is small for this to hold true. IT may be determined to be small if it is less than a threshold value. Note that the threshold value could be fixed or calculated over a limited time period (a session, a day, a month, etc.), or calculated over a longer time period (e.g., several months or the life of the analysis). For example, for every request, the average IT can be determined, and the threshold can be determined using this average IT (e.g., the average IT less a certain percentage may be used as the threshold). This can allow the threshold to automatically adapt over time to network conditions and changes in server capability, resource availability or server response. A fixed threshold can take upon any value including by way of example but not limitation (e.g., 1 s. 2 s. 3 s. . . . etc.).

In one embodiment, the long poll detector 238a can compare the relative timings (e.g., determined by the tracker engine 238b) to request-response timing characteristics for other applications to determine whether the requests of the application are long poll requests. For example, the requests initiated by a client or application can be determined to be long poll requests if the response delay interval time ('D') or the average response delay interval time (e.g., averaged over x number of requests or any number of delay interval times averaged over x amount of time) is greater than a threshold value.

The threshold value can be determined using response delay interval times for requests generated by other clients, for example by the request/response tracking engine 238b and/or by the application profile generator 239 (e.g., the response delay interval tracker 239a). The other clients may reside on the same mobile device and the threshold value is determined locally by components on the mobile device. The threshold value can be determined for all requests over all resources server over all networks, for example. The threshold value can be set to a specific constant value (e.g., 30 seconds, for example) to be used for all requests, or any request which does not have an applicable threshold value (e.g., long poll is detected if D>30 seconds).

In some instances, the other clients reside on different mobile devices and the threshold can be determined by a proxy server (e.g., proxy server 325 of the host 300 shown in the example of FIGS. 3A-B) which is external to the mobile device and able to communicate over a wireless network with the multiple different mobile devices, as will be further described with reference to FIG. 3B.

In one embodiment, the cache policy manager 245 sends the polling schedule to the proxy server (e.g., proxy server 125 or 325 shown in the examples of FIG. 1B and FIG. 3A) and can be used by the proxy server in monitoring the content source, for example, for changed or new content (updated response different from the cached response associated with a request or application). A polling schedule sent to the proxy can include multiple timing parameters including but not limited to interval (time from request 1 to request 2) or a time out interval (time to wait for response, used in long polls, for example). Referring to the timing diagram of a request/response timing sequence timing intervals 'RI', 'D', 'RT', and/or 'IT', or some statistical manipulation of the above values (e.g., average, standard deviation, etc.) may all or in part be sent to the proxy server.

For example, in the case when the local proxy 275 detects a long poll, the various timing intervals in a request/response timing sequence (e.g., 'D', 'RT', and/or 'IT') can be sent to the proxy server 325 for use in polling the content source (e.g., application server/content host 110). The local proxy 275 can also identify to the proxy server 325 that a given application or request to be monitored is a long poll request (e.g., instructing the proxy server to set a 'long poll flag', for example). In addition, the proxy server uses the various timing intervals to determine when to send keep-alive indications on behalf of mobile devices.

The local cache invalidator 244 of the caching policy manager 245 can invalidate cache elements in the local cache (e.g., cache 185 or 285) when new or changed data (e.g., updated response) is detected from the application server/content source for a given request. The cached response can be determined to be invalid for the outgoing request based on a notification received from the proxy server (e.g., proxy 325 or the host server 300). The source which provides responses to requests of the mobile client can be monitored to determine relevancy of the cached response stored in the cache of the mobile device 250 for the request. For example, the cache invalidator 244 can further remove/delete the cached response from the cache of the mobile device when the cached response is no longer valid for a given request or a given application.

In one embodiment, the cached response is removed from the cache after it is provided once again to an application which generated the outgoing request after determining that the cached response is no longer valid. The cached response can be provided again without waiting for the time interval or provided again after waiting for a time interval (e.g., the time interval determined to be specific to emulate the response delay in a long poll). In one embodiment, the time interval is the response delay 'D' or an average value of the response delay 'D' over two or more values.

The new or changed data can be, for example, detected by the proxy server (e.g., proxy server 125 or 325 shown in the examples of FIG. 1B and FIG. 3A). When a cache entry for a given request/poll has been invalidated, the use of the radio on the mobile device 250 can be enabled (e.g., by the local proxy 275 or the cache policy manager 245) to satisfy the subsequent polling requests, as further described with reference to the interaction diagram of FIG. 4B.

One embodiment of the cache policy manager 245 includes a cache or connect selection engine 249 which can decide whether to use a locally cached entry to satisfy a poll/content request generated at the mobile device 250 by an application or widget. For example, the local proxy 275 or the cache policy manger 245 can intercept a polling request, made by an application (e.g., mobile application) on the mobile device, to contact the application server/content provider. The selection engine 249 can determine whether the content received for the intercepted request has been locally stored as cache elements for deciding whether the radio of the mobile device needs to be activated to satisfy the request made by the application (e.g., mobile application) and also determine whether the cached response is still valid for the outgoing request prior to responding to the outgoing request using the cached response.

In one embodiment, the local proxy 275, in response to determining that relevant cached content exists and is still valid, can retrieve the cached elements from the local cache to provide a response to the application (e.g., mobile application) which made the polling request such that a radio of the mobile device is not activated to provide the response to the application (e.g., mobile application). In general, the local proxy 275 continues to provide the cached response each time the outgoing request is received until the updated response different from the cached response is detected.

When it is determined that the cached response is no longer valid, a new request for a given request is transmitted over the wireless network for an updated response. The request can be transmitted to the application server/content provider (e.g., server/host 110) or the proxy server on the host server (e.g., proxy 325 on the host 300) for a new and updated response. In one embodiment the cached response can be provided again as a response to the outgoing request if a new response is not received within the time interval, prior to removal of the cached response from the cache on the mobile device.

Figure 2C:
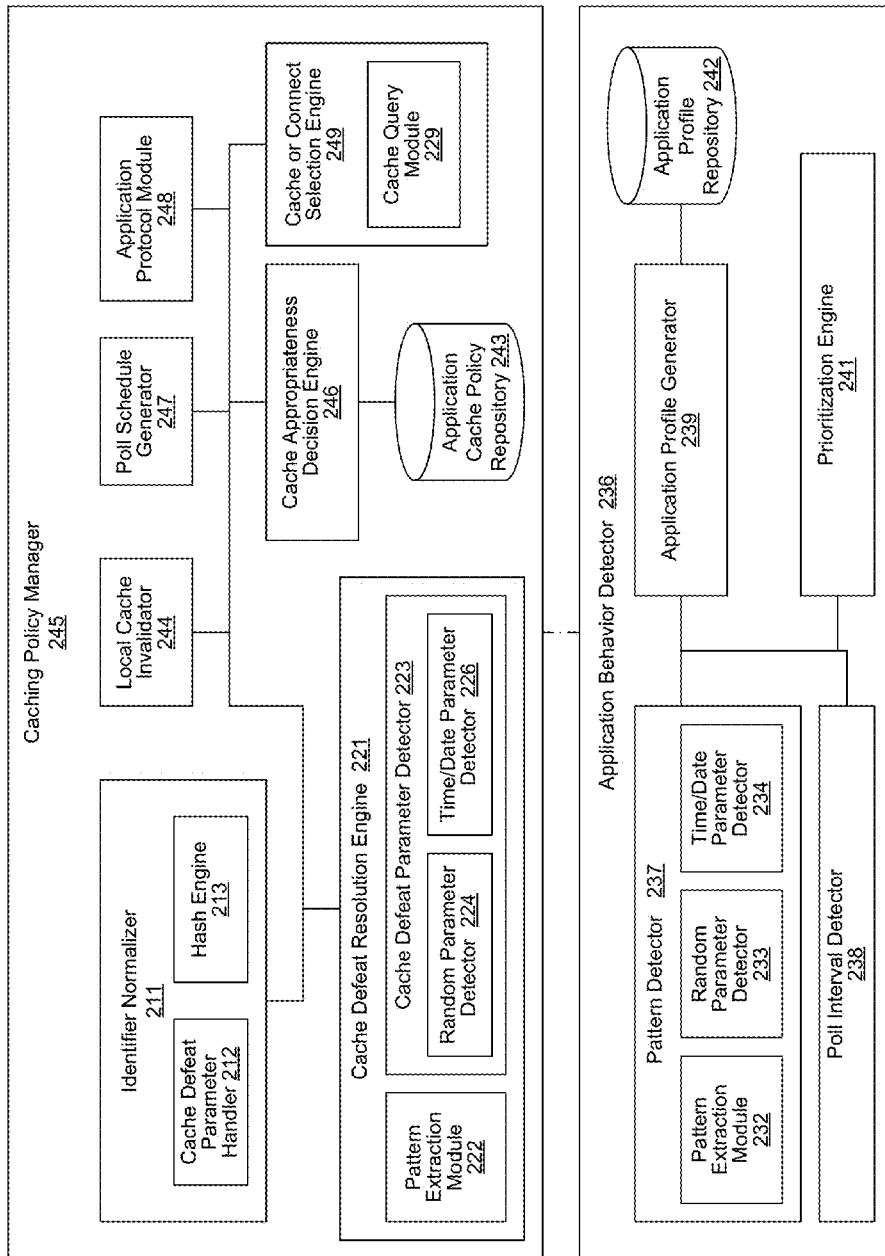
FIG. 2C depicts a block diagram illustrating additional components in the application behavior detector and the caching policy manager in the cache system shown in the example of FIG. 2A which is further capable of detecting cache defeat and perform caching of content addressed by identifiers intended to defeat cache.

FIG. 2C depicts a block diagram illustrating another example of components in the application behavior detector 236 and the caching policy manager 245 in the local proxy 275 on the client-side of the distributed proxy system shown in the example of FIG. 2A. The illustrated application behavior detector 236 and the caching policy manager 245 can, for example, enable the local proxy 275 to detect cache defeat and perform caching of content addressed by identifiers intended to defeat cache.

In one embodiment, the caching policy manager 245 includes a cache defeat resolution engine 221, an identifier formalizer 211, a cache appropriateness decision engine 246, a poll schedule generator 247, an application protocol module 248, a cache or connect selection engine 249 having a cache query module 229, and/or a local cache invalidator 244. The cache defeat resolution engine 221 can further include a pattern extraction module 222 and/or a cache defeat parameter detector 223. The cache defeat parameter detector 223 can further include a random parameter detector 224 and/or a time/date parameter detector 226. One embodiment further includes an application cache policy repository 243 coupled to the decision engine 246.

In one embodiment, the application behavior detector 236 includes a pattern detector 237, a poll interval detector 238, an application profile generator 239, and/or a priority engine 241. The pattern detector 237 can further include a cache defeat parameter detector 223 having also, for example, a random parameter detector 233 and/or a time/date parameter detector 234. One embodiment further includes an application profile repository 242 coupled to the application profile generator 239. The application profile generator 239, and the priority engine 241 have been described in association with the description of the application behavior detector 236 in the example of FIG. 2A.

The cache defeat resolution engine 221 can detect, identify, track, manage, and/or monitor content or content sources (e.g., servers or hosts) which employ identifiers and/or are addressed by identifiers (e.g., resource identifiers such as URLs and/or URIs) with one or more mechanisms that defeat cache or are intended to defeat cache. The cache defeat resolution engine 221 can, for example, detect from a given data request generated by an application or client that the identifier defeats or potentially defeats cache, where the data request otherwise addresses content or responses from a host or server (e.g., application server/content host 110 or 310) that is cacheable.

In one embodiment, the cache defeat resolution engine 221 detects or identifies cache defeat mechanisms used by content sources (e.g., application server/content host 110 or 310) using the identifier of a data request detected at the mobile device 250. The cache defeat resolution engine 221 can detect or identify a parameter in the identifier which can indicate that cache defeat mechanism is used. For example, a format, syntax, or pattern of the parameter can be used to identify cache defeat (e.g., a pattern, format, or syntax as determined or extracted by the pattern extraction module 222).

The pattern extraction module 222 can parse an identifier into multiple parameters or components and perform a matching algorithm on each parameter to identify any of which match one or more predetermined formats (e.g., a date and/or time format). For example, the results of the matching or the parsed out parameters from an identifier can be used (e.g., by the cache defeat parameter detector 223) to identify cache defeating parameters which can include one or more changing parameters.

The cache defeat parameter detector 223, in one embodiment can detect random parameters (e.g., by the random parameter detector 224) and/or time and/or date parameters which are typically used for cache defeat. The cache defeat parameter detector 223 can detect random parameters (e.g., as illustrated in parameters 752 shown in FIG. 7) and/or time/dates using commonly employed formats for these parameters and performing pattern matching algorithms and tests.

In addition to detecting patterns, formats, and/or syntaxes, the cache defeat parameter detector 223 further determines or confirms whether a given parameter is defeating cache and whether the addressed content can be cached by the distributed caching system. The cache defeat parameter detector 223 can detect this by analyzing responses received for the identifiers utilized by a given data request. In general, a changing parameter in the identifier is identified to indicate cache defeat when responses corresponding to multiple data requests are the same even when the multiple data requests uses identifiers with the changing parameter being different for each of the multiple data requests. For example, the request/response pairs illustrate that the responses received are the same, even though the resource identifier includes a parameter that changes with each request.

For example, at least two same responses may be required to identify the changing parameter as indicating cache defeat. In some instances, at least three same responses may be required. The requirement for the number of same responses needed to determine that a given parameter with a varying value between requests is cache defeating may be application specific, context dependent, and/or user dependent/user specified, or a combination of the above. Such a requirement may also be static or dynamically adjusted by the distributed cache system to meet certain performance thresholds and/or either explicit/implicit feedback regarding user experience (e.g., whether the user or application is receiving relevant/fresh content responsive to requests). More of the same responses may be required to confirm cache defeat, or for the system to treat a given parameter as intended for cache defeat if an application begins to malfunction due to response caching and/or if the user expresses dissatisfaction (explicit user feedback) or the system detects user frustration (implicit user cues).

The cache appropriateness decision engine 246 can detect, assess, or determine whether content from a content source (e.g., application server/content provider 110 in the example of FIG. 1B) with which a mobile device 250 interacts, has content that may be suitable for caching. In some instances, content from a given application server/content provider (e.g., the server/provider 110 of FIG. 1B) is determined to be suitable for caching based on a set of criteria (for example, criteria specifying time criticality of the content that is being requested from the content source). In one embodiment, the local proxy (e.g., the local proxy 175 or 275 of FIG. 1B and FIG. 2A) applies a selection criteria to store the content from the host server which is requested by an application as cached elements in a local cache on the mobile device to satisfy subsequent requests made by the application.

The selection criteria can also include, by way of example, but not limitation, state of the mobile device indicating whether the mobile device is active or inactive, network conditions, and/or radio coverage statistics. The cache appropriateness decision engine 246 can any one or any combination of the criteria, and in any order, in identifying sources for which caching may be suitable.

Once application servers/content providers having identified or detected content that is potentially suitable for local caching on the mobile device 250, the cache policy manager 245 can proceed to cache the associated content received from the identified sources by storing content received from the content source as cache elements in a local cache (e.g., local cache 185 or 285 shown in the examples of FIG. 1B and FIG. 2A, respectively) on the mobile device 250. The content source can also be identified to a proxy server (e.g., proxy server 125 or 325 shown in the examples of FIG. 1B and FIG. 3A, respectively) remote from and in wireless communication with the mobile device 250 such that the proxy server can monitor the content source (e.g., application server/content provider 110) for new or changed data. Similarly, the local proxy (e.g., the local proxy 175 or 275 of FIG. 1B and FIG. 2A, respectively) can identify to the proxy server that content received from a specific application server/content provider is being stored as cached elements in the local cache.

In one embodiment, cache elements are stored in the local cache 285 as being associated with a normalized version of an identifier for an identifier employing one or more parameters intended to defeat cache. The identifier can be normalized by the identifier normalizer module 211 and the normalization process can include, by way of example, one or more of: converting the URI scheme and host to lower-case, capitalizing letters in percent-encoded escape sequences, removing a default port, and removing duplicate slashes.

In another embodiment, the identifier is normalized by removing the parameter for cache defeat and/or replacing the parameter with a static value which can be used to address or be associated with the cached response received responsive to a request utilizing the identifier by the normalizer 211 or the cache defeat parameter handler 212. For example, the cached elements stored in the local cache 285 (shown in FIG. 2A) can be identified using the normalized version of the identifier or a hash value of the normalized version of the identifier. The hash value of an identifier or of the normalized identifier may be generated by the hash engine 213.

Once content has been locally cached, the cache policy manager 245 can, upon receiving future polling requests to contact the content server, retrieve the cached elements from the local cache to respond to the polling request made at the mobile device 250 such that a radio of the mobile device is not activated to service the polling request. Such servicing and fulfilling application (e.g., mobile application) requests locally via local cache entries allow for more efficient resource and mobile network traffic utilization and management since network bandwidth and other resources need not be used to request/receive poll responses which may have not changed from a response that has already been received at the mobile device 250.

One embodiment of the cache policy manager 245 includes a poll schedule generator 247 which can generate a polling schedule for one or more applications on the mobile device 250. The polling schedule can specify a polling interval that can be employed by the proxy server (e.g., proxy server 125 or 325 shown in the examples of FIG. 1B and FIG. 3A) in monitoring the content source for one or more applications. The polling schedule can be determined, for example, based on the interval between the polling requests directed to the content source from the mobile device. In one embodiment, the poll interval detector 238 of the application behavior detector can monitor polling requests directed to a content source from the mobile device 250 in order to determine an interval between the polling requests made from any or all application (e.g., mobile application).

In one embodiment, the cache policy manager 245 sends the polling schedule is sent to the proxy server (e.g., proxy server 125 or 325 shown in the examples of FIG. 1B and FIG. 3A) and can be used by the proxy server in monitoring the content source, for example, for changed or new content. The local cache invalidator 244 of the caching policy manager 245 can invalidate cache elements in the local cache (e.g., cache 185 or 285) when new or changed data is detected from the application server/content source for a given request. The new or changed data can be, for example, detected by the proxy server. When a cache entry for a given request/poll has been invalidated and/or removed (e.g., deleted from cache) after invalidation, the use of the radio on the mobile device 250 can be enabled (e.g., by the local proxy or the cache policy manager 245) to satisfy the subsequent polling requests, as further described with reference to the interaction diagram of FIGS. 9-10.

In another embodiment, the proxy server (e.g., proxy server 125 or 325 shown in the examples of FIG. 1B and FIG. 3A) uses a modified version of a resource identifier used in a data request to monitor a given content source (the application server/content host 110 of FIG. 1A and FIG. 1B to which the data request is addressed) for new or changed data. For example, in the instance where the content source or identifier is detected to employ cache defeat mechanisms, a modified (e.g., normalized) identifier can be used instead to poll the content source. The modified or normalized version of the identifier can be communicated to the proxy server by the caching policy manager 245, or more specifically the cache defeat parameter handler 212 of the identifier normalizer 211.

The modified identifier used by the proxy server to poll the content source on behalf of the mobile device/application (e.g., mobile application) may or may not be the same as the normalized identifier. For example, the normalized identifier may be the original identifier with the changing cache defeating parameter removed whereas the modified identifier uses a substitute parameter in place of the parameter that is used to defeat cache (e.g., the changing parameter replaced with a static value or other predetermined value known to the local proxy and/or proxy server). The modified parameter can be determined by the local proxy 275 and communicated to the proxy server. The modified parameter may also be generated by the proxy server (e.g., by the identifier modifier module 353 shown in the example of FIG. 3C).

One embodiment of the cache policy manager 245 includes a cache or connect selection engine 249 which can decide whether to use a locally cached entry to satisfy a poll/content request generated at the mobile device 250 by an application or widget. For example, the local proxy 275 or the cache policy manger 245 can intercept a polling request made by an application (e.g., mobile application) on the mobile device, to contact the application server/content provider. The selection engine 249 can determine whether the content received for the intercepted request has been locally stored as cache elements for deciding whether the a radio of the mobile device needs to be activated to satisfy the request made by the application (e.g., mobile application). In one embodiment, the local proxy 275, in response to determining that relevant cached content exists and is still valid, can retrieve the cached elements from the local cache to provide a response to the application (e.g., mobile application) which made the polling request such that a radio of the mobile device is not activated to provide the response to the application (e.g., mobile application).

In one embodiment, the cached elements stored in the local cache 285 (shown in FIG. 2A) can be identified using a normalized version of the identifier or a hash value of the normalized version of the identifier, for example, using the cache query module 229. Cached elements can be stored with normalized identifiers which have cache defeating parameters removed or otherwise replaced such that the relevant cached elements can be identified and retrieved in the future to satisfy other requests employing the same type of cache defeat. For example, when an identifier utilized in a subsequent request is determined to be utilizing the same cache defeating parameter, the normalized version of this identifier can be generated and used to identify a cached response stored in the mobile device cache to satisfy the data request. The hash value of an identifier or of the normalized identifier may be generated by the hash engine 213 of the identifier normalizer 211.

Figure 2D:
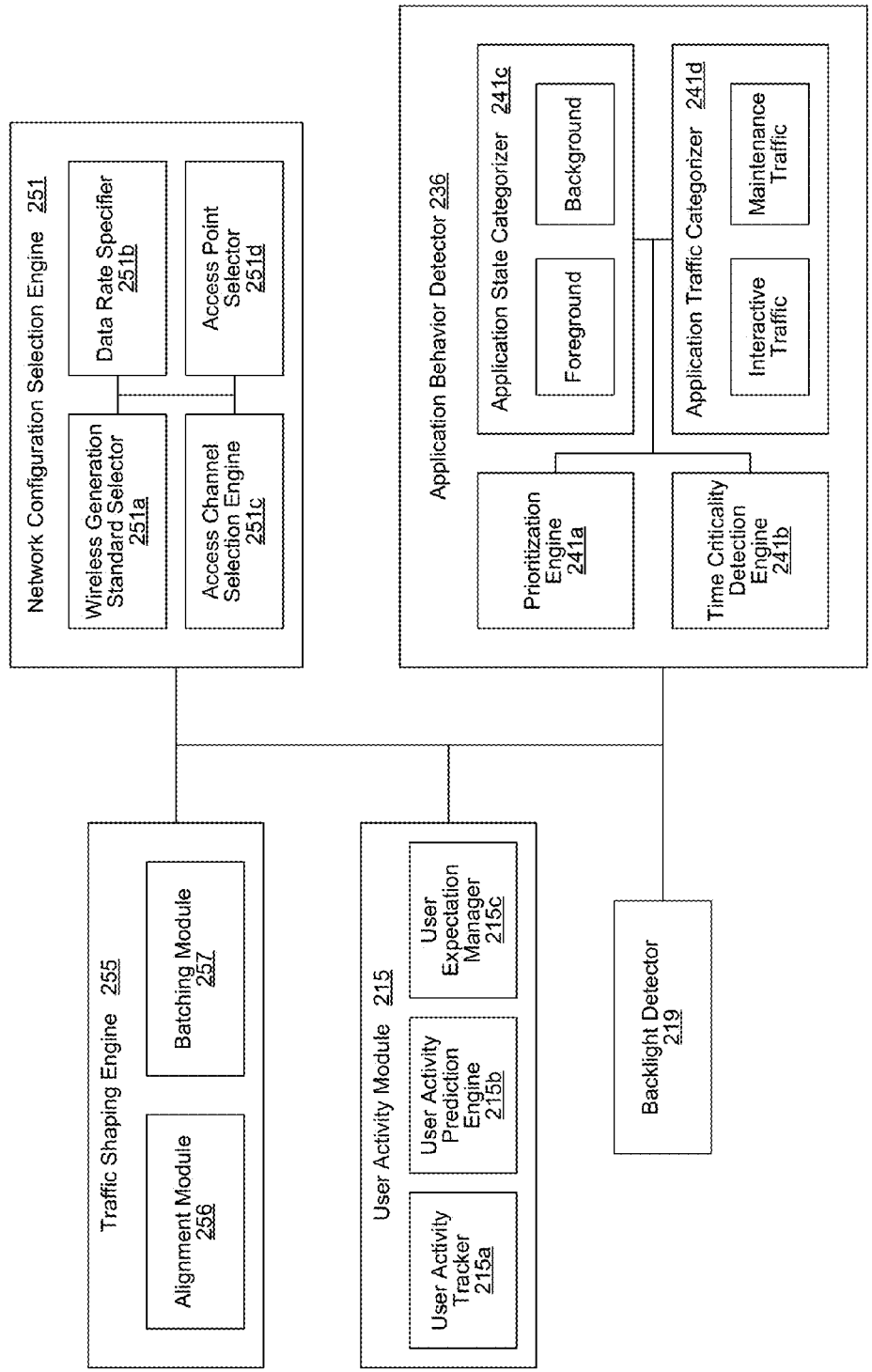
FIG. 2D depicts a block diagram illustrating examples of additional components in the local cache shown in the example of FIG. 2A which is further capable of performing mobile traffic categorization and policy implementation based on application behavior and/or user activity.

FIG. 2D depicts a block diagram illustrating examples of additional components in the local proxy 275 shown in the example of FIG. 2A which is further capable of performing mobile traffic categorization and policy implementation based on application behavior and/or user activity.

In this embodiment of the local proxy 275, the user activity module 215 further includes one or more of, a user activity tracker 215a, a user activity prediction engine 215b, and/or a user expectation manager 215c. The application behavior detect 236 can further include a prioritization engine 241a, a time criticality detection engine 241b, an application state categorizer 241c, and/or an application traffic categorizer 241d. The local proxy 275 can further include a backlight detector 219 and/or a network configuration selection engine 251. The network configuration selection engine 251 can further include, one or more of, a wireless generation standard selector 251a, a data rate specifier 251b, an access channel selection engine 251c, and/or an access point selector.

In one embodiment, the application behavior detector 236 is able to detect, determined, identify, or infer, the activity state of an application on the mobile device 250 to which traffic has originated from or is directed to, for example, via the application state categorizer 241c and/or the traffic categorizer 241d. The activity state can be determined by whether the application is in a foreground or background state on the mobile device (via the application state categorizer 241c) since the traffic for a foreground application vs. a background application may be handled differently.

In one embodiment, the activity state can be determined, detected, identified, or inferred with a level of certainty of heuristics, based on the backlight status of the mobile device 250 (e.g., by the backlight detector 219) or other software agents or hardware sensors on the mobile device, including but not limited to, resistive sensors, capacitive sensors, ambient light sensors, motion sensors, touch sensors, etc. In general, if the backlight is on, the traffic can be treated as being or determined to be generated from an application that is active or in the foreground, or the traffic is interactive. In addition, if the backlight is on, the traffic can be treated as being or determined to be traffic from user interaction or user activity, or traffic containing data that the user is expecting within some time frame.

In one embodiment, the activity state is determined based on whether the traffic is interactive traffic or maintenance traffic. Interactive traffic can include transactions from responses and requests generated directly from user activity/interaction with an application and can include content or data that a user is waiting or expecting to receive. Maintenance traffic may be used to support the functionality of an application which is not directly detected by a user. Maintenance traffic can also include actions or transactions that may take place in response to a user action, but the user is not actively waiting for or expecting a response.

For example, a mail or message delete action at a mobile device 250 generates a request to delete the corresponding mail or message at the server, but the user typically is not waiting for a response. Thus, such a request may be categorized as maintenance traffic, or traffic having a lower priority (e.g., by the prioritization engine 241a) and/or is not time-critical (e.g., by the time criticality detection engine 214b).

Contrastingly, a mail 'read' or message 'read' request initiated by a user a the mobile device 250, can be categorized as 'interactive traffic' since the user generally is waiting to access content or data when they request to read a message or mail. Similarly, such a request can be categorized as having higher priority (e.g., by the prioritization engine 241a) and/or as being time critical/time sensitive (e.g., by the time criticality detection engine 241b).

The time criticality detection engine 241b can generally determine, identify, infer the time sensitivity of data contained in traffic sent from the mobile device 250 or to the mobile device from a host server (e.g., host 300) or application server (e.g., app server/content source 110). For example, time sensitive data can include, status updates, stock information updates, IM presence information, email messages or other messages, actions generated from mobile gaming applications, webpage requests, location updates, etc. Data that is not time sensitive or time critical, by nature of the content or request, can include requests to delete messages, mark-as-read or edited actions, application-specific actions such as a add-friend or delete-friend request, certain types of messages, or other information which does not frequently changing by nature, etc. In some instances when the data is not time critical, the timing with which to allow the traffic to pass through is set based on when additional data needs to be sent from the mobile device 250. For example, traffic shaping engine 255 can align the traffic with one or more subsequent transactions to be sent together in a single power-on event of the mobile device radio (e.g., using the alignment module 256 and/or the batching module 257). The alignment module 256 can also align polling requests occurring close in time directed to the same host server, since these request are likely to be responded to with the same data.

In the alternate or in combination, the activity state can be determined from assessing, determining, evaluating, inferring, identifying user activity at the mobile device 250 (e.g., via the user activity module 215). For example, user activity can be directly detected and tracked using the user activity tracker 215a. The traffic resulting therefrom can then be categorized appropriately for subsequent processing to determine the policy for handling. Furthermore, user activity can be predicted or anticipated by the user activity prediction engine 215b. By predicting user activity or anticipating user activity, the traffic thus occurring after the prediction can be treated as resulting from user activity and categorized appropriately to determine the transmission policy.

In addition, the user activity module 215 can also manage user expectations (e.g., via the user expectation manager 215c and/or in conjunction with the activity tracker 215 and/or the prediction engine 215b) to ensure that traffic is categorized appropriately such that user expectations are generally met. For example, a user-initiated action should be analyzed (e.g., by the expectation manager 215) to determine or infer whether the user would be waiting for a response. If so, such traffic should be handled under a policy such that the user does not experience an unpleasant delay in receiving such a response or action.

In one embodiment, an advanced generation wireless standard network is selected for use in sending traffic between a mobile device and a host server in the wireless network based on the activity state of the application on the mobile device for which traffic is originated from or directed to. An advanced technology standards such as the 3G, 3.5G, 3G+, 4G, or LTE network can be selected for handling traffic generated as a result of user interaction, user activity, or traffic containing data that the user is expecting or waiting for. Advanced generation wireless standard network can also be selected for to transmit data contained in traffic directed to the mobile device which responds to foreground activities.

In categorizing traffic and defining a transmission policy for mobile traffic, a network configuration can be selected for use (e.g., by the network configuration selection engine 251) on the mobile device 250 in sending traffic between the mobile device and a proxy server (325) and/or an application server (e.g., app server/host 110). The network configuration that is selected can be determined based on information gathered by the application behavior module 236 regarding application activity state (e.g., background or foreground traffic), application traffic category (e.g., interactive or maintenance traffic), any priorities of the data/content, time sensitivity/criticality.

The network configuration selection engine 2510 can select or specify one or more of, a generation standard (e.g., via wireless generation standard selector 251a), a data rate (e.g., via data rate specifier 251b), an access channel (e.g., access channel selection engine 251c), and/or an access point (e.g., via the access point selector 251d), in any combination.

For example, a more advanced generation (e.g., 3G, LTE, or 4G or later) can be selected or specified for traffic when the activity state is in interaction with a user or in a foreground on the mobile device. Contrastingly, an older generation standard (e.g., 2G, 2.5G, or 3G or older) can be specified for traffic when one or more of the following is detected, the application is not interacting with the user, the application is running in the background on the mobile device, or the data contained in the traffic is not time critical, or is otherwise determined to have lower priority.

Similarly, a network configuration with a slower data rate can be specified for traffic when one or more of the following is detected, the application is not interacting with the user, the application is running in the background on the mobile device, or the data contained in the traffic is not time critical. The access channel (e.g., Forward access channel or dedicated channel) can be specified.

FIG. 3A depicts a block diagram illustrating an example of server-side components in a distributed proxy and cache system residing on a host server 300 that manages traffic in a wireless network for resource conservation. The server-side proxy (or proxy server 325) can further categorize mobile traffic and/or implement delivery policies based on application behavior, content priority, user activity, and/or user expectations.

The host server 300 generally includes, for example, a network interface 308 and/or one or more repositories 312, 314, and 316. Note that server 300 may be any portable/mobile or non-portable device, server, cluster of computers and/or other types of processing units (e.g., any number of machines shown in the example of FIG. 24) able to receive or transmit signals to satisfy data requests over a network including any wired or wireless networks (e.g., WiFi, cellular, Bluetooth, etc.).

The network interface 308 can include networking module(s) or devices(s) that enable the server 300 to mediate data in a network with an entity that is external to the host server 300, through any known and/or convenient communications protocol supported by the host and the external entity. Specifically, the network interface 308 allows the server 300 to communicate with multiple devices including mobile phone devices 350 and/or one or more application servers/content providers 310.

The host server 300 can store information about connections (e.g., network characteristics, conditions, types of connections, etc.) with devices in the connection metadata repository 312. Additionally, any information about third party application or content providers can also be stored in the repository 312. The host server 300 can store information about devices (e.g., hardware capability, properties, device settings, device language, network capability, manufacturer, device model, OS, OS version, etc.) in the device information repository 314. Additionally, the host server 300 can store information about network providers and the various network service areas in the network service provider repository 316.

The communication enabled by network interface 308 allows for simultaneous connections (e.g., including cellular connections) with devices 350 and/or connections (e.g., including wired/wireless, HTTP, Internet connections, LAN, WiFi, etc.) with content servers/providers 310 to manage the traffic between devices 350 and content providers 310, for optimizing network resource utilization and/or to conserver power (battery) consumption on the serviced devices 350. The host server 300 can communicate with mobile devices 350 serviced by different network service providers and/or in the same/different network service areas. The host server 300 can operate and is compatible with devices 350 with varying types or levels of mobile capabilities, including by way of example but not limitation, 1G, 2G, 2G transitional (2.5G, 2.75G), 3G (IMT-2000), 3G transitional (3.5G, 3.75G, 3.9G), 4G (IMT-advanced), etc.

In general, the network interface 308 can include one or more of a network adaptor card, a wireless network interface card (e.g., SMS interface, WiFi interface, interfaces for various generations of mobile communication standards including but not limited to 1G, 2G, 3G, 3.5G, 4G type networks such as LTE, WiMAX, etc.), Bluetooth, WiFi, or any other network whether or not connected via a router, an access point, a wireless router, a switch, a multilayer switch, a protocol converter, a gateway, a bridge, a bridge router, a hub, a digital media receiver, and/or a repeater.

The host server 300 can further include server-side components of the distributed proxy and cache system which can include a proxy server 325 and a server cache 335. In one embodiment, the proxy server 325 can include an HTTP access engine 345, a caching policy manager 355, a proxy controller 365, a traffic shaping engine 375, a new data detector 347 and/or a connection manager 395.

The HTTP access engine 345 may further include a heartbeat manager 398; the proxy controller 365 may further include a data invalidator module 368; the traffic shaping engine 375 may further include a control protocol 376 and a batching module 377. Additional or less components/modules/engines can be included in the proxy server 325 and each illustrated component.

As used herein, a "module," a "manager," a "handler," a "detector," an "interface," a "controller," a "normalizer," a "generator," an "invalidator," or an "engine" includes a general purpose, dedicated or shared processor and, typically, firmware or software modules that are executed by the processor. Depending upon implementation-specific or other considerations, the module, manager, handler, detector, interface, controller, normalizer, generator, invalidator, or engine can be centralized or its functionality distributed. The module, manager, handler, detector, interface, controller, normalizer, generator, invalidator, or engine can include general or special purpose hardware, firmware, or software embodied in a computer-readable (storage) medium for execution by the processor. As used herein, a computer-readable medium or computer-readable storage medium is intended to include all mediums that are statutory (e.g., in the United States, under 35 U.S.C. 101), and to specifically exclude all mediums that are non-statutory in nature to the extent that the exclusion is necessary for a claim that includes the computer-readable (storage) medium to be valid. Known statutory computer-readable mediums include hardware (e.g., registers, random access memory (RAM), non-volatile (NV) storage, to name a few), but may or may not be limited to hardware.

In the example of a device (e.g., mobile device 350) making an application or content request to an application server or content provider 310, the request may be intercepted and routed to the proxy server 325 which is coupled to the device 350 and the application server/content provider 310. Specifically, the proxy server is able to communicate with the local proxy (e.g., proxy 175 and 275 of the examples of FIG. 1 and FIG. 2 respectively) of the mobile device 350, the local proxy forwards the data request to the proxy server 325 in some instances for further processing and, if needed, for transmission to the application server/content server 310 for a response to the data request.

In such a configuration, the host 300, or the proxy server 325 in the host server 300 can utilize intelligent information provided by the local proxy in adjusting its communication with the device in such a manner that optimizes use of network and device resources. For example, the proxy server 325 can identify characteristics of user activity on the device 350 to modify its communication frequency. The characteristics of user activity can be determined by, for example, the activity/behavior awareness module 366 in the proxy controller 365 via information collected by the local proxy on the device 350.

In one embodiment, communication frequency can be controlled by the connection manager 395 of the proxy server 325, for example, to adjust push frequency of content or updates to the device 350. For instance, push frequency can be decreased by the connection manager 395 when characteristics of the user activity indicate that the user is inactive. In one embodiment, when the characteristics of the user activity indicate that the user is subsequently active after a period of inactivity, the connection manager 395 can adjust the communication frequency with the device 350 to send data that was buffered as a result of decreased communication frequency to the device 350.

In addition, the proxy server 325 includes priority awareness of various requests, transactions, sessions, applications, and/or specific events. Such awareness can be determined by the local proxy on the device 350 and provided to the proxy server 325. The priority awareness module 367 of the proxy server 325 can generally assess the priority (e.g., including time-criticality, time-sensitivity, etc.) of various events or applications; additionally, the priority awareness module 367 can track priorities determined by local proxies of devices 350.

In one embodiment, through priority awareness, the connection manager 395 can further modify communication frequency (e.g., use or radio as controlled by the radio controller 396) of the server 300 with the devices 350. For example, the server 300 can notify the device 350, thus requesting use of the radio if it is not already in use when data or updates of an importance/priority level which meets a criteria becomes available to be sent.

In one embodiment, the proxy server 325 can detect multiple occurrences of events (e.g., transactions, content, data received from server/provider 310) and allow the events to accumulate for batch transfer to device 350. Batch transfer can be cumulated and transfer of events can be delayed based on priority awareness and/or user activity/application behavior awareness as tracked by modules 367 and/or 366. For example, batch transfer of multiple events (of a lower priority) to the device 350 can be initiated by the batching module 377 when an event of a higher priority (meeting a threshold or criteria) is detected at the server 300. In addition, batch transfer from the server 300 can be triggered when the server receives data from the device 350, indicating that the device radio is already in use and is thus on. In one embodiment, the proxy server 325 can order the each messages/packets in a batch for transmission based on event/transaction priority such that higher priority content can be sent first in case connection is lost or the battery dies, etc.

In one embodiment, the server 300 caches data (e.g., as managed by the caching policy manager 355) such that communication frequency over a network (e.g., cellular network) with the device 350 can be modified (e.g., decreased). The data can be cached, for example, in the server cache 335 for subsequent retrieval or batch sending to the device 350 to potentially decrease the need to turn on the device 350 radio. The server cache 335 can be partially or wholly internal to the host server 300, although in the example of FIG. 3A it is shown as being external to the host 300. In some instances, the server cache 335 may be the same as and/or integrated in part or in whole with another cache managed by another entity (e.g., the optional caching proxy server 199 shown in the example of FIG. 1B), such as being managed by an application server/content provider 310, a network service provider, or another third party.

In one embodiment, content caching is performed locally on the device 350 with the assistance of host server 300. For example, proxy server 325 in the host server 300 can query the application server/provider 310 with requests and monitor changes in responses. When changed or new responses are detected (e.g., by the new data detector 347), the proxy server 325 can notify the mobile device 350 such that the local proxy on the device 350 can make the decision to invalidate (e.g., indicated as out-dated) the relevant cache entries stored as any responses in its local cache. Alternatively, the data invalidator module 368 can automatically instruct the local proxy of the device 350 to invalidate certain cached data, based on received responses from the application server/provider 310. The cached data is marked as invalid, and can get replaced or deleted when new content is received from the content server 310.

Note that data change can be detected by the detector 347 in one or more ways. For example, the server/provider 310 can notify the host server 300 upon a change. The change can also be detected at the host server 300 in response to a direct poll of the source server/provider 310. In some instances, the proxy server 325 can in addition, pre-load the local cache on the device 350 with the new/updated data. This can be performed when the host server 300 detects that the radio on the mobile device is already in use, or when the server 300 has additional content/data to be sent to the device 350.

One or more the above mechanisms can be implemented simultaneously or adjusted/configured based on application (e.g., different policies for different servers/providers 310). In some instances, the source provider/server 310 may notify the host 300 for certain types of events (e.g., events meeting a priority threshold level). In addition, the provider/server 310 may be configured to notify the host 300 at specific time intervals, regardless of event priority.

In one embodiment, the proxy server 325 of the host 300 can monitor/track responses received for the data request from the content source for changed results prior to returning the result to the mobile device, such monitoring may be suitable when data request to the content source has yielded same results to be returned to the mobile device, thus preventing network/power consumption from being used when no new changes are made to a particular requested. The local proxy of the device 350 can instruct the proxy server 325 to perform such monitoring or the proxy server 325 can automatically initiate such a process upon receiving a certain number of the same responses (e.g., or a number of the same responses in a period of time) for a particular request.

In one embodiment, the server 300, through the activity/behavior awareness module 366, is able to identify or detect user activity at a device that is separate from the mobile device 350. For example, the module 366 may detect that a user's message inbox (e.g., email or types of inbox) is being accessed. This can indicate that the user is interacting with his/her application using a device other than the mobile device 350 and may not need frequent updates, if at all.

The server 300, in this instance, can thus decrease the frequency with which new or updated content is sent to the mobile device 350, or eliminate all communication for as long as the user is detected to be using another device for access. Such frequency decrease may be application specific (e.g., for the application with which the user is interacting with on another device), or it may be a general frequency decrease (E.g., since the user is detected to be interacting with one server or one application via another device, he/she could also use it to access other services.) to the mobile device 350.

In one embodiment, the host server 300 is able to poll content sources 310 on behalf of devices 350 to conserve power or battery consumption on devices 350. For example, certain applications on the mobile device 350 can poll its respective server 310 in a predictable recurring fashion. Such recurrence or other types of application behaviors can be tracked by the activity/behavior module 366 in the proxy controller 365. The host server 300 can thus poll content sources 310 for applications on the mobile device 350 that would otherwise be performed by the device 350 through a wireless (e.g., including cellular connectivity). The host server can poll the sources 310 for new or changed data by way of the HTTP access engine 345 to establish HTTP connection or by way of radio controller 396 to connect to the source 310 over the cellular network. When new or changed data is detected, the new data detector 347 can notify the device 350 that such data is available and/or provide the new/changed data to the device 350.

In one embodiment, the connection manager 395 determines that the mobile device 350 is unavailable (e.g., the radio is turned off) and utilizes SMS to transmit content to the device 350, for instance, via the SMSC shown in the example of FIG. 1B. SMS is used to transmit invalidation messages, batches of invalidation messages, or even content in the case where the content is small enough to fit into just a few (usually one or two) SMS messages. This avoids the need to access the radio channel to send overhead information. The host server 300 can use SMS for certain transactions or responses having a priority level above a threshold or otherwise meeting a criteria. The server 300 can also utilize SMS as an out-of-band trigger to maintain or wake-up an IP connection as an alternative to maintaining an always-on IP connection.

In one embodiment, the connection manager 395 in the proxy server 325 (e.g., the heartbeat manager 398) can generate and/or transmit heartbeat messages on behalf of connected devices 350 to maintain a backend connection with a provider 310 for applications running on devices 350.

For example, in the distributed proxy system, local cache on the device 350 can prevent any or all heartbeat messages needed to maintain TCP/IP connections required for applications from being sent over the cellular, or other, network and instead rely on the proxy server 325 on the host server 300 to generate and/or send the heartbeat messages to maintain a connection with the backend (e.g., application server/provider 110 in the example of FIG. 1A). The proxy server can generate the keep-alive (heartbeat) messages independent of the operations of the local proxy on the mobile device.

The repositories 312, 314, and/or 316 can additionally store software, descriptive data, images, system information, drivers, and/or any other data item utilized by other components of the host server 300 and/or any other servers for operation. The repositories may be managed by a database management system (DBMS), for example, which may be but is not limited to Oracle, DB2, Microsoft Access, Microsoft SQL Server, PostgreSQL, MySQL, FileMaker, etc.

The repositories can be implemented via object-oriented technology and/or via text files and can be managed by a distributed database management system, an object-oriented database management system (OODBMS) (e.g., ConceptBase, FastDB Main Memory Database Management System, JDOInstruments, ObjectDB, etc.), an object-relational database management system (ORDBMS) (e.g., Informix, OpenLink Virtuoso, VMDS, etc.), a file system, and/or any other convenient or known database management package.

Figure 3B:
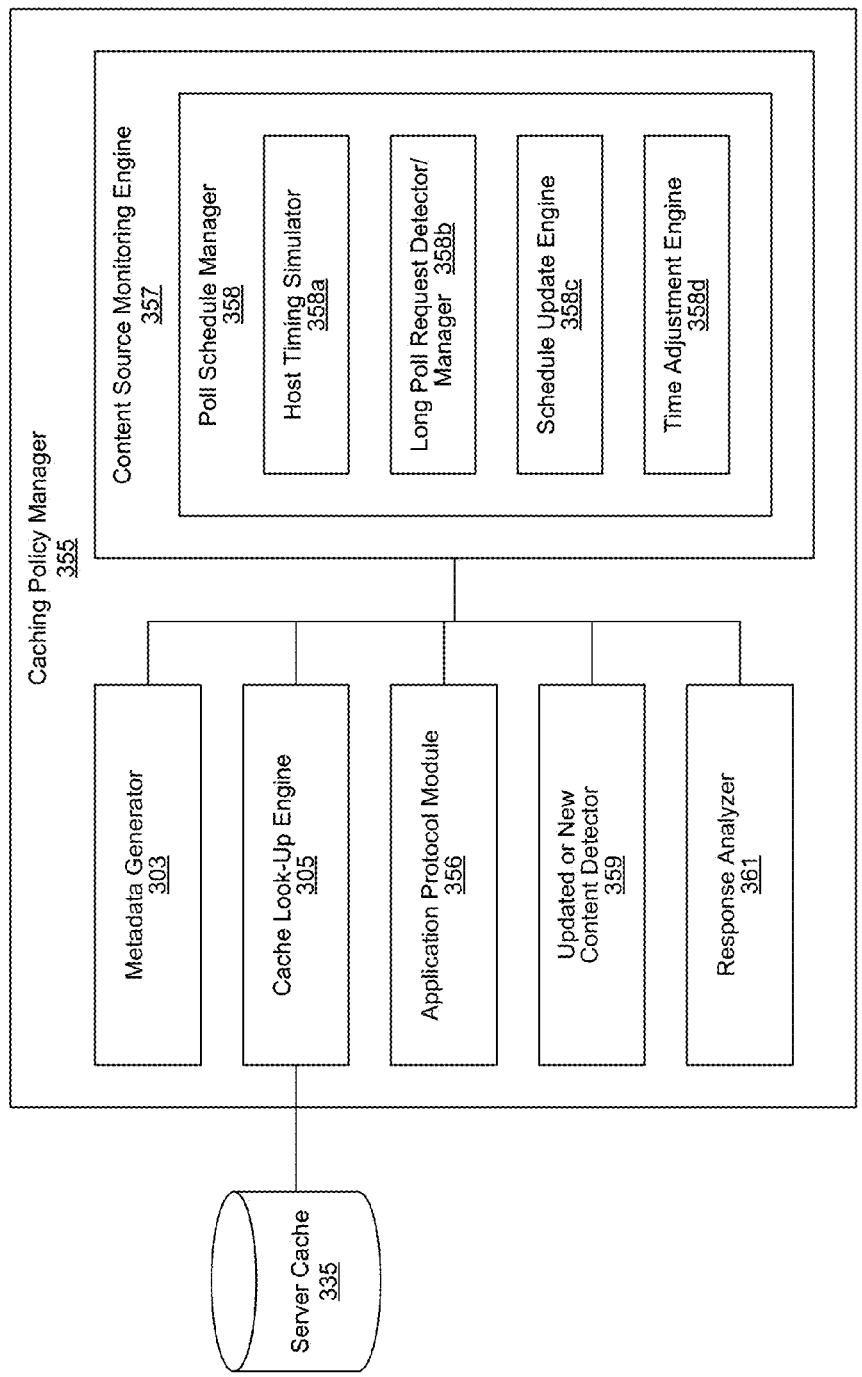
FIG. 3B depicts a block diagram illustrating a further example of components in the caching policy manager in the cache system shown in the example of FIG. 3A which is capable of caching and adapting caching strategies for mobile application behavior and/or network conditions. Components capable of detecting long poll requests and managing caching of long polls are also illustrated.

FIG. 3B depicts a block diagram illustrating a further example of components in the caching policy manager 355 in the cache system shown in the example of FIG. 3A which is capable of caching and adapting caching strategies for application (e.g., mobile application) behavior and/or network conditions.

The caching policy manager 355, in one embodiment, can further include a metadata generator 303, a cache look-up engine 305, an application protocol module 356, a content source monitoring engine 357 having a poll schedule manager 358, a response analyzer 361, and/or an updated or new content detector 359. In one embodiment, the poll schedule manager 358 further includes a host timing simulator 358*a*, a long poll request detector/manager 358*b*, a schedule update engine 358*c*, and/or a time adjustment engine 358*d*. The metadata generator 303 and/or the cache look-up engine 305 can be coupled to the cache 335 (or, server cache) for modification or addition to cache entries or querying thereof.

In one embodiment, the proxy server (e.g., the proxy server 125 or 325 of the examples of FIG. 1B and FIG. 3A) can monitor a content source for new or changed data via the monitoring engine 357. The proxy server, as shown, is an entity external to the mobile device 250 of FIGS. 2A-B. The content source (e.g., application server/content provider 110 of FIG. 1B) can be one that has been identified to the proxy server (e.g., by the local proxy) as having content that is being locally cached on a mobile device (e.g., mobile device 150 or 250). The content source can be monitored, for example, by the monitoring engine 357 at a frequency that is based on polling frequency of the content source at the mobile device. The poll schedule can be generated, for example, by the local proxy and sent to the proxy server. The poll frequency can be tracked and/or managed by the poll schedule manager 358.

For example, the proxy server can poll the host (e.g., content provider/application server) on behalf of the mobile device and simulate the polling behavior of the client to the host via the host timing simulator 358*a*. The polling behavior can be simulated to include characteristics of a long poll request-response sequences experienced in a persistent connection with the host (e.g., by the long poll request detector/manager 358*b*). Note that once a polling interval/behavior is set, the local proxy 275 on the device-side and/or the proxy server 325 on the server-side can verify whether application and application server/content host behavior match or can be represented by this predicted pattern. In general, the local proxy and/or the proxy server can detect deviations and, when appropriate, re-evaluate and compute, determine, or estimate another polling interval.

In one embodiment, the caching policy manager 355 on the server-side of the distribute proxy can, in conjunction with or independent of the proxy server 275 on the mobile device, identify or detect long poll requests. For example, the caching policy manager 355 can determine a threshold value to be used in comparison with a response delay interval time in a request-response sequence for an application request to identify or detect long poll requests, possible long poll requests (e.g., requests for a persistent connection with a host with which the client communicates including, but not limited to, a long-held HTTP request, a persistent connection enabling COMET style push, request for HTTP streaming, etc.), or other requests which can otherwise be treated as a long poll request.

For example, the threshold value can be determined by the proxy 325 using response delay interval times for requests generated by clients/applications across mobile devices which may be serviced by multiple different cellular or wireless networks. Since the proxy 325 resides on host 300 is able to communicate with multiple mobile devices via multiple networks, the caching policy manager 355 has access to application/client information at a global level which can be used in setting threshold values to categorize and detect long polls.

By tracking response delay interval times across applications across devices over different or same networks, the caching policy manager 355 can set one or more threshold values to be used in comparison with response delay interval times for long poll detection. Threshold values set by the proxy server 325 can be static or dynamic, and can be associated with conditions and/or a time-to-live (an expiration time/date in relative or absolute terms).

In addition, the caching policy manager 355 of the proxy 325 can further determine the threshold value, in whole or in part, based on network delays of a given wireless network, networks serviced by a given carrier (service provider), or multiple wireless networks. The proxy 325 can also determine the threshold value for identification of long poll requests based on delays of one or more application server/content provider (e.g., 110) to which application (e.g., mobile application) or mobile client requests are directed.

The proxy server can detect new or changed data at a monitored content source and transmits a message to the mobile device notifying it of such a change such that the mobile device (or the local proxy on the mobile device) can take appropriate action (e.g., to invalidate the cache elements in the local cache). In some instances, the proxy server (e.g., the caching policy manager 355) upon detecting new or changed data can also store the new or changed data in its cache (e.g., the server cache 135 or 335 of the examples of FIG. 1B and FIG. 3A, respectively). The new/updated data stored in the server cache 335 can be used in some instances to satisfy content requests at the mobile device; for example, it can be used after the proxy server has notified the mobile device of the new/changed content and that the locally cached content has been invalidated.

The metadata generator 303, similar to the metadata generator 203 shown in the example of FIG. 2B, can generate metadata for responses cached for requests at the mobile device 250. The metadata generator 303 can generate metadata for cache entries stored in the server cache 335. Similarly, the cache look-up engine 305 can include the same or similar functions are those described for the cache look-up engine 205 shown in the example of FIG. 2B.

The response analyzer 361 can perform any or all of the functionalities related to analyzing responses received for requests generated at the mobile device 250 in the same or similar fashion to the response analyzer 246d of the local proxy shown in the example of FIG. 2B. Since the proxy server 325 is able to receive responses from the application server/content source 310 directed to the mobile device 250, the proxy server 325 (e.g., the response analyzer 361) can perform similar response analysis steps to determine cacheability, as described for the response analyzer of the local proxy. Examples of response analysis procedures are also described in conjunction with the flow charts shown in the examples of FIGS. 11-13. The responses can be analyzed in addition to or in lieu of the analysis that can be performed at the local proxy 275 on the mobile device 250.

Furthermore, the schedule update engine 358c can update the polling interval of a given application server/content host based on application request interval changes of the application at the mobile device 250 as described for the schedule update engine in the local proxy 275. The time adjustment engine 358d can set an initial time at which polls of the application server/content host is to begin to prevent the serving of out of date content once again before serving fresh content as described for the schedule update engine in the local proxy 275. Both the schedule updating and the time adjustment algorithms can be performed in conjunction with or in lieu of the similar processes performed at the local proxy 275 on the mobile device 250.

Figure 3C:
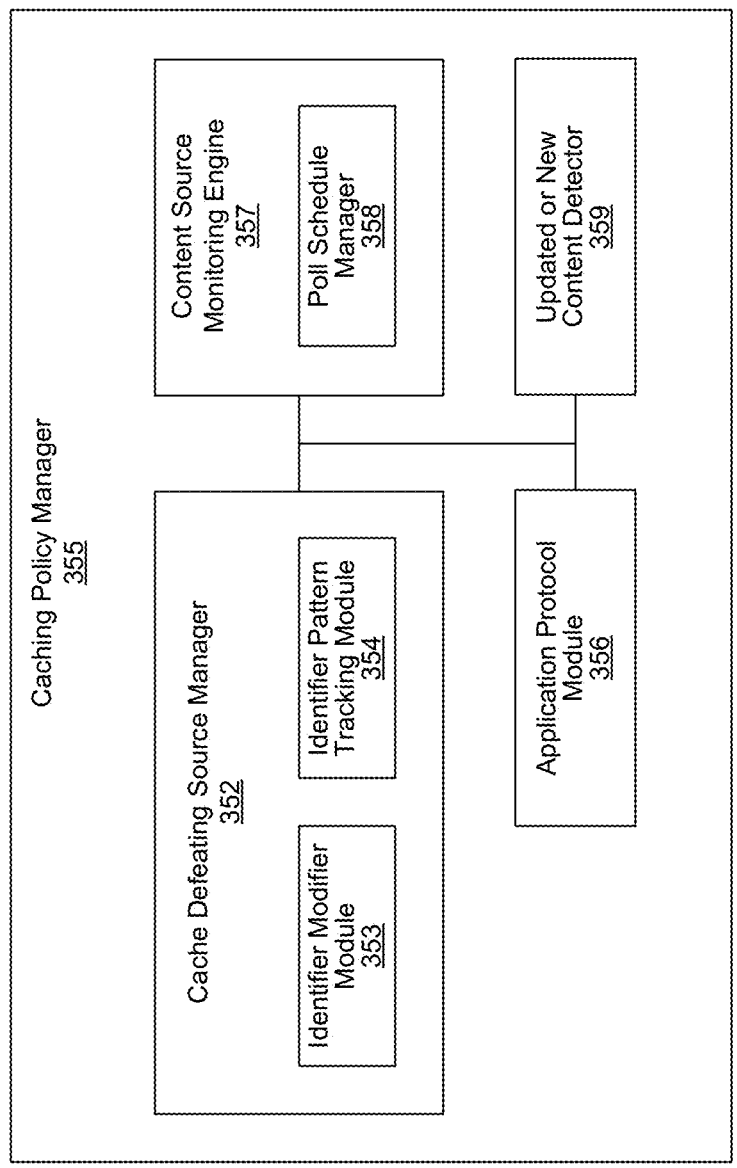
FIG. 3C depicts a block diagram illustrating another example of components in the proxy system shown in the example of FIG. 3A which is further capable of managing and detecting cache defeating mechanisms and monitoring content sources.

FIG. 3C depicts a block diagram illustrating another example of components in the caching policy manager 355 in the proxy server 375 on the server-side of the distributed proxy system shown in the example of FIG. 3A which is capable of managing and detecting cache defeating mechanisms and monitoring content sources.

The caching policy manager 355, in one embodiment, can further include a cache defeating source manager 352, a content source monitoring engine 357 having a poll schedule manager 358, and/or an updated or new content detector 359. The cache defeating source manager 352 can further include an identifier modifier module 353 and/or an identifier pattern tracking module 354.

In one embodiment, the proxy server (e.g., the proxy server 125 or 325 of the examples of FIG. 1B and FIG. 3A) can monitor a content source for new or changed data via the monitoring engine 357. The content source (e.g., application server/content provider 110 of FIG. 1B or 310 of FIG. 3A) can be one that has been identified to the proxy server (e.g., by the local proxy) as having content that is being locally cached on a mobile device (e.g., mobile device 150 or 250). The content source 310 can be monitored, for example, by the monitoring engine 357 at a frequency that is based on polling frequency of the content source at the mobile device. The poll schedule can be generated, for example, by the local proxy and sent to the proxy server 325. The poll frequency can be tracked and/or managed by the poll schedule manager 358.

In one embodiment, the proxy server 325 uses a normalized identifier or modified identifier in polling the content source 310 to detect new or changed data (responses). The normalized identifier or modified identifier can also be used by the proxy server 325 in storing responses on the server cache 335. In general, the normalized or modified identifiers can be used when cache defeat mechanisms are employed for cacheable content. Cache defeat mechanisms can be in the form of a changing parameter in an identifier such as a URI or URL and can include a changing time/data parameter, a randomly varying parameter, or other types parameters.

The normalized identifier or modified identifier removes or otherwise replaces the changing parameter for association with subsequent requests and identification of associated responses and can also be used to poll the content source. In one embodiment, the modified identifier is generated by the cache defeating source manager 352 (e.g., the identifier modifier module 353) of the caching policy manager 355 on the proxy server 325 (server-side component of the distributed proxy system). The modified identifier can utilize a substitute parameter (which is generally static over a period of time) in place of the changing parameter that is used to defeat cache.

The cache defeating source manager 352 optionally includes the identifier pattern tracking module 354 to track, store, and monitor the various modifications of an identifier or identifiers that address content for one or more content sources (e.g., application server/content host 110 or 310) to continuously verify that the modified identifiers and/or normalized identifiers used by the proxy server 325 to poll the content sources work as predicted or intended (e.g., receive the same responses or responses that are otherwise still relevant compared to the original, unmodified identifier).

In the event that the pattern tracking module 354 detects a modification or normalization of an identifier that causes erratic or unpredictable behavior (e.g., unexpected responses to be sent) on the content source, the tracking module 354 can log the modification and instruct the cache defeating source manager 352 to generate another modification/normalization, or notify the local proxy (e.g., local proxy 275) to generate another modification/normalization for use in polling the content source. In the alternative or in parallel, the requests from the given mobile application/client on the mobile device (e.g., mobile device 250) can temporarily be sent across the network to the content source for direct responses to be provided to the mobile device and/or until a modification of an identifier which works can be generated.

In one embodiment, responses are stored as server cache elements in the server cache when new or changed data is detected for a response that is already stored on a local cache (e.g., cache 285) of the mobile device (e.g., mobile device 250). Therefore, the mobile device or local proxy 275 can connect to the proxy server 325 to retrieve the new or changed data for a response to a request which was previously cached locally in the local cache 285 (now invalid, out-dated, or otherwise determined to be irrelevant).

The proxy server 325 can detect new or changed data at a monitored application server/content host 310 and transmits a message to the mobile device notifying it of such a change such that the mobile device (or the local proxy on the mobile device) can take appropriate action (e.g., to invalidate the cache elements in the local cache). In some instances, the proxy server (e.g., the caching policy manager 355), upon detecting new or changed data, can also store the new or changed data in its cache (e.g., the server cache 135 or 335 of the examples of FIG. 1B and FIG. 3A, respectively). The updated/new data stored in the server cache can be used, in some instances, to satisfy content requests at the mobile device; for example, it can be used after the proxy server has notified the mobile device of the new/changed content and that the locally cached content has been invalidated.

Figure 3D:
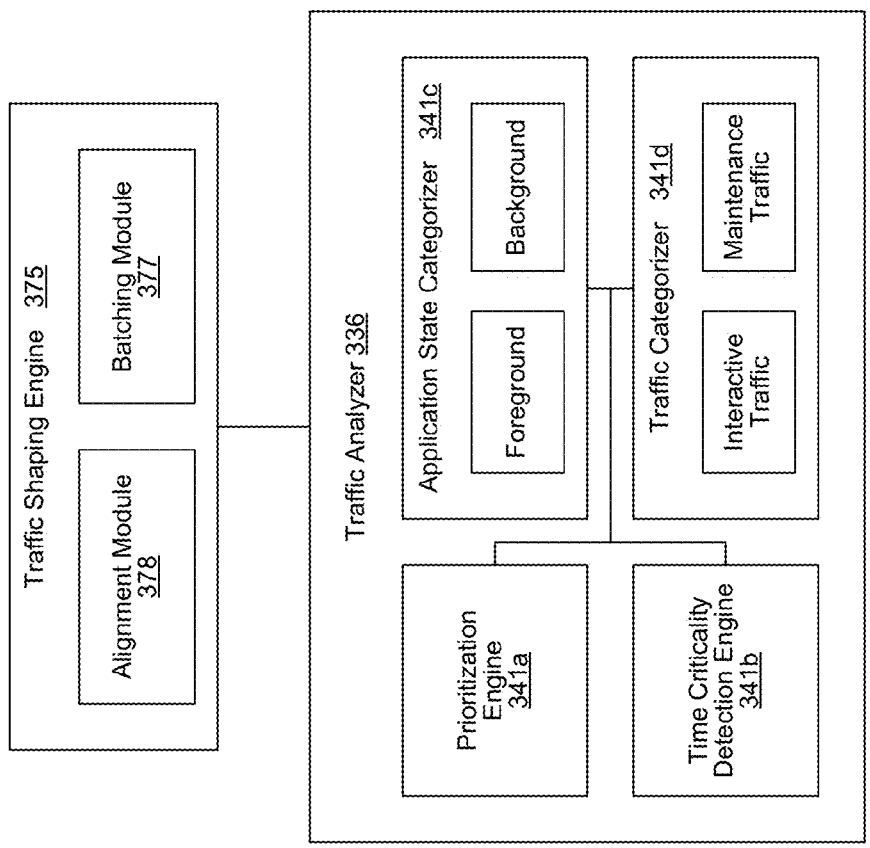
FIG. 3D depicts a block diagram illustrating examples of additional components in proxy server shown in the example of FIG. 3A which is further capable of performing mobile traffic categorization and policy implementation based on application behavior and/or traffic priority.

FIG. 3D depicts a block diagram illustrating examples of additional components in proxy server 325 shown in the example of FIG. 3A which is further capable of performing mobile traffic categorization and policy implementation based on application behavior and/or traffic priority.

In one embodiment of the proxy server 325, the traffic shaping engine 375 is further coupled to a traffic analyzer 336 for categorizing mobile traffic for policy definition and implementation for mobile traffic and transactions directed to one or more mobile devices (e.g., mobile device 250 of FIGS. 2A-2D) or to an application server/content host (e.g., 110 of FIGS. 1A-1B). In general, the proxy server 325 is remote from the mobile devices and remote from the host server, as shown in the examples of FIGS. 1A-1B. The proxy server 325 or the host server 300 can monitor the traffic for multiple mobile devices and is capable of categorizing traffic and devising traffic policies for different mobile devices.

In addition, the proxy server 325 or host server 300 can operate with multiple carriers or network operators and can implement carrier-specific policies relating to categorization of traffic and implementation of traffic policies for the various categories. For example, the traffic analyzer 336 of the proxy server 325 or host server 300 can include one or more of, a prioritization engine 341a, a time criticality detection engine 341b, an application state categorizer 341c, and/or an application traffic categorizer 341d.

Each of these engines or modules can track different criterion for what is considered priority, time critical, background/foreground, or interactive/maintenance based on different wireless carriers. Different criterion may also exist for different mobile device types (e.g., device model, manufacturer, operating system, etc.). In some instances, the user of the mobile devices can adjust the settings or criterion regarding traffic category and the proxy server 325 is able to track and implement these user adjusted/configured settings.

In one embodiment, the traffic analyzer 336 is able to detect, determined, identify, or infer, the activity state of an application on one or more mobile devices (e.g., mobile device 150 or 250) which traffic has originated from or is directed to, for example, via the application state categorizer 341c and/or the traffic categorizer 341d. The activity state can be determined based on whether the application is in a foreground or background state on one or more of the mobile devices (via the application state categorizer 341c) since the traffic for a foreground application vs. a background application may be handled differently to optimize network use.

In the alternate or in combination, the activity state of an application can be determined by the wirelessly connected mobile devices (e.g., via the application behavior detectors in the local proxies) and communicated to the proxy server 325. For example, the activity state can be determined, detected, identified, or inferred with a level of certainty of heuristics, based on the backlight status at mobile devices (e.g., by a backlight detector) or other software agents or hardware sensors on the mobile device, including but not limited to, resistive sensors, capacitive sensors, ambient light sensors, motion sensors, touch sensors, etc. In general, if the backlight is on, the traffic can be treated as being or determined to be generated from an application that is active or in the foreground, or the traffic is interactive. In addition, if the backlight is on, the traffic can be treated as being or determined to be traffic from user interaction or user activity, or traffic containing data that the user is expecting within some time frame.

The activity state can be determined from assessing, determining, evaluating, inferring, identifying user activity at the mobile device 250 (e.g., via the user activity module 215) and communicated to the proxy server 325. In one embodiment, the activity state is determined based on whether the traffic is interactive traffic or maintenance traffic. Interactive traffic can include transactions from responses and requests generated directly from user activity/interaction with an application and can include content or data that a user is waiting or expecting to receive. Maintenance traffic may be used to support the functionality of an application which is not directly detected by a user. Maintenance traffic can also include actions or transactions that may take place in response to a user action, but the user is not actively waiting for or expecting a response.

The time criticality detection engine 341b can generally determine, identify, infer the time sensitivity of data contained in traffic sent from the mobile device 250 or to the mobile device from the host server 300 or proxy server 325, or the application server (e.g., app server/content source 110). For example, time sensitive data can include, status updates, stock information updates, IM presence information, email messages or other messages, actions generated from mobile gaming applications, webpage requests, location updates, etc.

Data that is not time sensitive or time critical, by nature of the content or request, can include requests to delete messages, mark-as-read or edited actions, application-specific actions such as a add-friend or delete-friend request, certain types of messages, or other information which does not frequently changing by nature, etc. In some instances when the data is not time critical, the timing with which to allow the traffic to be sent to a mobile device is based on when there is additional data that needs to the sent to the same mobile device. For example, traffic shaping engine 375 can align the traffic with one or more subsequent transactions to be sent together in a single power-on event of the mobile device radio (e.g., using the alignment module 378 and/or the batching module 377). The alignment module 378 can also align polling requests occurring close in time directed to the same host server, since these request are likely to be responded to with the same data.

In general, whether new or changed data is sent from a host server to a mobile device can be determined based on whether an application on the mobile device to which the new or changed data is relevant, is running in a foreground (e.g., by the application state categorizer 341c), or the priority or time criticality of the new or changed data. The proxy server 325 can send the new or changed data to the mobile device if the application is in the foreground on the mobile device, or if the application is in the foreground and in an active state interacting with a user on the mobile device, and/or whether a user is waiting for a response that would be provided in the new or changed data. The proxy server 325 (or traffic shaping engine 375) can send the new or changed data that is of a high priority or is time critical.

Similarly, the proxy server 325 (or the traffic shaping engine 375) can suppressing the sending of the new or changed data if the application is in the background on the mobile device. The proxy server 325 can also suppress the sending of the new or changed data if the user is not waiting for the response provided in the new or changed data; wherein the suppressing is performed by a proxy server coupled to the host server and able to wirelessly connect to the mobile device.

In general, if data, including new or change data is of a low priority or is not time critical, the proxy server can waiting to transfer the data until after a time period, or until there is additional data to be sent (e.g. via the alignment module 378 and/or the batching module 377).

Figure 4A:
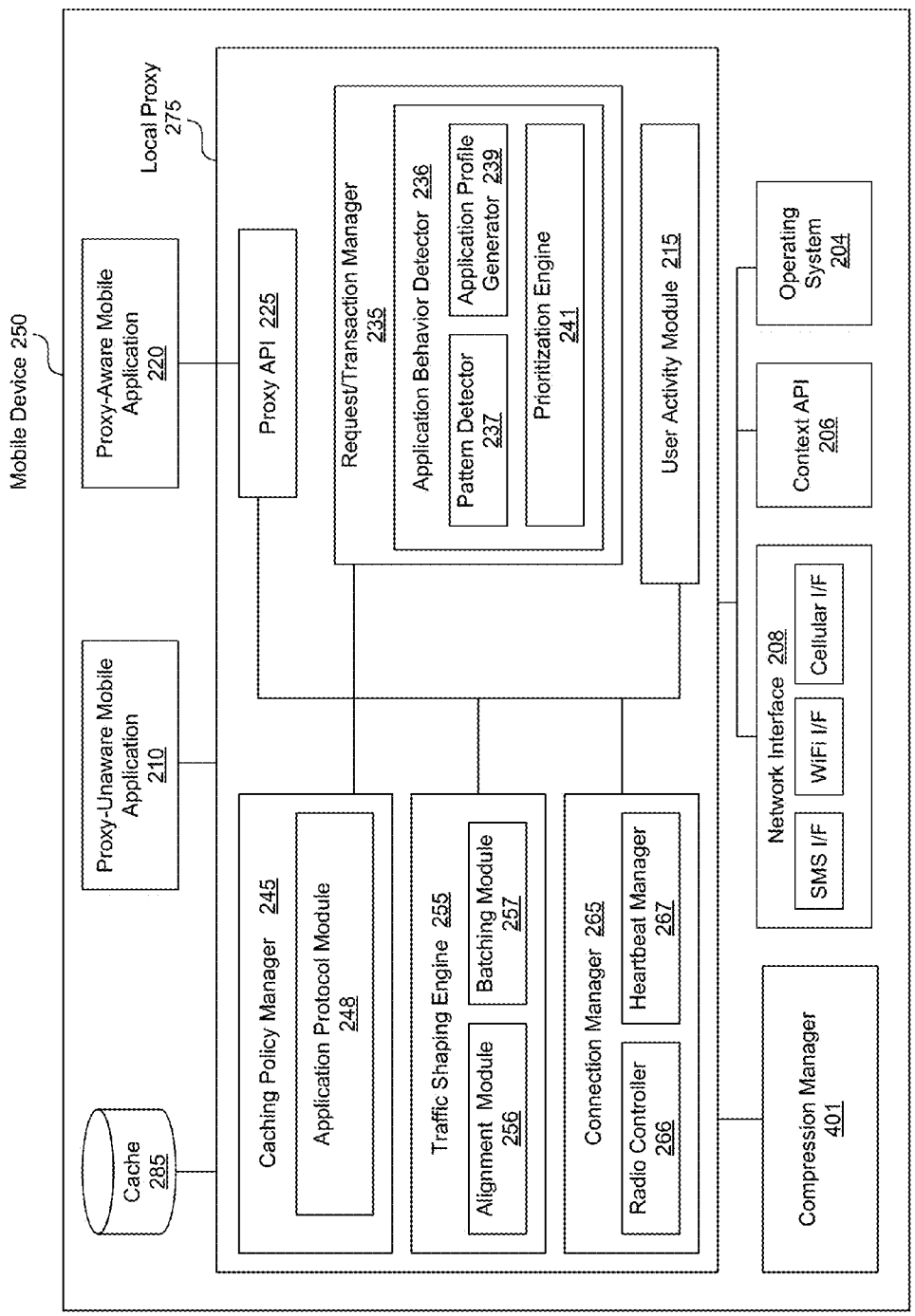
FIG. 4A depicts a block diagram illustrating another example of client-side components in a distributed proxy and cache system, further including a compression manager.
Figure 4B:
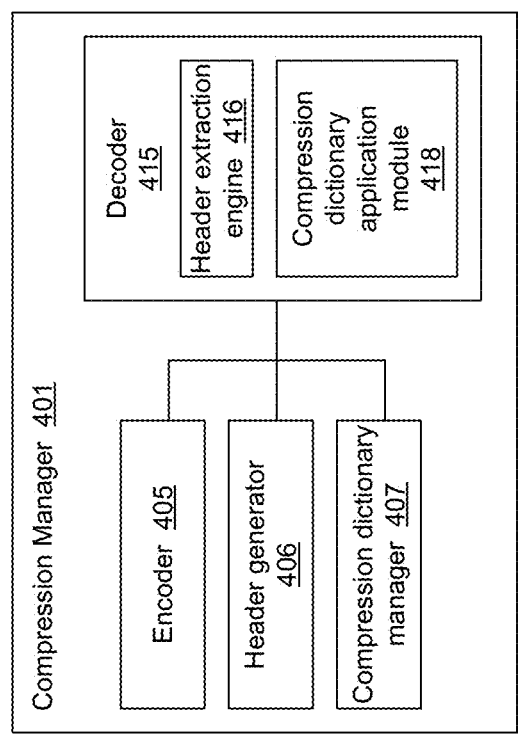
FIG. 4B depicts a block diagram illustrating additional components in the compression manager shown in the example of FIG. 4A.

FIG. 4A depicts a block diagram illustrating another example of client-side components in a distributed proxy and cache system, further including a compression manager 401. FIG. 4B depicts a block diagram illustrating additional components in the compression manager 401 shown in the example of FIG. 4A.

In one embodiment, the local proxy 275 of FIG. 4A includes the compression manager 401 having an encoder 405, a header generator 406, a compression dictionary manager 407, and/or a decoder 415 having a header extraction engine 416 and/or a compression dictionary application module 418. Additional or less components/modules/engines can be included in the compression manager 401 and each illustrated component.

Figure 23:
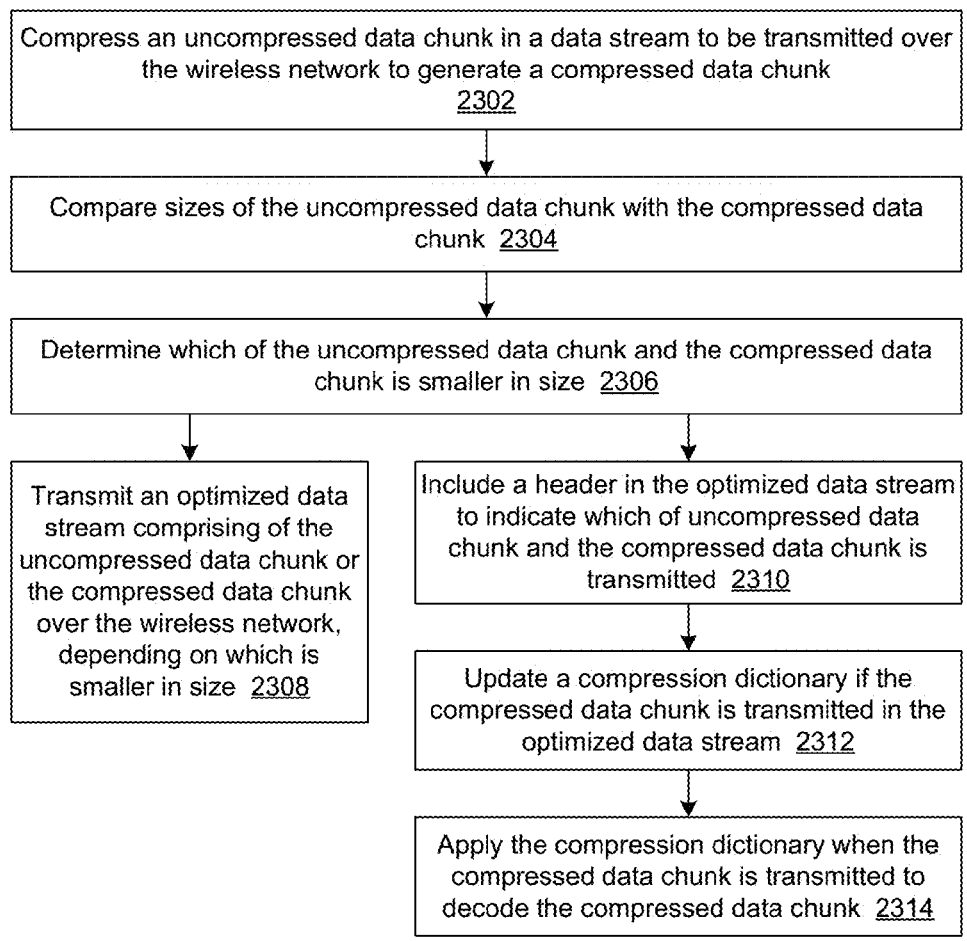
FIG. 23 depicts a flow chart illustrating an example process for enhancing resource management in a wireless network through selective data compression to reduce mobile data traffic and signaling traffic.

As described in the process of FIG. 23, the compression manager 401 can compress a data stream to be transmitted to a recipient (e.g., proxy server 325). Since most of the information on the Internet is in "chunks" (e.g. a continuous stream of discretely sized items), a data stream can also be compressed in individual chunks. This enables each data chunk to be pre-compressed (e.g., by the encoder 405) and compared with the uncompressed version to determine whether the compression made the content smaller in size. The compression manager 401 can transmit the smaller of the compressed and uncompressed version of each data chunk in a data stream. This can ensure that the smallest version of a given data chunk, compressed or not is the one that is sent.

If the compressed version is transmitted, a header indicating such can be generated (e.g., by the header generator 406) and/or transmitted with the data chunk or data stream such that the receiver end can identify which portions or data chucks in a given data stream were compressed and which were not. Note that compressing each block changes the state of the dictionary or key used by the receiving end (e.g., proxy server 325 receives compressed data sent by the local proxy 275) to decode the data. As such, the compression dictionary can be updated (e.g., by the compression dictionary manager 407) when the compressed data chunk is smaller than the uncompressed version.

By indicating the state with the header (e.g., compressed or not) and applying the dictionary (e.g., by the application module 418) only when sending compressed content, this allows the receiver and the sender's compression dictionary to maintain synchronization across compressible and non-compressable chunks and eliminates the need to transmit the additional overhead with each chunk—this improves the overall compression ratios for small chunks of data. This strategy also prevents the dictionary from adapting to data with high entropy (even temporally) and allows self-tuning to compressible data, further enhancing the achievable compression ratio.

The decoder 415 decodes compressed data received from a sender (e.g., the proxy server 325). The decoder 415 can also parse a data stream of partially compressed data using the header extraction engine 416 to identify the data chunks that are compressed and the data chunks that were sent uncompressed. Using this identification and parsing of compressed and uncompressed data chunks, the compression dictionary application module 418 can be used to decode/decompress the compressed data chunks.

Figure 5A:
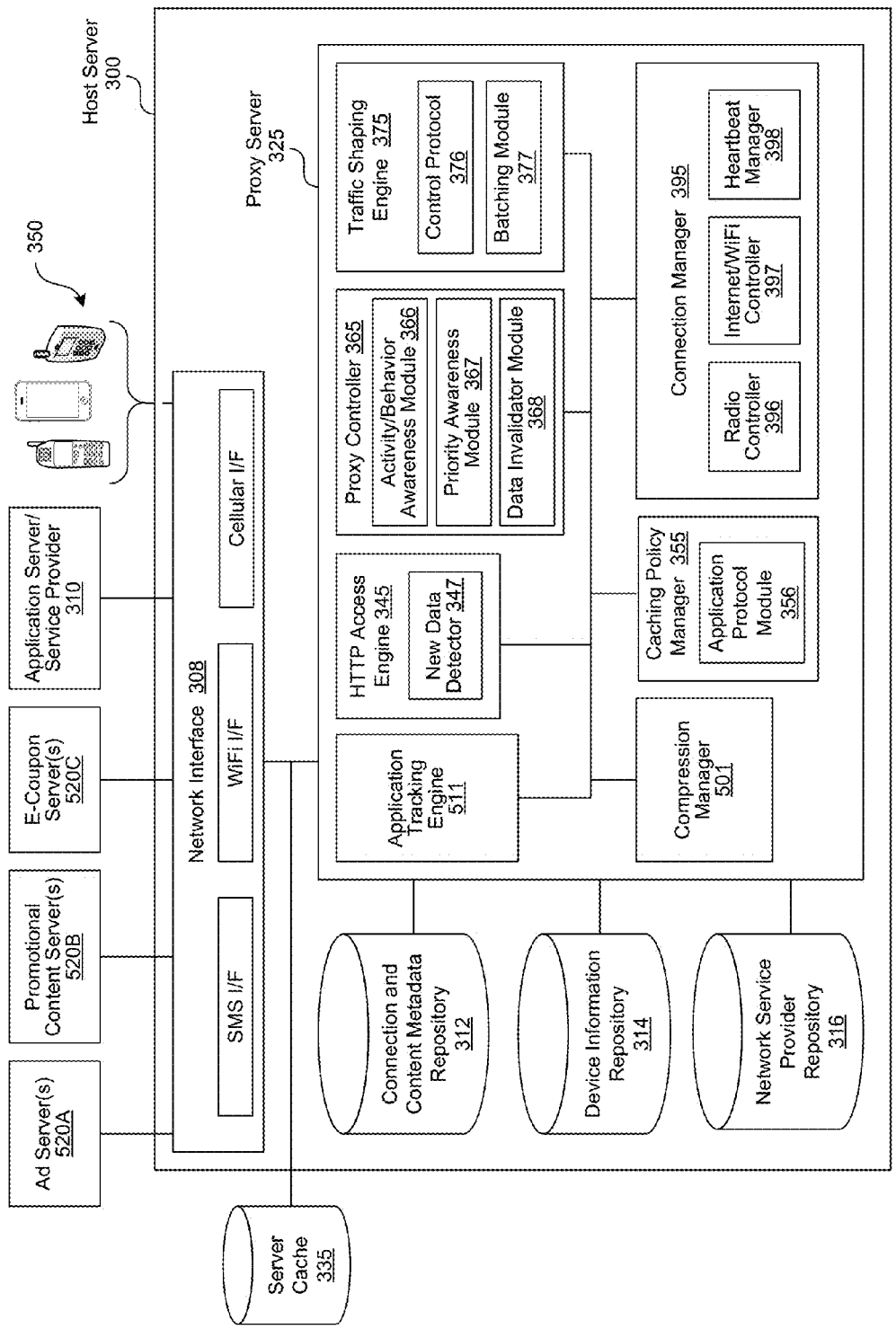
FIG. 5A depicts a block diagram illustrating an example of server-side components in a distributed proxy and cache system, further including a compression manager.
Figure 5B:
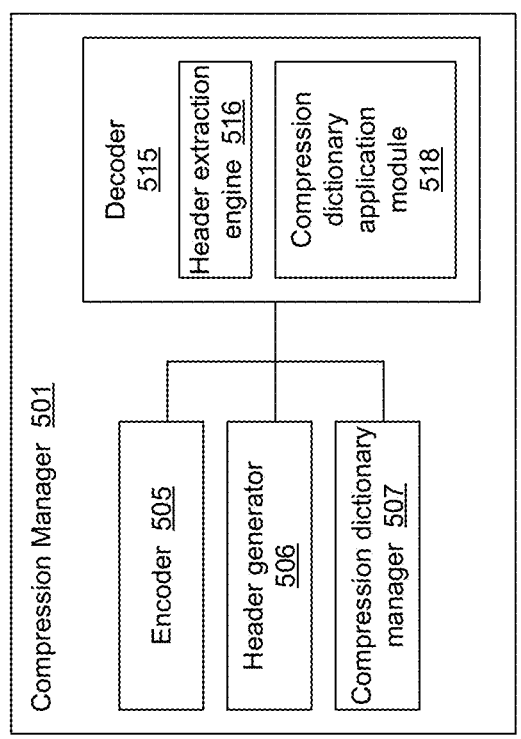
FIG. 5B depicts a block diagram illustrating additional components in the compression manager shown in the example of FIG. 5A.

Some or all of the above functions and features can be implemented wholly or partially on a server side (e.g., via the server side compression manager 501 as illustrated in FIG. 5A-FIG. 5B) and performed partially or wholly by the server-side components in the compression manager 501. The compression manager 401 on the client-side and compression manager 501 on the server-side both include encoder and decoder components since each includes send and receive functions.

FIG. 5A depicts a block diagram illustrating an example of server-side components in a distributed proxy and cache system, further including a compression manager 501. FIG. 5B depicts a block diagram illustrating additional components in the compression manager 501 shown in the example of FIG. 5A. In one embodiment, the proxy server 325 of FIG. 5A includes the compression manager 501 having an encoder 505, a header generator 506, a compression dictionary manager 507, and/or a decoder 515 having a header extraction engine 516 and/or a compression dictionary application module 518. Additional or less components/modules/engines can be included in the compression manager 501 and each illustrated component. Functionalities of each component are similarly described with respect to the same/similar components shown on the client-side compression manager 401 in the examples of FIG. 4A-FIG. 4B.

Figure 6A:
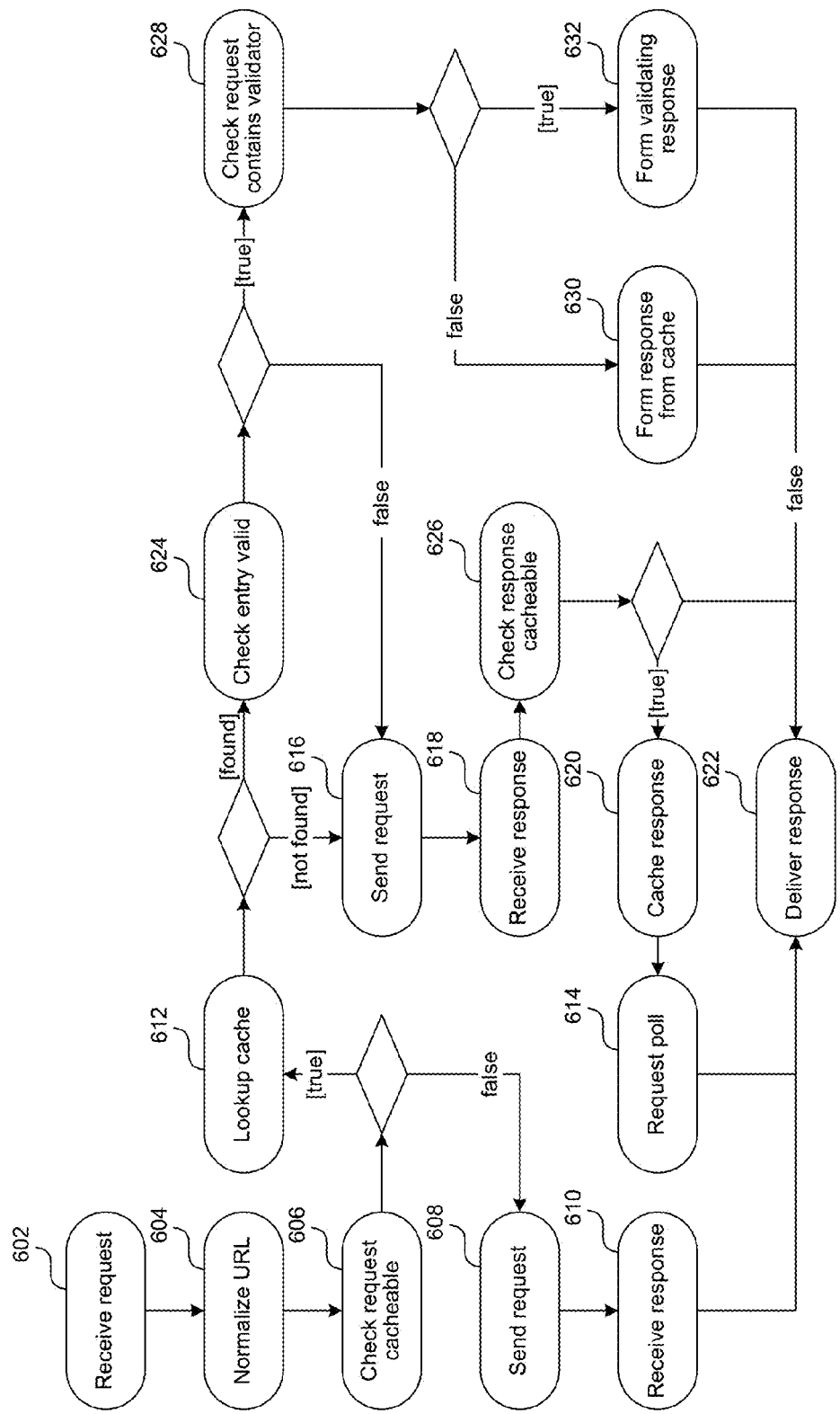
FIG. 6A depicts a flow diagram illustrating an example process for distributed content caching between a mobile device (e.g., any wireless device) and remote proxy and the distributed management of content caching.

FIG. 6A depicts another flow diagram illustrating an example process for distributed content caching between a mobile device and a proxy server and the distributed management of content caching.

As shown in the distributed system interaction diagram in the example of FIG. 4, the disclosed technology is a distributed caching model with various aspects of caching tasks split between the client-side/mobile device side (e.g., mobile device 450 in the example of FIG. 4) and the server side (e.g., server side 470 including the host server 485 and/or the optional caching proxy 475).

In general the device-side responsibilities can include deciding whether a response to a particular request can be and/or should be cached. The device-side of the proxy can make this decision based on information (e.g., timing characteristics, detected pattern, detected pattern with heuristics, indication of predictability or repeatability) collected from/ during both request and response and cache it (e.g., storing it in a local cache on the mobile device). The device side can also notify the server-side in the distributed cache system of the local cache event and notify it monitor the content source (e.g., application server/content provider 110 of FIGS. 1A-B).

The device side can further instruct the server side of the distributed proxy to periodically validate the cache response (e.g., by way of polling, or sending polling requests to the content source). The device side can further decide whether a response to a particular cache request should be returned from the local cache (e.g., whether a cache hit is detected). The decision can be made by the device side (e.g., the local proxy on the device) using information collected from/ during request and/or responses received from the content source.

In general, the server-side responsibilities can include validating cached responses for relevancy (e.g., determine whether a cached response is still valid or relevant to its associated request). The server-side can send the mobile device an invalidation request to notify the device side when a cached response is detected to be no longer valid or no longer relevant (e.g., the server invalidates a given content source). The device side then can remove the response from the local cache.

The diagram of FIG. 6A illustrates caching logic processes performed for each detected or intercepted request (e.g., HTTP request) detected at a mobile device (e.g., client-side of the distributed proxy). In step 602, the client-side of the proxy (e.g., local proxy 275 shown in FIGS. 2A-B or mobile device 450 of FIG. 4) receives a request (from an application (e.g., mobile application) or mobile client). In step 604, URL is normalized and in step 606 the client-side checks to determine if the request is cacheable. If the request is determined to be not cacheable in step 612, the request is sent to the source (application server/content provider) in step 608 and the response is received 610 and delivered to the requesting application 622, similar to a request-response sequence without interception by the client side proxy.

If the request is determined to be cacheable, in step 612, the client-side looks up the cache to determine whether a cache entry exists for the current request. If so, in step 624, the client-side can determine whether the entry is valid and if so, the client side can check the request to see if includes a validator (e.g., a modified header or an entity tag) in step 615. For example, the concept of validation is eluded to in section 13.3 of RFC 2616 which describes in possible types of headers (e.g., eTAG, Modified_Since, must_revlaidate, pragma no_cache) and forms a validating response 632 if so to be delivered to the requesting application in step 622. If the request does not include a validator as determined by step 615, a response is formed from the local cache in step 630 and delivered to the requesting application in step 622. This validation step can be used for content that would otherwise normally be considered un-cacheable.

If, instead, in step 624, the cache entry is found but determined to be no longer valid or invalid, the client side of the proxy sends the request 616 to the content source (application server/content host) and receives a response directly fro the source in step 618. Similarly, if in step 612, a cache entry was not found during the look up, the request is also sent in step 616. Once the response is received, the client side checks the response to determine if it is cacheable in step 626. If so, the response is cached in step 620. The client then sends another poll in step 614 and then delivers the response to the requesting application in step 622.

Figure 6B:
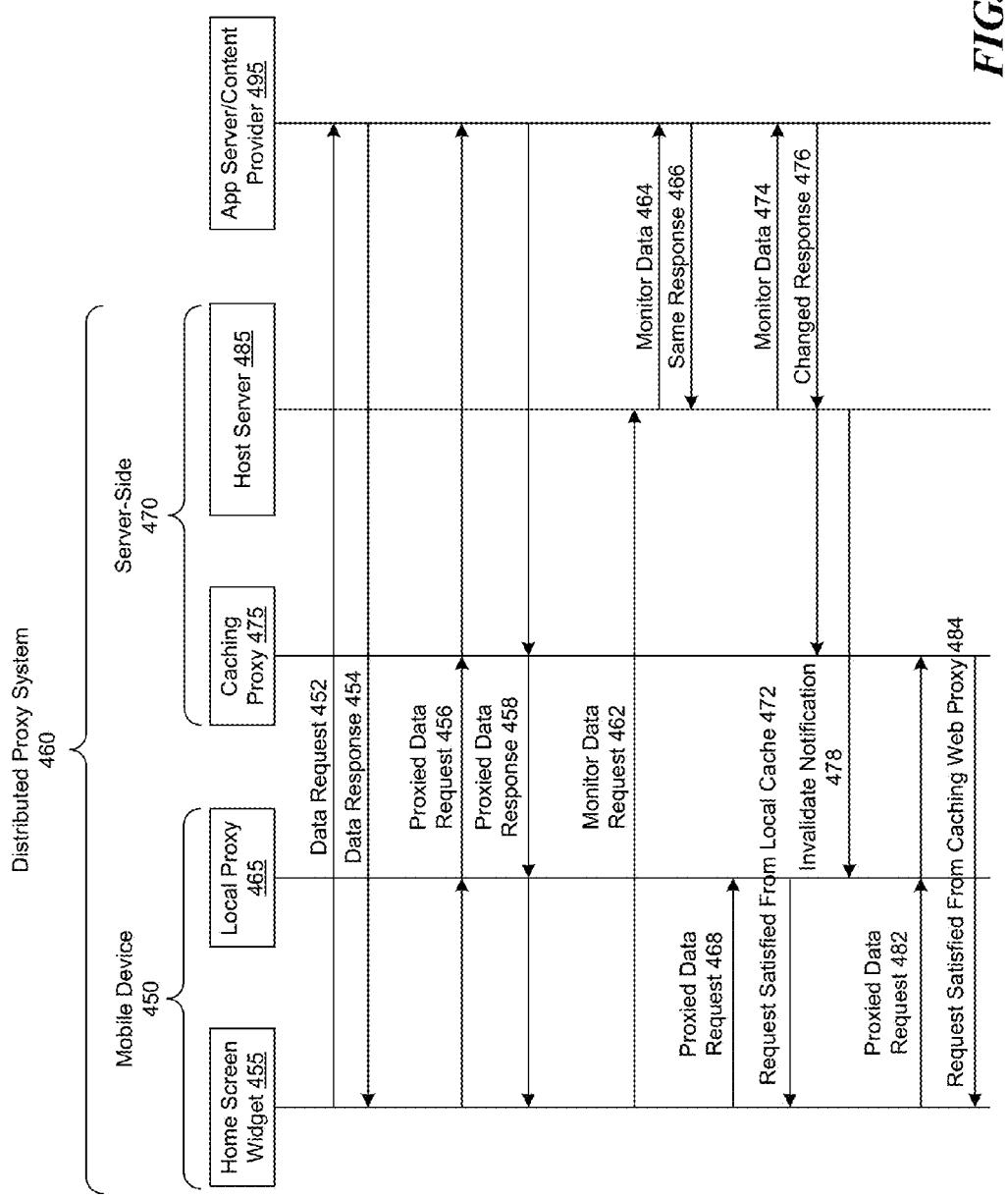
FIG. 6B depicts a timing diagram showing how data requests from a mobile device (e.g., any wireless device) to an application server/content provider in a wireless network (or broadband network) can be coordinated by a distributed proxy system in a manner such that network and battery resources are conserved through using content caching and monitoring performed by the distributed proxy system.

FIG. 6B depicts a diagram showing how data requests from a mobile device 450 to an application server/content provider 495 in a wireless network can be coordinated by a distributed proxy system 460 in a manner such that network and battery resources are conserved through using content caching and monitoring performed by the distributed proxy system 460.

In satisfying application or client requests on a mobile device 450 without the distributed proxy system 460, the mobile device 450, or the software widget executing on the device 450, performs a data request 452 (e.g., an HTTP GET, POST, or other request) directly to the application server 495 and receives a response 404 directly from the server/provider 495. If the data has been updated, the widget 455 on the mobile device 450 can refreshes itself to reflect the update and waits for small period of time and initiates another data request to the server/provider 495.

In one embodiment, the requesting client or software widget 455 on the device 450 can utilize the distributed proxy system 460 in handling the data request made to server/provider 495. In general, the distributed proxy system 460 can include a local proxy 465 (which is typically considered a client-side component of the system 460 and can reside on the mobile device 450), a caching proxy 475 (considered a server-side component 470 of the system 460 and can reside on the host server 485 or be wholly or partially external to the host server 485), and a host server 485. The local proxy 465 can be connected to the caching proxy 475 and host server 485 via any network or combination of networks.

When the distributed proxy system 460 is used for data/ application requests, the widget 455 can perform the data request 456 via the local proxy 465. The local proxy 465, can intercept the requests made by device applications, and can identify the connection type of the request (e.g., an HTTP get request or other types of requests). The local proxy 465 can then query the local cache for any previous information about the request (e.g., to determine whether a locally stored response is available and/or still valid). If a locally stored response is not available or if there is an invalid response stored, the local proxy 465 can update or store information about the request, the time it was made, and any additional data, in the local cache. The information can be updated for use in potentially satisfying subsequent requests.

The local proxy 465 can then send the request to the host server 485 and the host server 485 can perform the request 456 and returns the results in response 458. The local proxy 465 can store the result and, in addition, information about the result and returns the result to the requesting widget 455.

In one embodiment, if the same request has occurred multiple times (within a certain time period) and it has often yielded same results, the local proxy 465 can notify 460 the server 485 that the request should be monitored (e.g., steps 462 and 464) for result changes prior to returning a result to the local proxy 465 or requesting widget 455.

In one embodiment, if a request is marked for monitoring, the local proxy 465 can now store the results into the local cache. Now, when the data request 466, for which a locally response is available, is made by the widget 455 and intercepted at the local proxy 465, the local proxy 465 can return the response 468 from the local cache without needing to establish a connection communication over the wireless network.

In addition, the server proxy performs the requests marked for monitoring 470 to determine whether the response 472 for the given request has changed. In general, the host server 485 can perform this monitoring independently of the widget 455 or local proxy 465 operations. Whenever an unexpected response 472 is received for a request, the server 485 can notify the local proxy 465 that the response has changed (e.g., the invalidate notification in step 474) and that the locally stored response on the client should be erased or replaced with a new response.

In this case, a subsequent data request 476 by the widget 455 from the device 450 results in the data being returned from host server 485 (e.g., via the caching proxy 475), and in step 478, the request is satisfied from the caching proxy 475. Thus, through utilizing the distributed proxy system 460, the wireless (cellular) network is intelligently used when the content/data for the widget or software application 455 on the mobile device 450 has actually changed. As such, the traffic needed to check for the changes to application data is not performed over the wireless (cellular) network. This reduces the amount of generated network traffic and shortens the total time and the number of times the radio module is powered up on the mobile device 450, thus reducing battery consumption and, in addition, frees up network bandwidth.

FIG. 7 depicts a table 700 showing examples of different traffic or application category types which can be used in implementing network access and content delivery policies. For example, traffic/application categories can include interactive or background, whether a user is waiting for the response, foreground/background application, and whether the backlight is on or off.

FIG. 8 depicts a table 800 showing examples of different content category types which can be used in implementing network access and content delivery policies. For example, content category types can include content of high or low priority, and time critical or non-time critical content/data.

FIG. 9 depicts an interaction diagram showing how application (e.g., mobile application) 955 polls having data requests from a mobile device to an application server/content provider 995 over a wireless network can be can be cached on the local proxy 965 and managed by the distributed caching system (including local proxy 965 and the host server 985 (having server cache 935 or caching proxy server 975)).

In one example, when the mobile application/widget 955 polls an application server/provider 932, the poll can locally be intercepted 934 on the mobile device by local proxy 965. The local proxy 965 can detect that the cached content is available for the polled content in the request and can thus retrieve a response from the local cache to satisfy the intercepted poll 936 without requiring use of wireless network bandwidth or other wireless network resources. The mobile application/widget 955 can subsequently receive a response to the poll from a cache entry 938.

In another example, the mobile application widget 955 polls the application server/provider 940. The poll is intercepted 942 by the local proxy 965 and detects that cache content is unavailable in the local cache and decides to set up the polled source for caching 944. To satisfy the request, the poll is forwarded to the content source 946. The application server/provider 995 receives the poll request from the application and provides a response to satisfy the current request 948. In 950, the application (e.g., mobile application)/widget 955 receives the response from the application server/provider to satisfy the request.

In conjunction, in order to set up content caching, the local proxy 965 tracks the polling frequency of the application and can set up a polling schedule to be sent to the host server 952. The local proxy sends the cache set up to the host server 954. The host server 985 can use the cache set up which includes, for example, an identification of the application server/provider to be polled and optionally a polling schedule 956. The host server 985 can now poll the application server/provider 995 to monitor responses to the request 958 on behalf of the mobile device. The application server receives the poll from the host server and responds 960. The host server 985 determines that the same response has been received and polls the application server 995 according to the specified polling schedule 962. The application server/content provider 995 receives the poll and responds accordingly 964.

The host server 985 detects changed or new responses and notifies the local proxy 965. The host server 985 can additional store the changed or new response in the server cache or caching proxy 968. The local proxy 965 receives notification from the host server 985 that new or changed data is now available and can invalidate the affected cache entries 970. The next time the application (e.g., mobile application)/widget 955 generates the same request for the same server/content provider 972, the local proxy determines that no valid cache entry is available and instead retrieves a response from the server cache 974, for example, through an HTTP connection. The host server 985 receives the request for the new response and sends the response back 976 to the local proxy 965. The request is thus satisfied from the server cache or caching proxy 978 without the need for the mobile device to utilize its radio or to consume mobile network bandwidth thus conserving network resources.

Alternatively, when the application (e.g., mobile application) generates the same request in step 980, the local proxy 965, in response to determining that no valid cache entry is available, forwards the poll to the application server/provider in step 982 over the mobile network. The application server/provider 995 receives the poll and sends the response back to the mobile device in step 984 over the mobile network. The request is thus satisfied from the server/provider using the mobile network in step 986.

FIG. 10 depicts an interaction diagram showing how application 1055 polls for content from an application server/content provider 1095 which employs cache-defeating mechanisms in content identifiers (e.g., identifiers intended to defeat caching) over a wireless network can still be detected and locally cached.

In one example, when the application (e.g., mobile application)/widget 1055 polls an application server/provider in step 1032, the poll can locally be intercepted in step 1034 on the mobile device by local proxy 1065. In step 1034, the local proxy 1065 on the mobile device may also determine (with some level of certainty and heuristics) that a cache defeating mechanism is employed or may be employed by the server provider.

The local proxy 1065 can detect that the cached content is available for the polled content in the request and can thus retrieve a response from the local cache to satisfy the intercepted poll 1036 without requiring use of wireless network bandwidth or other wireless network resources. The application (e.g., mobile application)/widget 1055 can subsequently receive a response to the poll from a cache entry in step 1038 (e.g., a locally stored cache entry on the mobile device).

In another example, the application (e.g., mobile application) widget 1055 polls the application server/provider 1095 in step 1040. The poll is intercepted in step 1042 by the local proxy 1065 which determines that a cache defeat mechanism is employed by the server/provider 1095. The local proxy 1065 also detects that cached content is unavailable in the local cache for this request and decides to setup the polled content source for caching in step 1044. The local proxy 1065 can then extract a pattern (e.g., a format or syntax) of an identifier of the request and track the polling frequency of the application to setup a polling schedule of the host server 1085 in step 1046.

To satisfy the request, the poll request is forwarded to the content provider 1095 in step 1048. The application server/provider 1095 receives the poll request from the application and provides a response to satisfy the current request in step 1050. In step 1052, the application (e.g., mobile application)/widget 1055 receives the response from the application server/provider 1095 to satisfy the request.

In conjunction, in order to setup content caching, the local proxy 1065 caches the response and stores a normalized version of the identifier (or a hash value of the normalized identifier) in association with the received response for future identification and retrieval in step 1054. The local proxy sends the cache setup to the host server 1085 in step 1056. The cache setup includes, for example, the identifier and/or a normalized version of the identifier. In some instances, a modified identifier, different from the normalized identifier, is sent to the host server 1085.

The host server 1085 can use the cache setup, which includes, for example, an identification of the application server/provider to be polled and optionally a polling schedule in step 1058. The host server 1085 can now poll the application server/provider 1095 to monitor responses to the request in step 1060 on behalf of the mobile device. The application server 1095 receives the poll from the host server 1085 responds in step 1062. The host server 1085 determines that the same response has been received and polls the application server 1095, for example, according to the specified polling schedule and using the normalized or modified identifier in step 1064. The application server/content provider 1095 receives the poll and responds accordingly in step 1066.

This time, the host server 1085 detects changed or new responses and notifies the local proxy 1065 in step 1068. The host server 1085 can additionally store the changed or new response in the server cache 1035 or caching proxy 1075 in step 1070. The local proxy 1065 receives notification from the host server 1085 that new or changed data is now available and can invalidate the affected cache entries in step 1072. The next time the application (e.g., mobile application)/widget generates the same request for the same server/content provider 1095 in step 1074, the local proxy 1065 determines that no valid cache entry is available and instead retrieves a response from the server cache in step 1076, for example, through an HTTP connection. The host server 1085 receives the request for the new response and sends the response back to the local proxy 1065 in step 1078. The request is thus satisfied from the server cache or caching proxy in step 1080 without the need for the mobile device to utilize its radio or to consume mobile network bandwidth thus conserving network resources.

Alternatively, when the application (e.g., mobile application) 1055 generates the same request, the local proxy 1065, in response to determining that no valid cache entry is available in step 1084, forwards the poll to the application server provider 1095 in step 1082 over the mobile network. The application server/provider 1095 receives the poll and sends the response back to the mobile device in step 1086 over the mobile network. The request is thus satisfied from the server/provider using the mobile network 1086 in step 1088.

Figure 11:
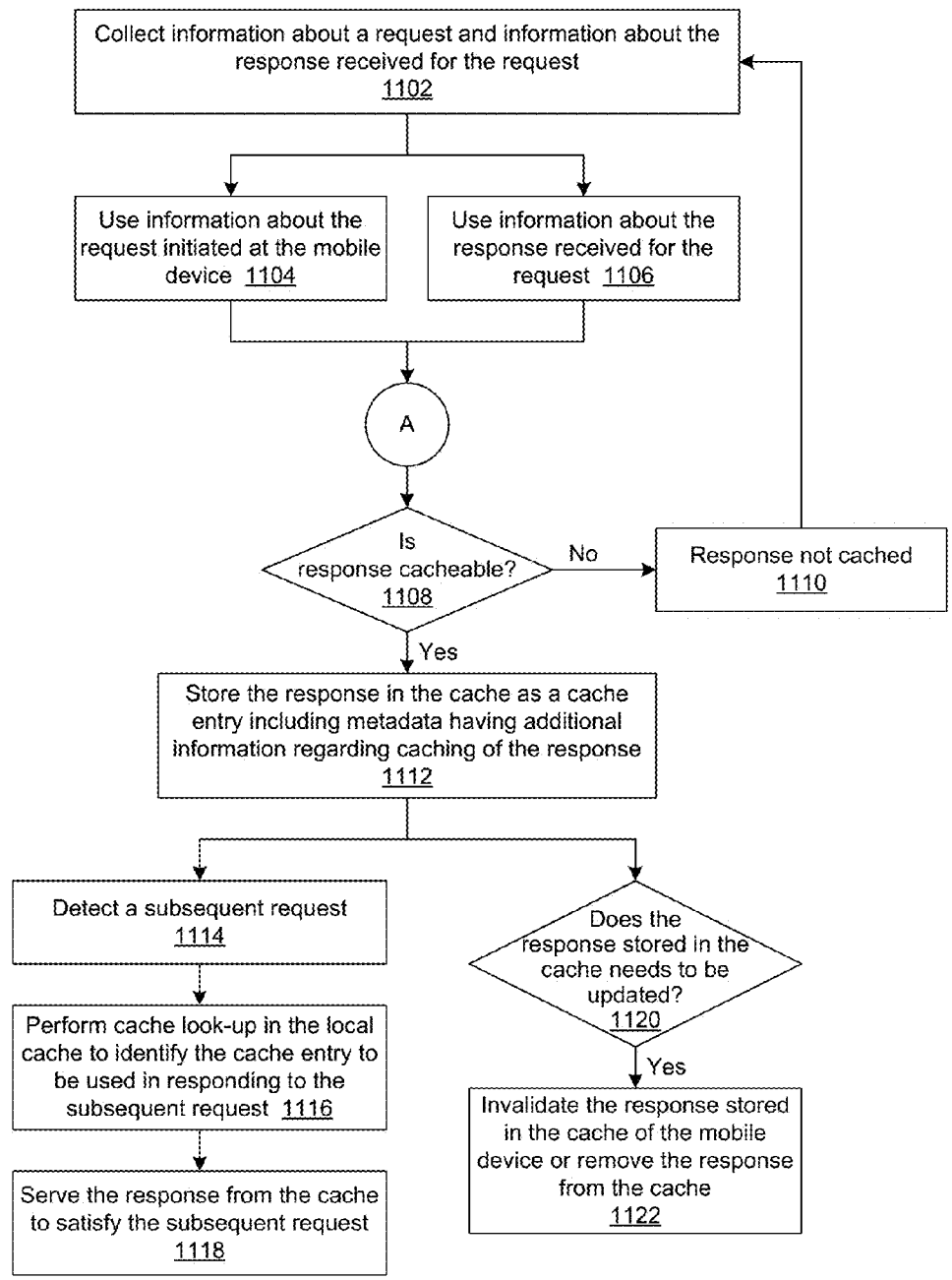
FIG. 11 depicts a flow chart illustrating an example process for collecting information about a request and the associated response to identify cacheability and caching the response.

FIG. 11 depicts a flow chart illustrating an example process for collecting information about a request and the associated response to identify cacheability and caching the response.

In process 1102, information about a request and information about the response received for the request is collected. In processes 1104 and 1106, information about the request initiated at the mobile device and information about the response received for the request are used in aggregate or independently to determine cacheability at step 1108. The details of the steps for using request and response information for assessing cacheability are illustrated at flow A as further described in the example of FIG. 12.

In step 1108, if based on flow A it is determined that the response is not cacheable, then the response is not cached in step 1110, and the flow can optionally restart at 1102 to collect information about a request or response to again assess cacheability.

In step 1108, if it is determined from flow A that the response is cacheable, then in 1112 the response can be stored in the cache as a cache entry including metadata having additional information regarding caching of the response. The cached entry, in addition to the response, includes metadata having additional information regarding caching of the response. The metadata can include timing data including, for example, access time of the cache entry or creation time of the cache entry.

After the response is stored in the cache, a parallel process can occur to determine whether the response stored in the cache needs to be updated in process 1120. If so, the response stored in the cache of the mobile device is invalided or removed from the cache of the mobile device, in process 1122. For example, relevance or validity of the response can be verified periodically by polling a host server to which the request is directed on behalf of the mobile device. The host server can be polled at a rate determined at the mobile device using request information collected for the request for which the response is cached. The rate is determined from averages of time intervals between previous requests generated by the same client which generated the request.

The verifying can be performed by an entity that is physically distinct from the mobile device. In one embodiment, the entity is a proxy server coupled to the mobile device and able to communicate wirelessly with the mobile device and the proxy server polls a host server to which the request is directed at the rate determined at the mobile device based on timing intervals between previous requests generated by the same client which generated the request.

In process 1114, a subsequent request for the same client or application is detected. In process 1116, cache look-up in the local cache is performed to identify the cache entry to be used in responding to the subsequent request. In one embodiment, the metadata is used to determine whether the response stored as the cached entry is used to satisfy the subsequent response. In process 1118, the response can be served from the cache to satisfy a subsequent request. The response can be served in response to identifying a matching cache entry for the subsequent request determined at least in part using the metadata.

Figure 12:
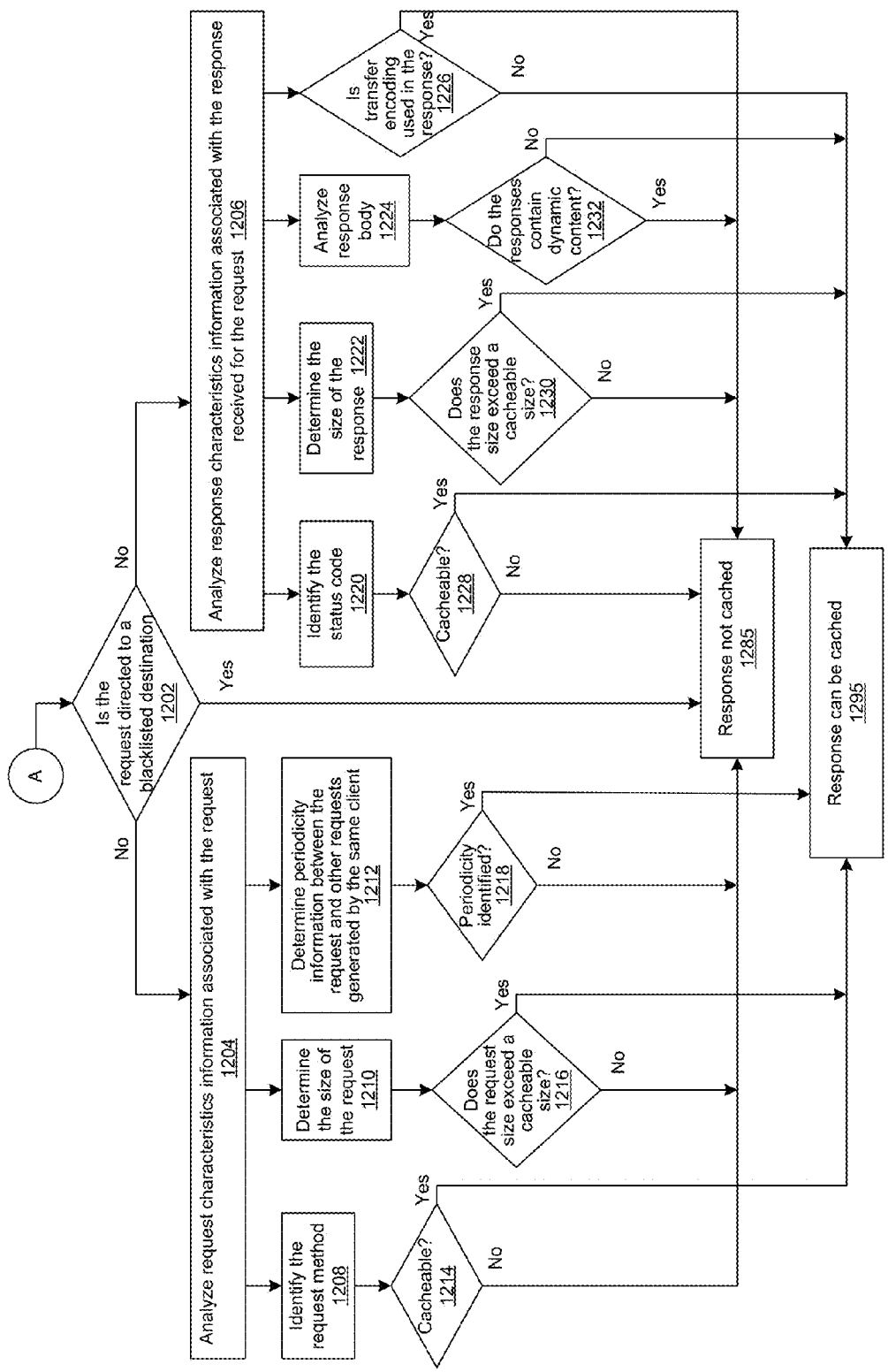
FIG. 12 depicts a flow chart illustrating an example process showing decision flows to determine whether a response to a request can be cached.

FIG. 12 depicts a flow chart illustrating an example process for a decision flow to determine whether a response to a request can be cached.

Process 1202 determines if the request is directed to a blacklisted destination. If so, the response is not cached, in step 1285. If a blacklisted destination is detected, or if the request itself is associated with a blacklisted application, the remainder of the analysis shown in the figure may not be performed. The process can continue to steps 1204 and 1206 if the request and its destination are not blacklisted.

In process 1204, request characteristics information associated with the request is analyzed. In analyzing the request, in process 1208, the request method is identified and in step 1214, it is determined whether the response can be cached based on the request method. If an uncacheable request is detected, the request is not cached and the process may terminate at process 1285. If the request method is determined to be cacheable, or not uncacheable, then the response can be identified as cacheable or potentially cacheable (e.g., cacheable but subject to the other tests and analysis shown in the figure) at step 1295.

In process 1210, the size of the request is determined. In process 1216, it is determined whether the request size exceeds a cacheable size. If so, the response is not cached and the analysis may terminate here at process 1285. If the request size does not exceed a cacheable size in step 1216, then the response can be identified as cacheable or potentially cacheable (e.g., cacheable but subject to the other tests and analysis shown in the figure) at step 1295.

In step 1212, the periodicity information between the request and other requests generated by the same client is determined. In step 1218, it is determined whether periodicity has been identified. If not, the response is not cached and the analysis may terminate here at process 1285. If so, then the response can be identified as cacheable or potentially cacheable (e.g., cacheable but subject to the other tests and analysis shown in the figure) at step 1295.

In process 1206, the request characteristics information associated with the response received for the request is analyzed.

In process 1220, the status code is identified and determined whether the status code indicates a cacheable response status code in process 1228. If an uncacheable status code is detected, the request is not cached and the process may terminate at process 1285. If the response status code indicates cacheability, or not uncacheable, then the response can be identified as cacheable or potentially cacheable (e.g., cacheable but subject to the other tests and analysis shown in the figure) at step 1295.

In process 1222, the size of the response is determined. In process 1230, it is determined whether the response size exceeds a cacheable size. If so, the response is not cached and the analysis may terminate here at process 1285. If the response size does not exceed a cacheable size in step 1230, then the response can be identified as cacheable or potentially cacheable (e.g., cacheable but subject to the other tests and analysis shown in the figure) at step 1295.

In process 1224, the response body is analyzed. In process 1232, it is determined whether the response contains dynamic content or highly dynamic content. Dynamic content includes data that changes with a high frequency and/or has a short time to live or short time of relevance due to the inherence nature of the data (e.g., stock quotes, sports scores of fast pace sporting events, etc.). If so, the response is not cached and the analysis may terminate here at process 1285. If not, then the response can be identified as cacheable or potentially cacheable (e.g., cacheable but subject to the other tests and analysis shown in the figure) at step 1295.

Process 1226 determines whether transfer encoding or chunked transfer encoding is used in the response. If so, the response is not cached and the analysis may terminate here at process 1285. If not, then the response can be identified as cacheable or potentially cacheable (e.g., cacheable but subject to the other tests and analysis shown in the figure) at step 1295.

Not all of the tests described above need to be performed to determined whether a response is cached. Additional tests not shown may also be performed. Note that any of the tests 1208, 1210, 1212, 1220, 1222, 1224, and 1226 can be performed, singly or in any combination to determine cacheability. In some instances, all of the above tests are performed. In some instances, all tests performed (any number of the above tests that are actually performed) need to confirm cacheability for the response to be determined to be cacheable. In other words, in some cases, if any one of the above tests indicate non-cacheability, the response is not cached, regardless of the results of the other tests. In other cases, different criteria can be used to determine which tests or how many tests need to pass for the system to decide to cache a given response, based on the combination of request characteristics and response characteristics.

Figure 13:
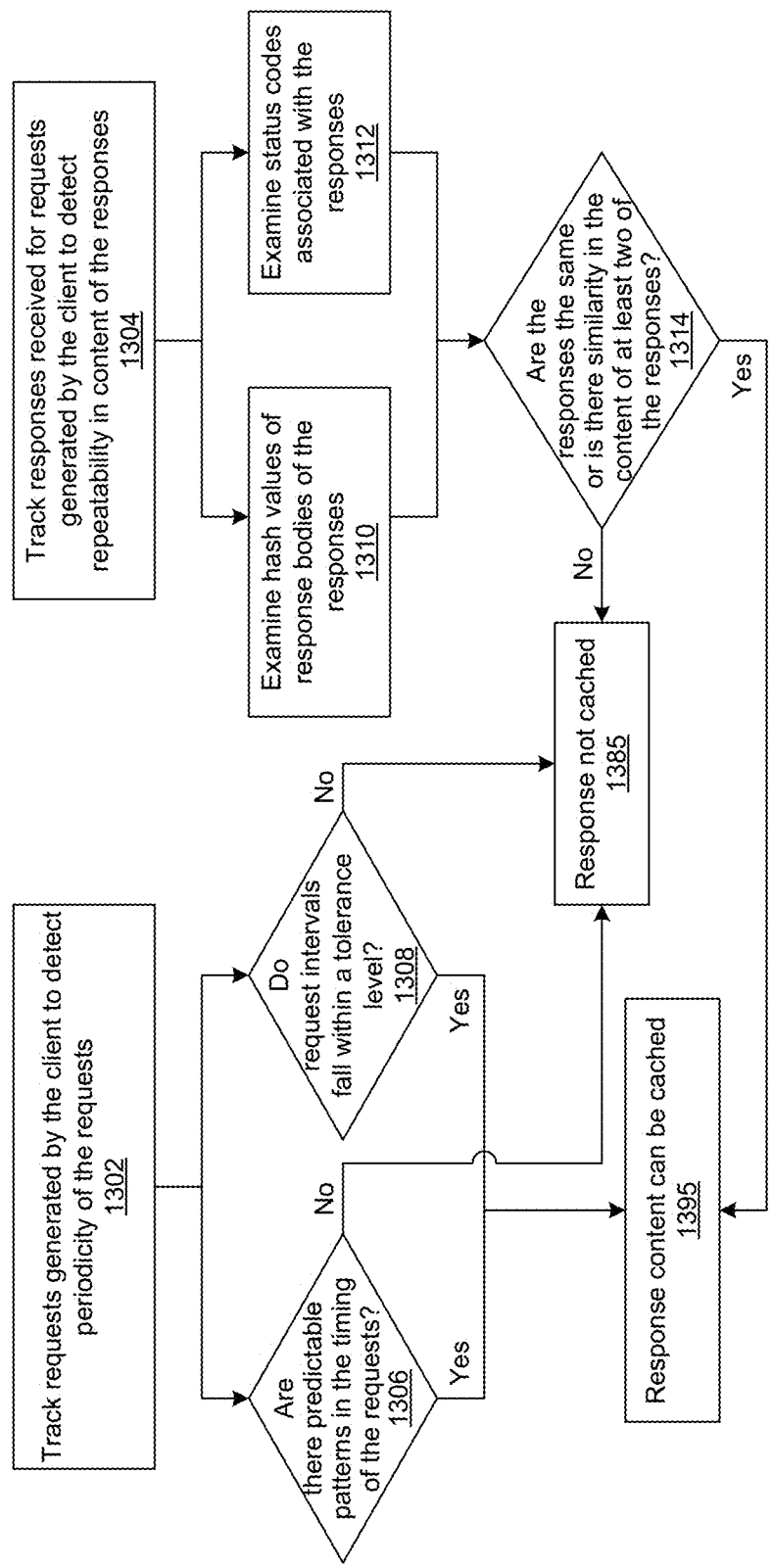
FIG. 13 depicts a flow chart illustrating an example process for determining potential for cacheability based on request periodicity and/or response repeatability.

FIG. 13 depicts a flow chart illustrating an example process for determining potential for cacheability based on request periodicity and/or response repeatability.

In process 1302, requests generated by the client are tracked to detect periodicity of the requests. In process 1306, it is determined whether there are predictable patterns in the timing of the requests. If so, the response content may be cached in process 1395. If not, in process 1308 it is determined whether the request intervals fall within a tolerance level. If so, the response content may be cached in process 1395. If not, the response is not cached in process 1385.

In process 1304, responses received for requests generated by the client are tracked to detect repeatability in content of the responses. In process 1310, hash values of response bodies of the responses received for the client are examined and in process 1312 the status codes associated with the responses are examined. In process 1314, it is determined whether there is similarity in the content of at least two of the responses using hash values and/or the status codes. If so, the response may be cached in process 1395. If not, the response is not cached in 1385.

Figure 14:
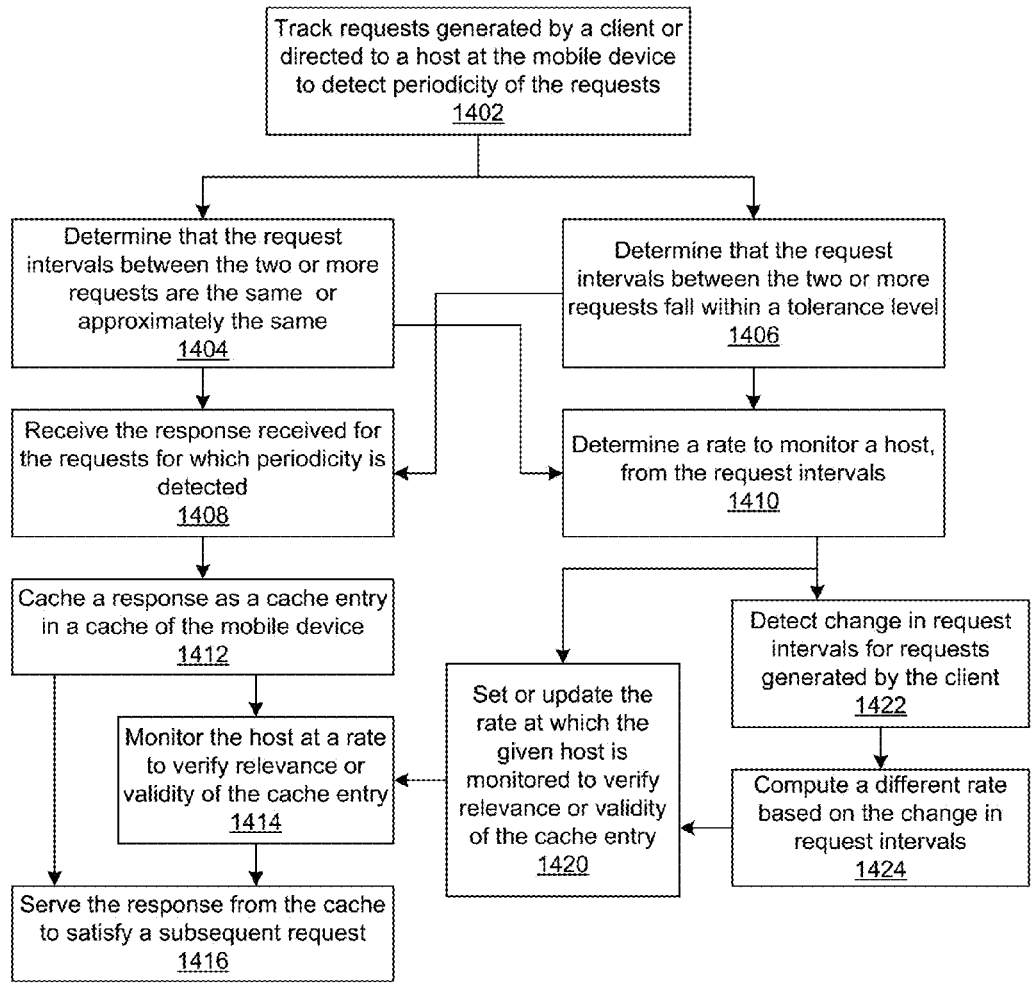
FIG. 14 depicts a flow chart illustrating an example process for dynamically adjusting caching parameters for a given request or client.

FIG. 14 depicts a flow chart illustrating an example process for dynamically adjusting caching parameters for a given request or client.

In process 1402, requests generated by a client or directed to a host are tracked at the mobile device to detect periodicity of the requests. Process 1404 determines if the request intervals between the two or more requests are the same or approximately the same. In process 1406, it is determined that the request intervals between the two or more requests fall within the tolerance level.

Based on the results of steps 1404 and 1406, the response for the requests for which periodicity is detected is received in process 1408.

In process 1412, a response is cached as a cache entry in a cache of the mobile device. In process 1414, the host is monitored at a rate to verify relevance or validity of the cache entry, and simultaneously, in process 1416, the response can be served from the cache to satisfy a subsequent request.

In process 1410, a rate to monitor a host is determined from the request interval, using, for example, the results of processes 1404 and/or 1406. In process 1420, the rate at which the given host is monitored is set to verify relevance or validity of the cache entry for the requests. In process 1422, a change in request intervals for requests generated by the client is detected. In process 1424, a different rate is computed based on the change in request intervals. The rate at which the given host is monitored to verify relevance or validity of the cache entry for the requests is updated in step 1420.

Figure 15:
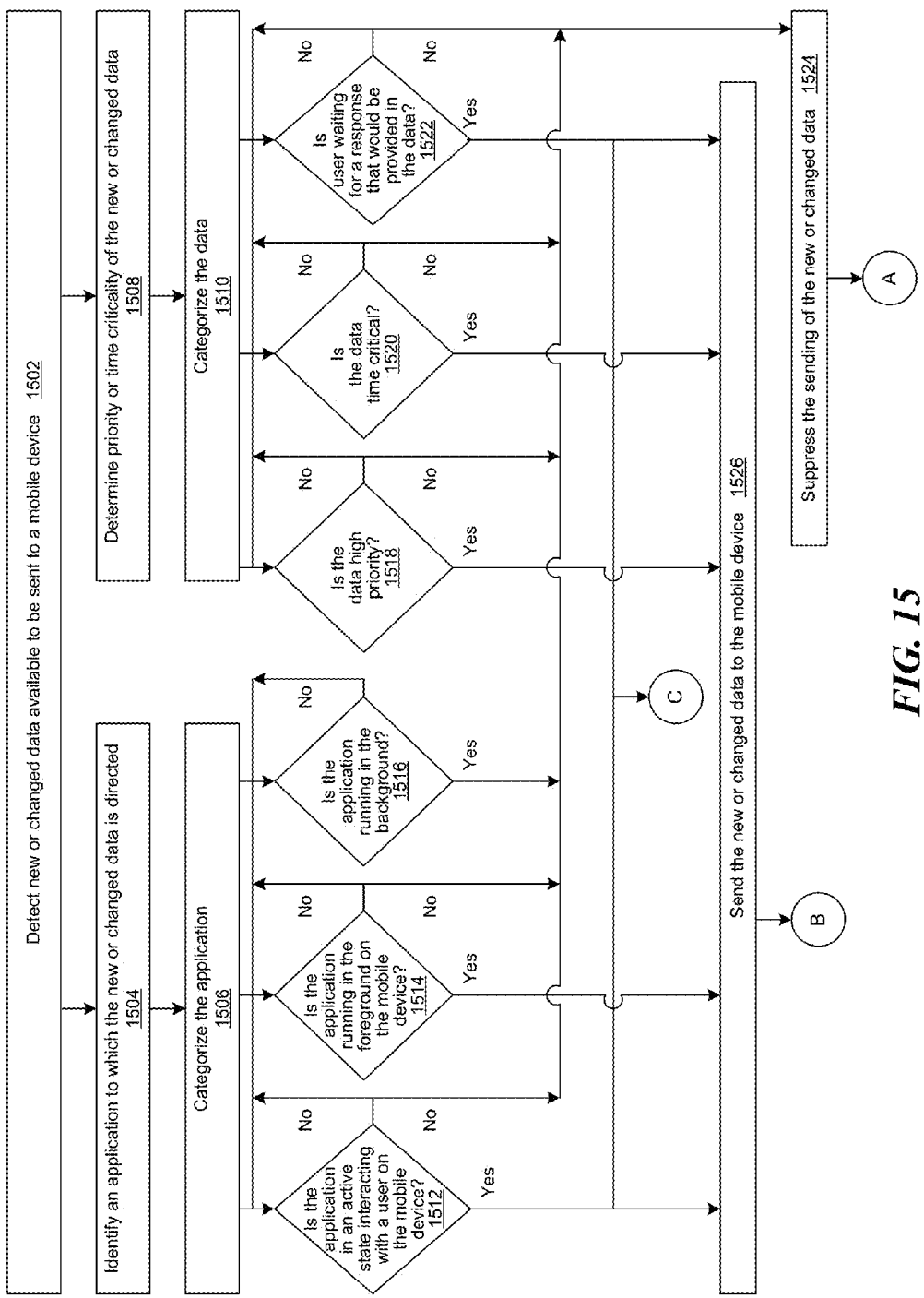
FIG. 15 depicts a flow chart illustrating example processes for application and/or traffic (data) categorization while factoring in user activity and expectations for implementation of network access and content delivery policies.

FIG. 15 depicts a flow chart illustrating example processes for application and/or traffic (data) categorization while factoring in user activity and expectations for implementation of network access and content delivery policies.

In process 1502, a system or server detects that new or changed data is available to be sent to a mobile device. The data, new, changed, or updated, can include one or more of, IM presence updates, stock ticker updates, weather updates, mail, text messages, news feeds, friend feeds, blog entries, articles, documents, any multimedia content (e.g., images, audio, photographs, video, etc.), or any others that can be sent over HTTP or wireless broadband networks, either to be consumed by a user or for use in maintaining operation of an end device or application.

In process 1504, the application to which the new or changed data is directed is identified. In process 1506, the application is categorized based on the application. In process 1508, the priority or time criticality of the new or changed data is determined. In process 1510, the data is categorized. Based on the information determined from the application and/or priority/time-sensitivity of the relevant data, any or all of a series of evaluations can be performed to categorize the traffic and/or to formulate a policy for delivery and/or powering on the mobile device radio.

For example, using the identified application information, in process 1512, it is determined whether the application is in an active state interacting with a user on a mobile device. In process 1514, it is determined if the application is running in the foreground on the mobile device.

If the answer is 'Yes' to any number of the test of processes 1512 or 1514, the system or server can then determine that the new or changed data is to be sent to the mobile device in step 1526, and sent without delay. Alternatively, the process can continue at flow 'C' where the timing, along with other transmission parameters such as a network configuration, can be selected, as further illustrated in the example of FIG. 31. If the answer is 'No' to the tests of 1512 or 1514, the other test can be performed in any order. As long as one of the tests 1512 or 1514 is 'Yes,' then the system or server having the data can proceed to step 1526 and/or flow 'C.'

If the answer is 'No' to the tests 1512 and 1514 based on the application or application characteristics, then the process can proceed to step 1524, where the sending of the new or changed data is suppressed, at least on a temporary basis. The process can continue in flow 'A' for example steps for further determining the timing of when to send the data to optimize network use and/or device power consumption, as further described in the example of flow chart in FIG. 29.

Similarly, in process 1516, it is determined whether the application is running in the background. If so, the process can proceed to step 1524 where the sending of the new or changed data is suppressed. However, even if the application is in the background state, any of the remaining tests can be performed. For example, even if an application is in the background state, new or changed data may still be sent if of a high priority or is time critical.

Using the priority or time sensitivity information, in process 1518, it is determined whether the data is of high priority 1518. In process 1520, it is determined whether the data is time critical. In process 1522, it is determined whether a user is waiting for a response that would be provided in the available data.

If the answer is 'Yes' to any number of the test of processes 1518, 1520, or 1522, the system or server can then determine that the new or changed data is to be sent to the mobile device in step 1526, and sent without delay. Alternatively, the process can continue at flow 'C' where the timing, along with other transmission parameters such as a network configuration, can be selected, as further illustrated in the example of FIG. 31. If the answer is 'No' to any of these tests, the other test can be performed in any order. As long as one of the tests 1518, 1520, or 1522 is 'Yes,' then the system or server having the data can proceed to step 1526 and/or flow 'C.'

If the answer is 'No' to one or more of the tests 1518, 1520, or 1522, then the process can proceed to step 1524, where the sending of the new or changed data is suppressed, at least on a temporary basis. The process can continue in flow 'A' for example steps for further determining the timing of when to send the data to optimize network use and/or device power consumption. The process can continue to step 1524 with or without the other tests being performed if one of the tests yields a 'No' response.

The determined application category in step 1504 can be used in lieu of or in conjunction with the determined data categories in step 1510. For example, the new or changed data that is of a high priority or is time critical can be sent at step 1526 even if the application in the foreground state but not actively interacting with the user on the mobile device or if the application is not in the foreground, or in the background.

Similarly, even if the user is not waiting for a response which would be provided in the new or change data (in step 1522), the data can be sent to the mobile device 1526 if the application is in the foreground, or if the data is of high priority or contains time critical content.

In general, the suppression can be performed at the content source (e.g., originating server/content host of the new or changed data), or at a proxy server. For example, the proxy server may be remote from the recipient mobile device (e.g., able to wirelessly connect to the receiving mobile device). The proxy server may also be remote from the originating server/content host. Specifically, the logic and intelligence in determining whether the data is to be sent or suppressed can exist on the same server or be the same entity as the originator of the data to be sent or partially or wholly remote from it (e.g., the proxy is able to communicate with the content originating server).

In one embodiment, the waiting to transfer the data is managed by a local proxy on the mobile device which is able to wirelessly communicate with a recipient server (e.g., the host server for the mobile application or client). The local proxy on the mobile device can control the radio use on the mobile device for transfer of the data when the time period has elapsed, or when additional data to be sent is detected.

Figure 16A:
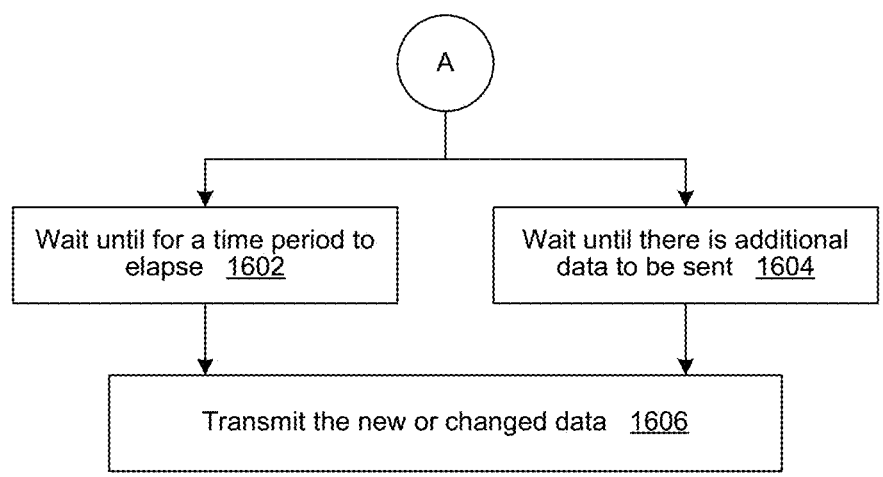
FIG. 16A depicts a flow chart illustrating example processes for handling traffic which is to be suppressed at least temporarily determined from application/traffic categorization.

FIG. 16A depicts a flow chart illustrating example processes for handling traffic which is to be suppressed at least temporarily determined from application/traffic categorization.

For example, in process 1602, a time period is elapsed before the new or change data is transmitted in step 1606. This can be performed if the data is of low priority or is not time critical, or otherwise determined to be suppressed for sending (e.g., as determined in the flow chart of FIG. 15). The time period can be set by the application, the user, a third party, and/or take upon a default value. The time period may also be adapted over time for specific types of applications or real-time network operating conditions. If the new or changed data to be sent is originating from a mobile device, the waiting to transfer of the data until a time period has elapsed can be managed by a local proxy on the mobile device, which can communicate with the host server. The local proxy can also enable or allow the use radio use on the mobile device for transfer of the data when the time period has elapsed.

In some instances, the new or changed data is transmitted in 1606 when there is additional data to be sent, in process 1604. If the new or changed data to be sent is originating from a mobile device, the waiting to transfer of the data until there is additional data to be sent, can be managed by a local proxy on the mobile device, which can communicate with the host server. The local proxy can also enable or allow the use radio use on the mobile device for transfer of the data when there is additional data to be sent, such that device resources can be conserved. Note that the additional data may originate from the same mobile application/client or a different application/client. The additional data may include content of higher priority or is time critical. The additional data may also be of same or lower priority. In some instances, a certain number of non priority, or non time-sensitive events may trigger a send event.

If the new or changed data to be sent is originating from a server (proxy server or host server of the content), the waiting to transfer of the data until a time period has elapsed or waiting for additional data to be sent, can be managed by the proxy server which can wirelessly communicate with the mobile device. In general, the proxy server waits until additional data is available for the same mobile device before sending the data together in a single transaction to minimize the number of power-ons of device battery and to optimize network use.

Figure 16B:
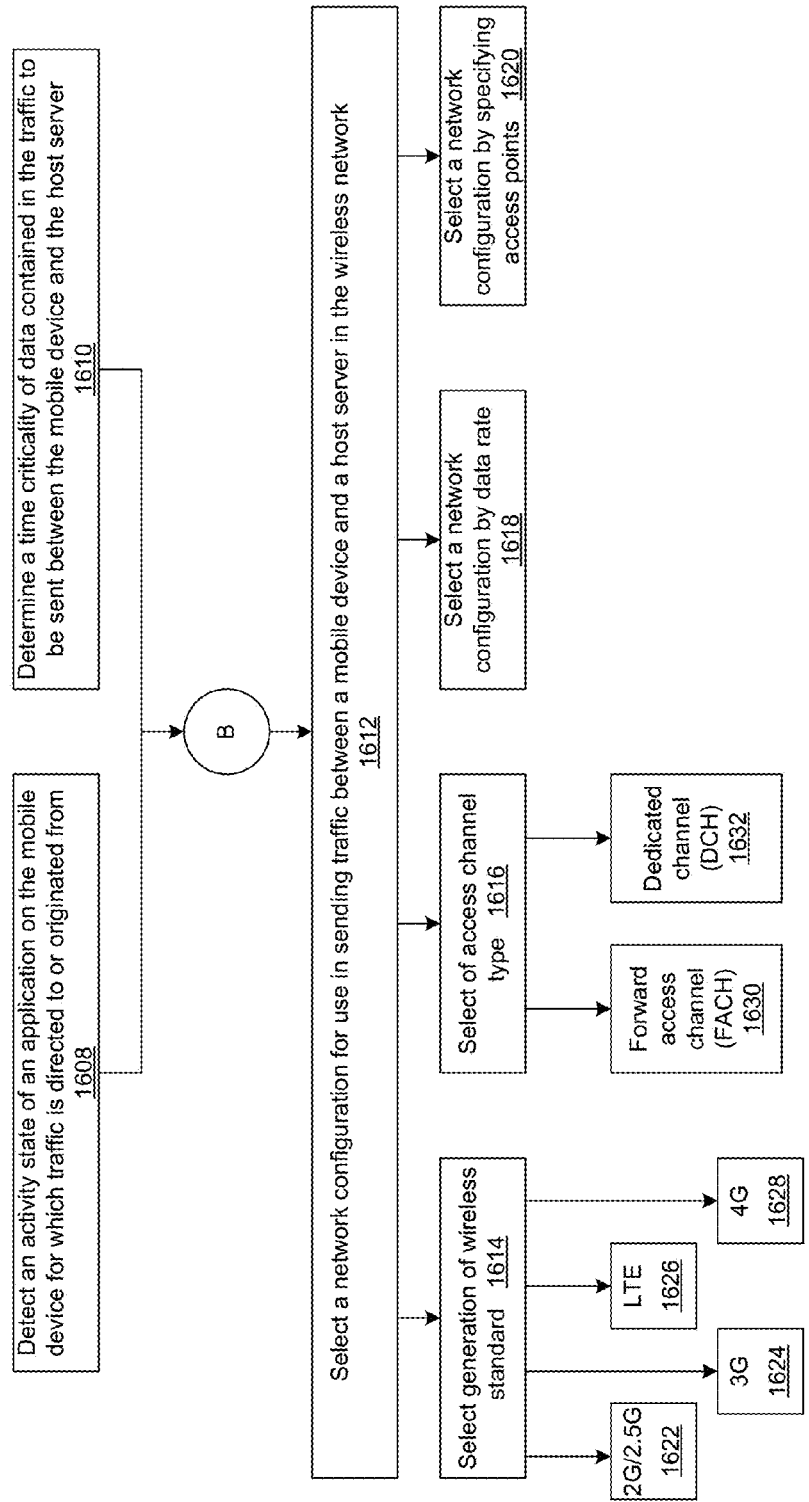
FIG. 16B depicts a flow chart illustrating an example process for selection of a network configuration for use in sending traffic based on application and/or traffic (data) categorization.

FIG. 16B depicts a flow chart illustrating an example process for selection of a network configuration for use in sending traffic based on application and/or traffic (data) categorization.

In process 1608, an activity state of an application on the mobile device is detected for which traffic is directed to or originated from is detected. In parallel or in lieu of activity state, a time criticality of data contained in the traffic to be sent between the mobile device and the host server can be determined, in process 1610. The activity state can be determined in part or in while, by whether the application is in a foreground or background state on the mobile device. The activity state can also be determined by whether a user is interacting with the application.

Using activity state and/or data characteristics, when it has determined from that the data is to be sent to the mobile device in step 1612 of FIG. 15, the process can continue to step 3006 for network configuration selection.

For example, in process 1614, a generation of wireless standard is selected. The generation of wireless standard which can be selected includes 2G or 2.5G, 3G, 3.5G, 3G+, 3GPP, LTE, or 4G, or any other future generations. For example, slower or older generation of wireless standards can be specified for less critical transactions or traffic containing less critical data. For example, older standards such as 2G, 2.5G, or 3G can be selected for routing traffic when one or more of the following is detected, the application is not interacting with the user, the application is running in the background on the mobile device, or the data contained in the traffic is not time critical. Newer generations such as can be specified for higher priority traffic or transactions. For example, newer generations such as 3G, LTE, or 4G can be specified for traffic when the activity state is in interaction with a user or in a foreground on the mobile device.

In process 1616, the access channel type can be selected. For example, forward access channel (FACH) or the dedicated channel (DCH) can be specified. In process 1618, a network configuration is selected based on data rate or data rate capabilities. For example, a network configuration with a slower data rate can be specified for traffic when one or more of the following is detected, the application is not interacting with the user, the application is running in the background on the mobile device, or the data contained in the traffic is not time critical In process 1620, a network configuration is selected by specifying access points. Any or all of the steps 1614, 1616, 1618, and 1620 can be performed or in any combination in specifying network configurations.

Figure 16C:
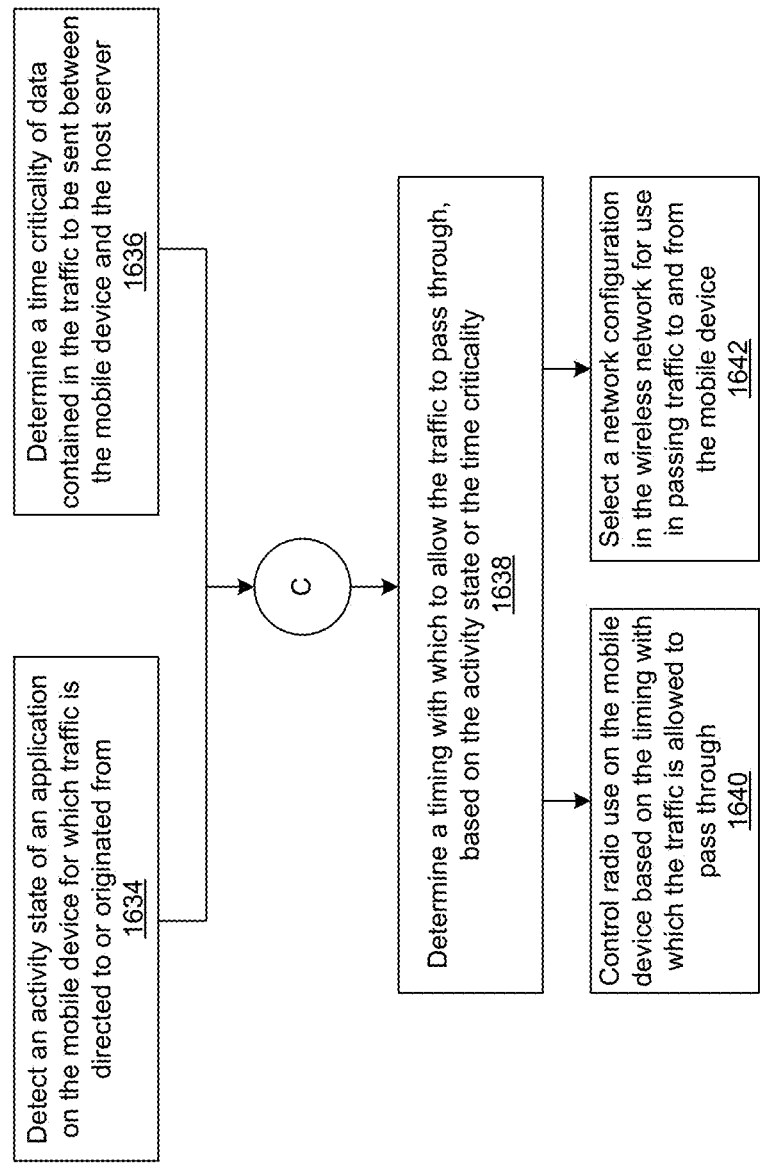
FIG. 16C depicts a flow chart illustrating an example process for implementing network access and content delivery policies based on application and/or traffic (data) categorization.

FIG. 16C depicts a flow chart illustrating an example process for implementing network access and content delivery policies based on application and/or traffic (data) categorization.

In process 1634, an activity state of an application on a mobile device to which traffic is originated from or directed to is detected. For example, the activity state can be determined by whether the application is in a foreground or background state on the mobile device. The activity state can also be determined by whether a user is expecting data contained in the traffic directed to the mobile device.

In process 1636, a time criticality of data contained in the traffic to be sent between the mobile device and the host server is detected. For example, when the data is not time critical, the timing with which to allow the traffic to pass through can be set based on when additional data needs to be sent. Therefore, the traffic can be batched with the other data so as to conserve network and/or device resources.

The application state and/or data characteristics can be used for application categorization and/or data categorization to determine whether the traffic resulting therefrom is to be sent to the mobile device or suppressed at least on a temporary basis before sending, as illustrated in the flow chart shown in the example of FIG. 15.

Continuing at flow C after a determination has been made to send the traffic, the parameters relating to how and when the traffic is to be sent can be determined. For example, in process 1638, a timing with which to allow the traffic to pass through, is determined based on the activity state or the time criticality.

In process 1640, radio use on the mobile device is controlled based on the timing with which the traffic is allowed to pass through. For example, for traffic initiated from the mobile device, a local proxy can residing on the mobile device can control whether the radio is to be turned on for a transaction, and if so, when it is to be turned on, based on transaction characteristics determined from application state, or data priority/time-sensitivity.

In process 1642, a network configuration in the wireless network is selected for use in passing traffic to and/or from the mobile device. For example, a higher capacity or data rate network (e.g., 3G, 3G+, 3.5G, LTE, or 4G networks) can be selected for passing through traffic when the application is active or when the data contained in the traffic is time critical or is otherwise of a higher priority/importance.

Figure 17:
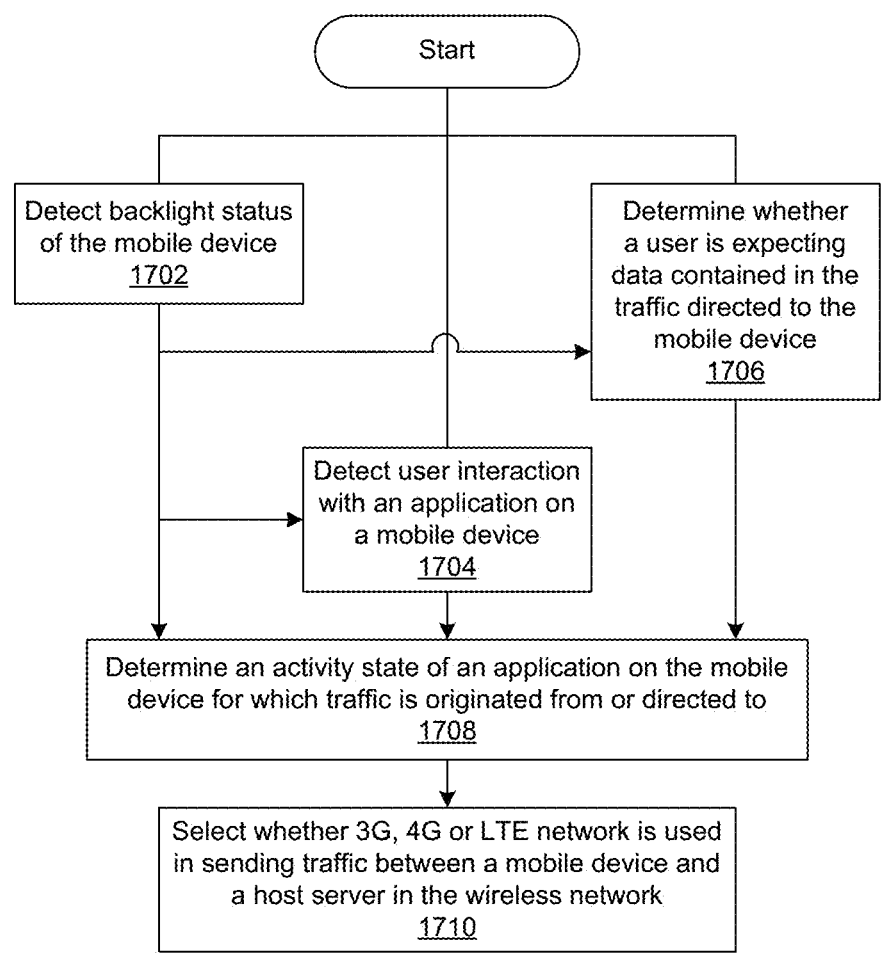
FIG. 17 depicts a flow chart illustrating an example process for network selection based on mobile user activity or user expectations.

FIG. 17 depicts a flow chart illustrating an example process for network selection based on mobile user activity or user expectations.

In process 1702, the backlight status of a mobile device is detected. The backlight status can be used to determine or infer information regarding user activity and/or user expectations. For example, in process 1704, user interaction with an application on a mobile device is detected and/or in process 1706, it is determined that a user is expecting data contained in traffic directed to the mobile device, if the backlight is on.

The user interaction 1704 and/or user expectation 1706 can be determined or inferred via other direct or indirect cues. For example, device motion sensor, ambient light, data activity, detection of radio activity and patterns, call processing, etc. can be used alone or in combination to make an assessment regarding user activity, interaction, or expectations.

In process 1708, an activity state of an application on the mobile device for which traffic is originated from or directed to, is determined. In one embodiment, the activity state of the application is determined by user interaction with the application on the mobile device and/or by whether a user is expecting data contained in the traffic directed to the mobile device.

In process 1710, 3G, 4G, or LTE network is selected for use in sending traffic between a mobile device and a host server in the wireless network. Other network configurations or technologies can be selected as well, including but not limited to 2.5G GSM/GPRS networks, EDGE/EGPRS, 3.5G, 3G+, turbo 3G, HSDPA, etc. For example, a higher bandwidth or higher capacity network can be selected when user interaction is detected with an application requesting to access the network. Similarly, if it can be determined or inferred with some certainty that the user may be expecting data contained in traffic requesting network access, a higher capacity or higher data rate network may be selected as well.

The activity state can also be determined by whether data contained in the traffic directed to the mobile device responds to foreground activities in the application. For applications which are in the foreground, a higher capacity (e.g., 3.5G, 4G, or LTE) network may be selected for use in carrying out the transaction.

The activity state can be determined via device parameters such as the backlight status of the mobile device or any other software or hardware based device sensors including but not limited to, resistive sensors, capacitive sensors, light detectors, motion sensors, proximity sensors, touch screen sensors, etc. The network configuration which is selected for use can be further based on a time criticality and/or priority of data contained in the traffic to be sent between the mobile device and the host server.

Figure 18:
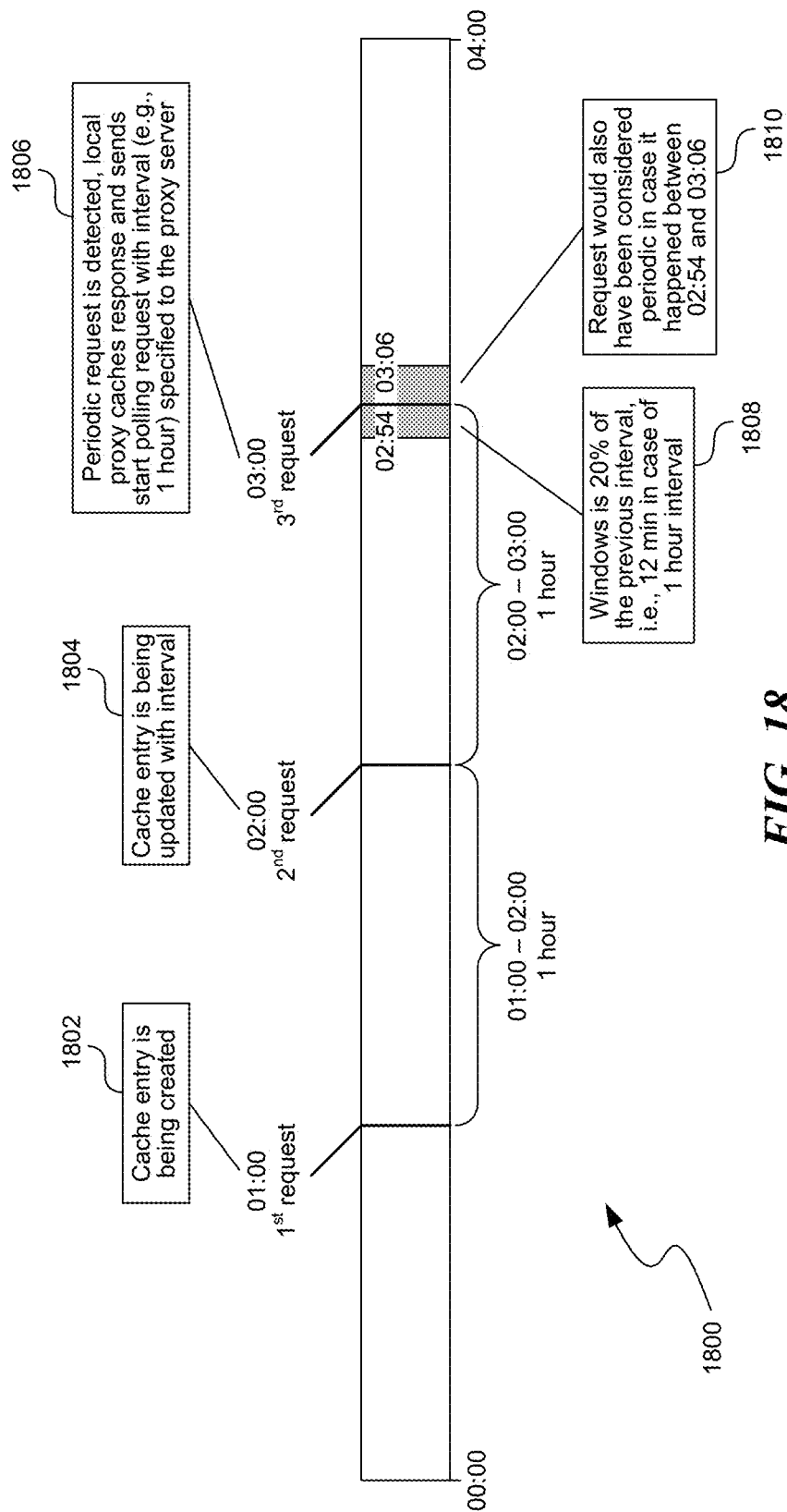
FIG. 18 depicts a data timing diagram showing an example of detection of periodic request which may be suitable for caching.

FIG. 18 depicts a data timing diagram 1800 showing an example of detection of periodic request which may be suitable for caching.

In the example shown, a first request from a client/application on a mobile device is detected at time 1:00 (t1). At this time, a cache entry may be created in step 1802. At time 2:00 (t2), the second request is detected from the same client/application, and the cache entry that was created can now be updated with the detected interval of 1 hour between time t2 and t1 at step 1804. The third request from the same client is now detected at time t3=3:00, and it can now be determined that a periodic request is detected in step 1806.

The local proxy can now cache the response and send a start poll request specifying the interval (e.g., 1 hour in this case) to the proxy server.

The timing diagram further illustrates the timing window between 2:54 and 3:06, which indicates the boundaries of a window within which periodicity would be determined if the third request is received within this time frame 1810. The timing window 1808 between 2:54 and 3:06 corresponds to 20% of the previous interval and is the example tolerance shown. Other tolerances may be used, and can be determined dynamically or on a case by case (application by application) basis.

Figure 19:
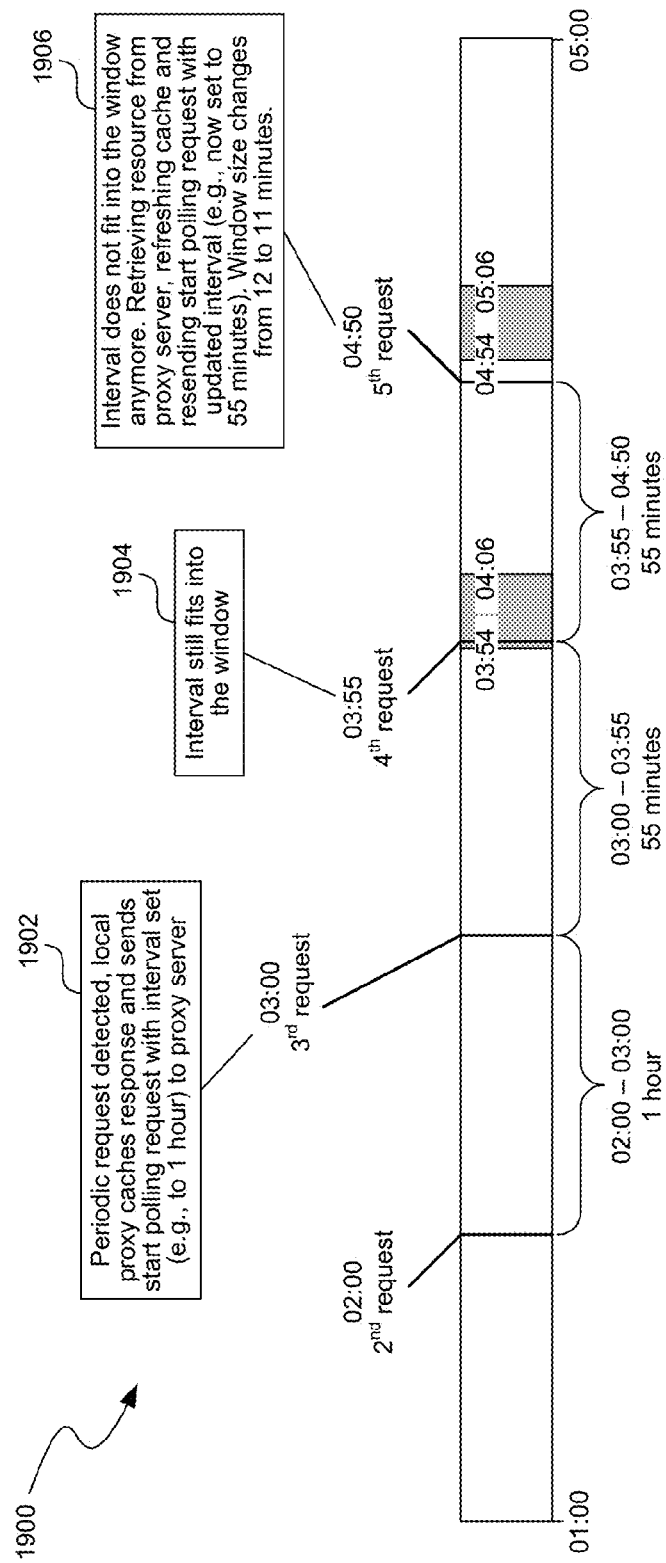
FIG. 19 depicts a data timing diagram showing an example of detection of change in request intervals and updating of server polling rate in response thereto.

FIG. 19 depicts a data timing diagram 1900 showing an example of detection of change in request intervals and updating of server polling rate in response thereto.

At step 1902, the proxy determines that a periodic request is detected, the local proxy caches the response and sets the polling request to the proxy server, and the interval is set to 1 hour at the 3rd request, for example. At time t4=3:55, the request is detected 55 minutes later, rather than 1 hour. The interval of 55 minutes still fits in to the window 1904 given a tolerance of 20%. However, at step 1906, the 5th request is received at time t5=4:50, which no longer fits within the tolerance window set determined from the interval between the 1st and second, and second and third requests of 1 hour. The local proxy now retrieves the resource or response from the proxy server, and refreshes the local cache (e.g., cache entry not used to serve the 5th request). The local proxy also resends a start poll request to the proxy server with an updated interval (e.g., 55 minutes in the example) and the window defined by the tolerance, set by example to 20%, now becomes 11 minutes, rather than 12 minutes.

Figure 20:
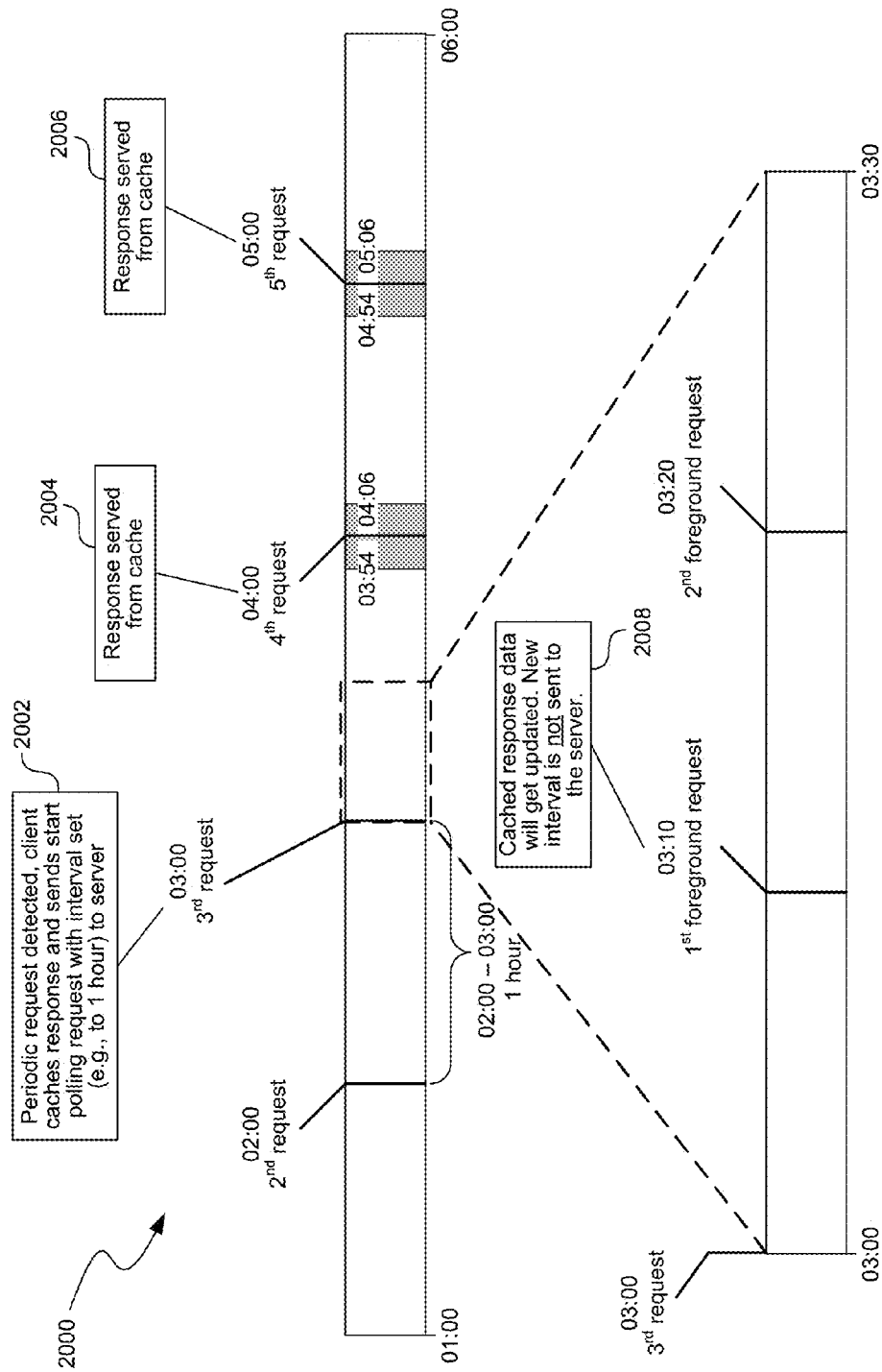
FIG. 20 depicts a data timing diagram showing an example of serving foreground requests with cached entries.

Note that in general, the local proxy notifies the proxy server with an updated polling interval when an interval changes is detected and/or when a new rate has been determined. This is performed, however, typically only for background application requests or automatic/programmatic refreshes (e.g., requests with no user interaction involved). In general, if the user is interacting with the application in the foreground and causing out of period requests to be detected, the rate of polling or polling interval specified to the proxy server is typically not update, as illustrated in FIG. 20. FIG. 20 depicts a data timing diagram 2000 showing an example of serving foreground requests with cached entries.

For example, between the times of t=3:00 and 3:30, the local proxy detects 1st and 2nd foreground requests at t=3:10 and t=3:20. These foreground requests are outside of the periodicity detected for background application or automatic application requests. The response data retrieved for the foreground request can be cached and updated, however, the request interval for foreground requests are not sent to the server in process 2008.

As shown, the next periodic request detected from the application (e.g., a background request, programmatic/automatic refresh) at t=4:00, the response is served from the cache, as is the request at t=5:00.

Figure 21:
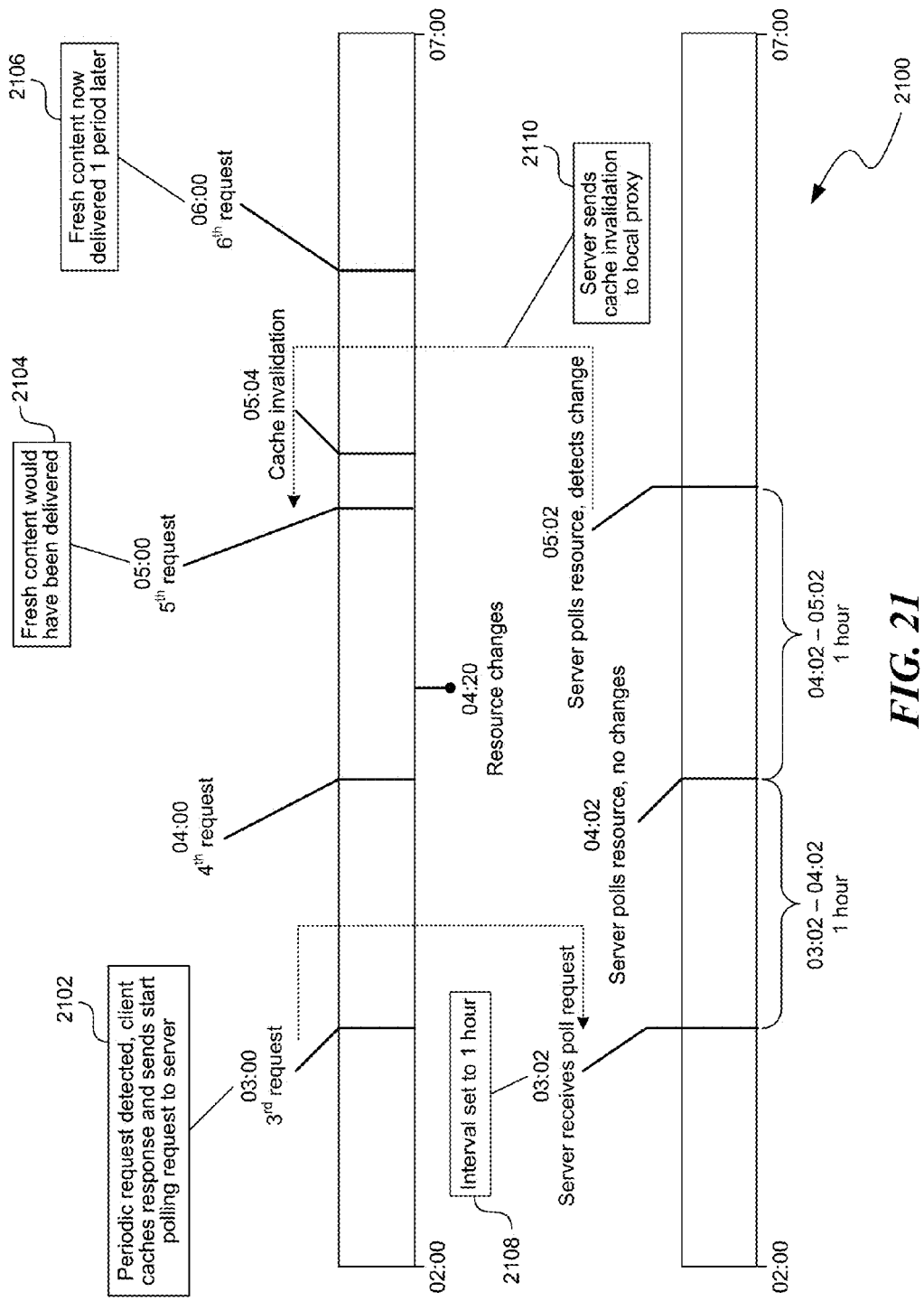
FIG. 21 depicts a data timing diagram showing an example of the possible effect of cache invalidation that occurs after outdated content has been served once again to a requesting application.

FIG. 21 depicts a data timing diagram 2100 showing an example of a non-optimal effect of cache invalidation occurring after outdated content has been served once again to a requesting application.

Since the interval of proxy server polls is set to approximately the same interval at which the application (e.g., mobile application) is sending requests, it is likely the case that the proxy server typically detects changed content (e.g., at t=5:02) after the cached entry (now outdated) has already been served for a request (e.g., to the 5th request at t=5:00). In the example shown, the resource updates or changes at t=4:20 and the previous server poll which occurs at t=4:02 was not able to capture this change until the next poll at 5:02 and sends a cache invalidation to the local proxy at 2110. Therefore, the local cache does not invalidate the cache at some time after the 5th request at time t=5:00 has already been served with the old content. The fresh content is now not provided to the requesting application until the 6th request at t=6:00, 1 period later at process 2106.

To optimize caching performance and to resolve this issue, the local proxy can adjust time setup by specifying an initial time of request, in addition to the polling interval to the proxy server. The initial time of request here is set to some time before (e.g., a few minutes) the request actually occurred such that the proxy server polls occur slightly before actual future application requests. This way, the proxy can pick up any changes in responses in time to be served to the subsequent application request.

Figure 22:
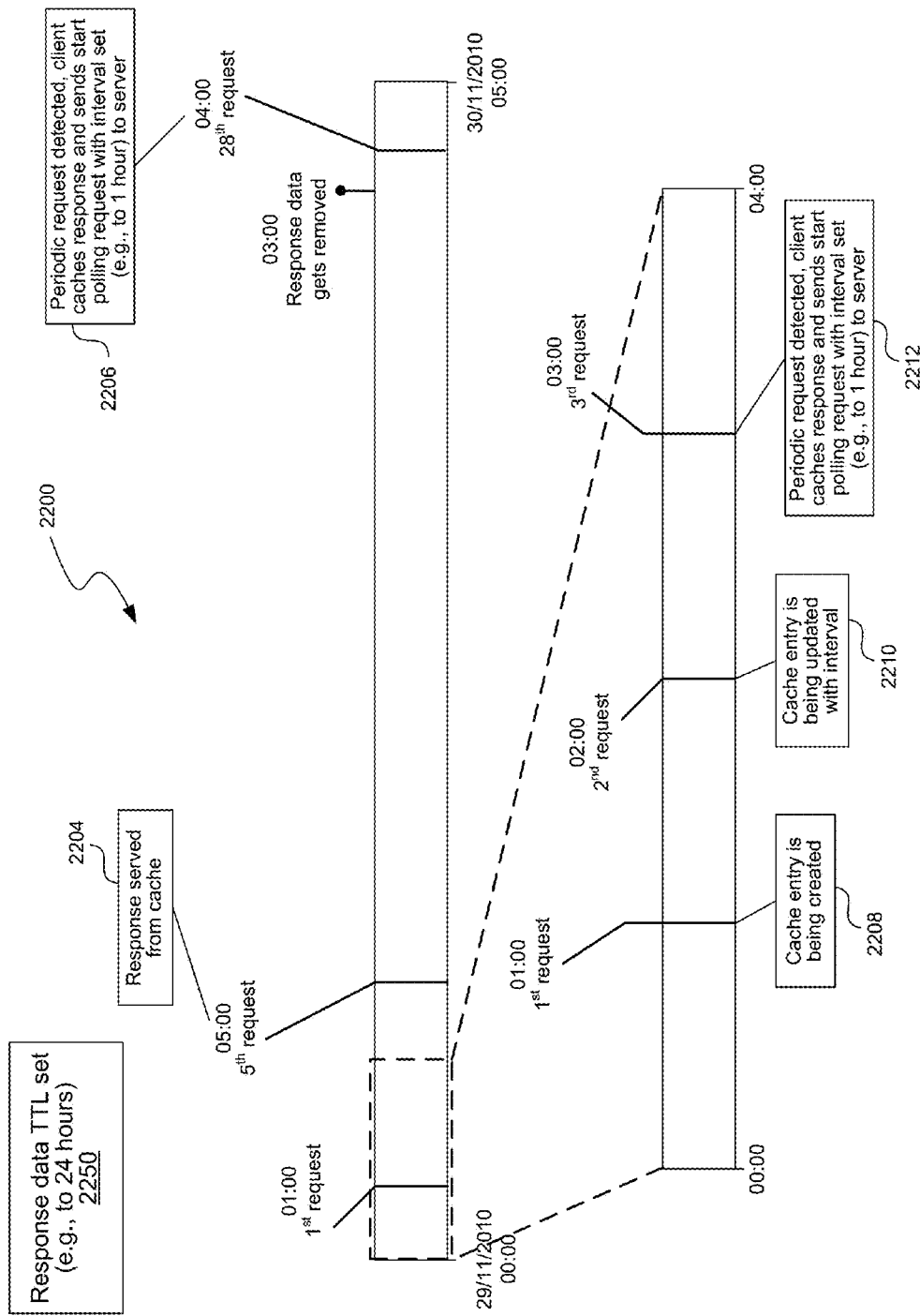
FIG. 22 depicts a data timing diagram showing cache management and response taking into account the time-to-live (TTL) set for cache entries.

FIG. 22 depicts a data timing diagram 2200 showing cache management and response taking into account the time-to-live (TTL) set for cache entries.

In one embodiment, cached response data in the local cache specifies the amount of time cache entries can be stored in the local cache until it is deleted or removed.

The time when a response data in a given cache entry is to be removed can be determined using the formula: <response data_cache time>+<TTL>, as shown at t=3:00, the response data is automatically removed after the TTL has elapsed due to the caching at step 2212 (e.g., in this example, 24 hours after the caching at step 2212). In general the time to live (TTL) applies to the entire cache entry (e.g., including both the response data and any metadata, which includes information regarding periodicity and information used to compute periodicity). In one embodiment, the cached response data TTL is set to 24 hours by default or some other value (e.g., 6 hours, 12 hours, 48 hours, etc.). The TTL may also be dynamically adjustable or reconfigured by the admin/user and/or different on a case-by-case, device, application, network provider, network conditions, operator, and/or user-specific basis.

FIG. 23 depicts a flow chart illustrating an example process for enhancing resource management in a wireless network through selective data compression to reduce mobile data traffic and signaling traffic.

In process 2302, an uncompressed data chunk in a data stream to be transmitted over the wireless network to is compressed to generate a compressed data chunk. The data stream can run above a transport layer and below a session layer. In process 2304, size of the uncompressed data chunk is compared with the compressed data chunk. In process 2306, it is determined which of the uncompressed data chunk and the compressed data chunk is smaller in size.

In process 2308, an optimized data stream comprising of the uncompressed data chunk or the compressed data chunk is transmitted over the wireless network., depending on which is smaller in size.

In process 2310, a header is included in the optimized data stream to indicate which of uncompressed data chunk and the compressed data chunk is transmitted. The header can be used such that the compression dictionary need not be sent with each data chunk in the optimized data stream. In process 2312, a compression dictionary is updated if the compressed data chunk is transmitted in the optimized data stream. In one embodiment, the compression dictionary is updated when the compressed data chunk is sent to maintain synchronization across compressed data chunks and uncompressed data chunks sent between the proxy server and the mobile device.

In general, a compression dictionary is not transmitted or updated if the uncompressed data chunk is transmitted in the optimized data stream to avoid increasing overhead. In process 2314, the compression dictionary is applied when the compressed data chunk is transmitted to decode the compressed data chunk, for example, by the receiving end which may be a mobile device (e.g., the local proxy) or the remote proxy server. The receiver can use the compression dictionary to decode the at least partially compressed data stream and the header to identify portions of the received data stream which is at least partially compressed data stream to which to apply the compression dictionary.

In one embodiment, the data stream is to be transmitted in a distributed traffic management system having a local proxy on a mobile device and a proxy server remote from the mobile device where, the proxy server is able to establish wireless connectivity to the mobile device. For example, the data stream can be sent from the proxy server to the local proxy of the mobile device and, the compression can be performed by the proxy server. The data stream includes cache-related content or information. The data stream can include content or data from a content source or application server directed to the mobile device. In one embodiment, the proxy server monitors the content server for new or changed data and the data stream can include a cache invalidate message. The data stream includes state information of content cached on the proxy server or on the local proxy and/or cached content from a content source or application server directed to the mobile device.

In one embodiment, the data stream is sent from the local proxy of the mobile device to the proxy server and the compression can be performed by the local proxy. In this case, the data stream includes cache-setup information including a polling schedule of one or more content sources or application servers. The data stream can also include mobile data traffic and/or signaling data.

Figure 24:
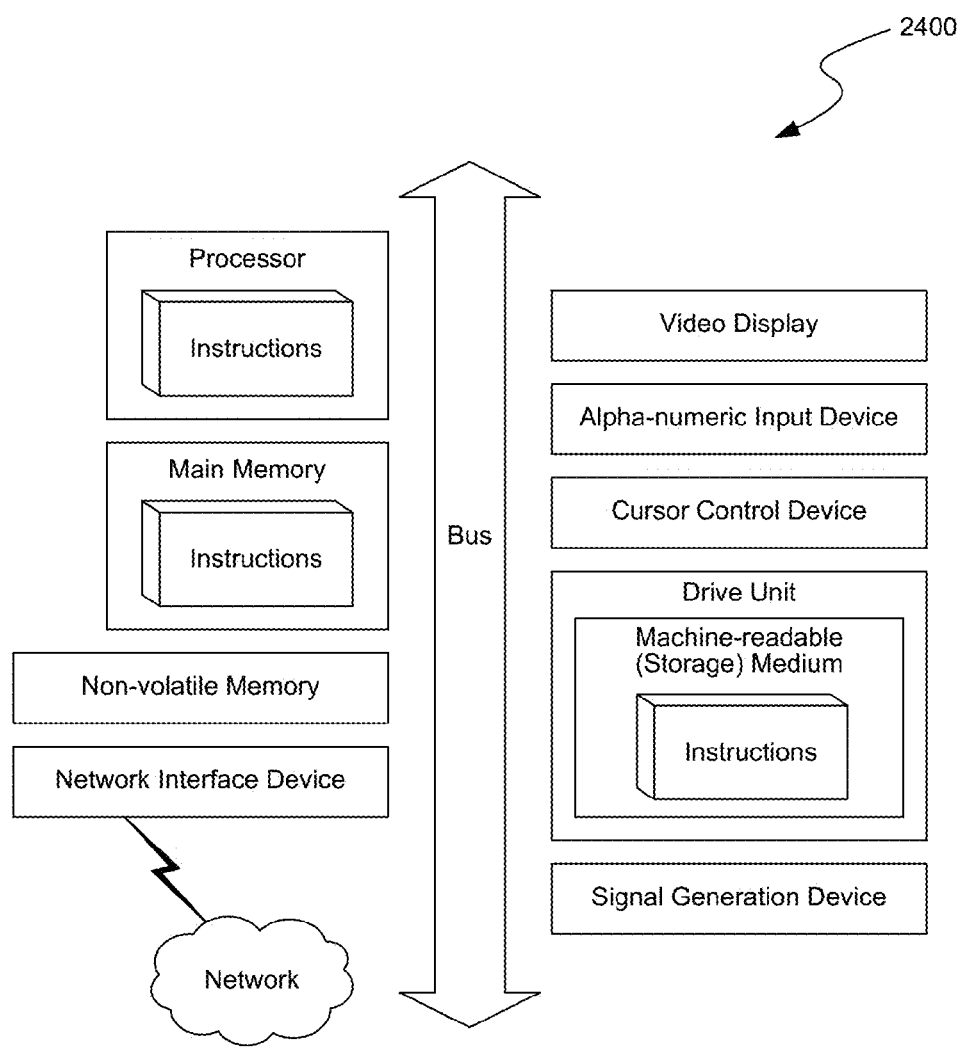
FIG. 24 shows a diagrammatic representation of a machine in the example form of a computer system within which a set of instructions, for causing the machine to perform any one or more of the methodologies discussed herein, may be executed.

FIG. 24 shows a diagrammatic representation of a machine in the example form of a computer system within which a set of instructions, for causing the machine to perform any one or more of the methodologies discussed herein, may be executed.

In alternative embodiments, the machine operates as a standalone device or may be connected (e.g., networked) to other machines. In a networked deployment, the machine may operate in the capacity of a server or a client machine in a client-server network environment, or as a peer machine in a peer-to-peer (or distributed) network environment.

The machine may be a server computer, a client computer, a personal computer (PC), a user device, a tablet PC, a laptop computer, a set-top box (STB), a personal digital assistant (PDA), a cellular telephone, an iPhone, an iPad, a Blackberry, a processor, a telephone, a web appliance, a network router, switch or bridge, a console, a hand-held console, a (hand-held) gaming device, a music player, any portable, mobile, hand-held device, or any machine capable of executing a set of instructions (sequential or otherwise) that specify actions to be taken by that machine.

While the machine-readable medium or machine-readable storage medium is shown in an exemplary embodiment to be a single medium, the term "machine-readable medium" and "machine-readable storage medium" should be taken to include a single medium or multiple media (e.g., a centralized or distributed database and/or associated caches and servers) that store the one or more sets of instructions. The term "machine-readable medium" and "machine-readable storage medium" shall also be taken to include any medium that is capable of storing, encoding or carrying a set of instructions for execution by the machine and that cause the machine to perform any one or more of the methodologies of the presently disclosed technique and innovation.

In general, the routines executed to implement the embodiments of the disclosure may be implemented as part of an operating system or a specific application, component, program, object, module or sequence of instructions referred to as "computer programs." The computer programs typically comprise one or more instructions set at various times in various memory and storage devices in a computer that, when read and executed by one or more processing units or processors in a computer, cause the computer to perform operations to execute elements involving the various aspects of the disclosure.

Moreover, while embodiments have been described in the context of fully functioning computers and computer systems, those skilled in the art will appreciate that the various embodiments are capable of being distributed as a program product in a variety of forms, and that the disclosure applies equally regardless of the particular type of machine or computer-readable media used to actually effect the distribution.

Further examples of machine-readable storage media, machine-readable media, or computer-readable (storage) media include but are not limited to recordable type media such as volatile and non-volatile memory devices, floppy and other removable disks, hard disk drives, optical disks (e.g., Compact Disk Read-Only Memory (CD ROMS), Digital Versatile Disks, (DVDs), etc.), among others, and transmission type media such as digital and analog communication links.

Figure 25:
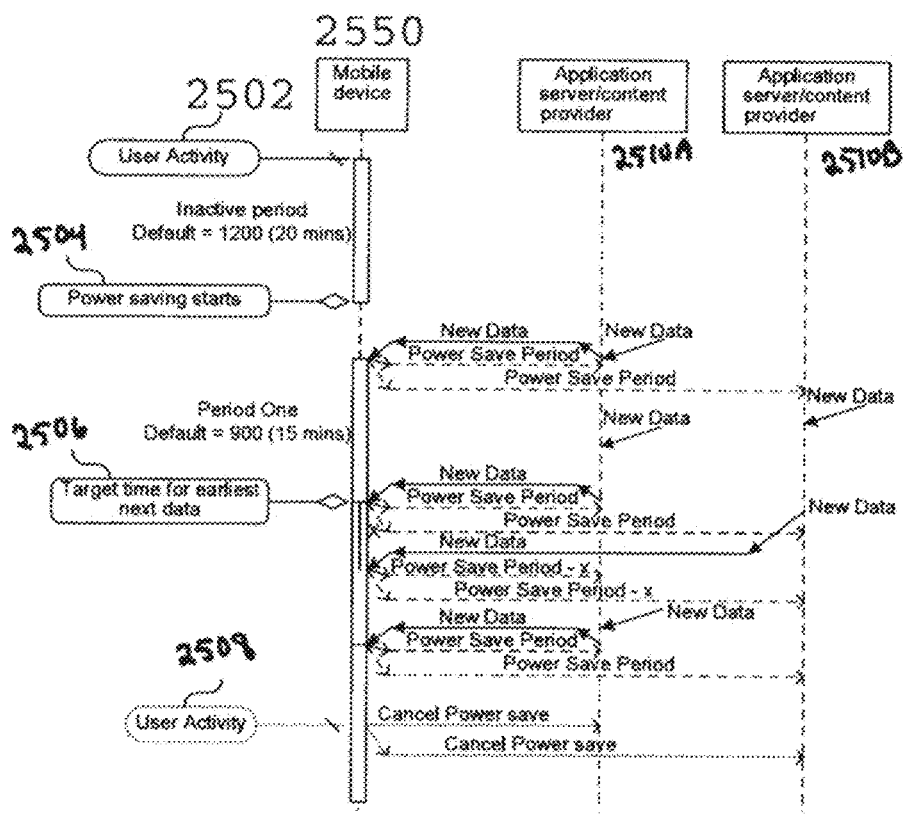
FIG. 25 depicts a diagram showing one example process for implementing a hybrid IP and SMS power saving mode on a mobile device (e.g., any wireless device) using a distributed proxy and cache system (e.g., such as the distributed system shown in the example of FIG. 1B).

FIG. 25 depicts a diagram showing one example process for implementing a hybrid IP and SMS power saving mode on a mobile device 2550 using a distributed proxy and cache system (e.g., such as the distributed system shown in the example of FIG. 1B).

In step 2502, the local proxy (e.g., proxy 175 in the example of FIG. 1B) monitors the device for user activity. When the user is determined to be active, server push is active. In this way, always-on-push IP connection can be maintained and, if available, SMS triggers can be immediately sent to the mobile device 2550 as it becomes available.

In process 2504, after the user has been detected to be inactive or idle over a period of time (e.g., the example is shown for a period of inactivity of 20 minutes), the local proxy can adjust the device to go into the power saving mode. In the power saving mode, when the local proxy receives a message or a correspondence from a remote proxy (e.g., the server proxy 135 in the example of FIG. 1B) on the server-side of the distributed proxy and cache system, the local proxy can respond with a call indicating that the device 2550 is currently in power save mode (e.g., via a power save remote procedure call). In some instances, the local proxy can take the opportunity to notify multiple accounts or providers (e.g., 2510A, and 2510B) of the current power save status (e.g., timed to use the same radio power-on event).

In one embodiment, the response from the local proxy can include a time (e.g., the power save period) indicating to the remote proxy (e.g., server proxy 135) and/or the application server/providers 2510A/B when the device 2550 is next able to receive changes or additional data. A default power savings period can be set by the local proxy.

In one embodiment, if new, changed, or different data or event is received before the end of any one power saving period, then the wait period communicated to the servers 2510A/B can be the existing period, rather than an incremented time period. In response, the remote proxy server, upon receipt of power save notification from the device 2550, can stop sending changes (data or SMSs) for the period of time requested (the wait period). At the end of the wait period, any notifications received can be acted upon; for example, changes sent to the device 2550 as a single batched event or as individual events. If no notifications come in, then push can be resumed with the data or an SMS being sent to the device 2550. The proxy server can time the poll or data collect event to optimize batch sending content to the mobile device 2550 to increase the chance that the client will receive data at the next radio power on event.

Note that the wait period can be updated in operation in real time to accommodate operating conditions. For example, the local proxy can adjust the wait period on the fly to accommodate the different delays that occur in the system.

Detection of user activity in step 2508 at the device 2550 causes the power save mode to be exited. When the device 2550 exits power save mode, it can begin to receive any changes associated with any pending notifications. If a power saving period has expired, then no power save cancel call may be needed as the proxy server will already be in traditional push operation mode.

In one embodiment, power save mode is not applied when the device 2550 is plugged into a charger. This setting can be reconfigured or adjusted by the user or another party. In general, the power save mode can be turned on and off, for example, by the user via a user interface on device 2550. In general, timing of power events to receive data can be synchronized with any power save calls to optimize radio use.

Figure 26:
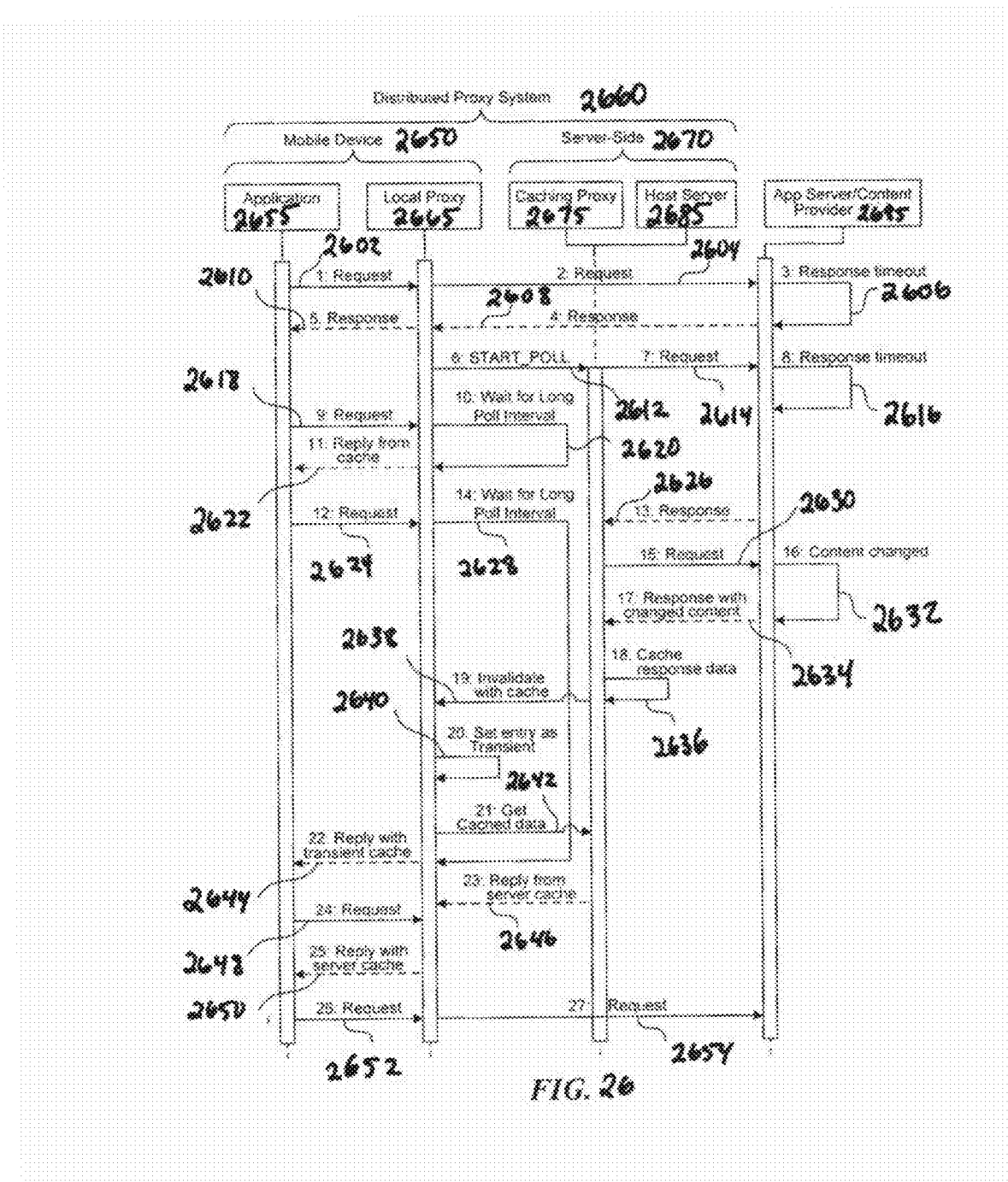
FIG. 26 depicts an interaction diagram showing cache management by a distributed proxy system of content delivered to a mobile application over a long-held request while ensuring freshness of content delivered.

FIG. 26 depicts an interaction diagram showing cache management by a distributed proxy system 2660 of content delivered to an application (e.g., mobile application) 2655 over a long-held request while ensuring freshness of content delivered.

The diagram illustrates an example process for how cached responses received in long-held requests (e.g., long-held HTTP request, long polls, or HTTP streaming) are provided to the requesting application 2655 and management of expired/invalid/non-relevant cache entries. A long-held request can be any request for a persistent connection that is held between the device and the server until a response is available at the server to be sent (or pushed) to the device. The long-held request or long-held HTTP request can allow the device/server interaction to simulate content push over the persistent connection (e.g., COMET style push), for example, over a persisted connection over HTTP.

In step 2602, the application 2655 sends a request which is detected and intercepted by the local proxy 2665 on the mobile device 2650 on the client/device-side of the proxy system 2660. Note that the request-response sequence 2602, 2604, 2606, and 2608 shown occurs after a long poll hunting period which may sometimes be performed by the application (e.g., mobile application) sending long poll requests. The long poll hunting period may or may not be performed, but when performed, it allows the requesting application 2655 to find the longest amount of time it can hold a request with the end server/provider 2695 open before the connection times out (e.g., due to network reason, such as socket closures).

Figure 27:
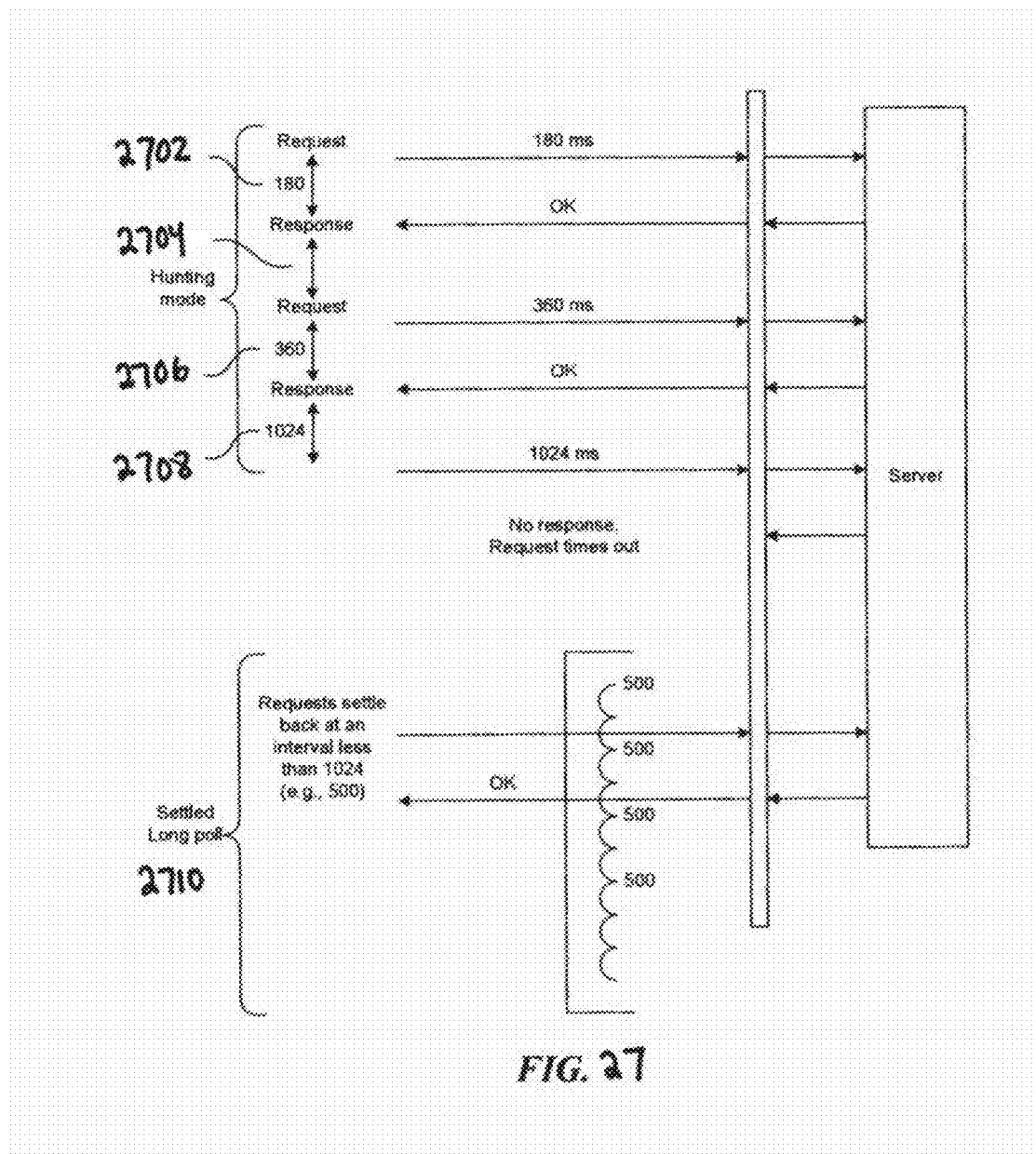
FIG. 27 depicts a timing diagram showing hunting mode behavior in a long poll request and a timing diagram showing timing characteristics when the long poll has settled.

FIG. 27 depicts a timing diagram showing hunting mode behavior 2705 in a long poll request and a timing diagram showing timing characteristics when the long poll has settled 2710.

In hunting mode 2705, the request times are held for an increasing amount of time (180, 360 . . . 1024 seconds) until a request times out without receiving a response from the server (as shown in 2702, 2704, 2706, and 2708). After this time is detected, the request times are now held at some time less than the time it took for a time out (e.g., now 500 seconds) and used to send future long poll requests. The diagram 2710 shows the timing characteristics of request/response pairs after the long poll hunting period has settled. These characteristics can be detected and identified in operation by the local proxy and/or the remote proxy for handling during caching. As previously described, the distributed caching system can either begin caching (optionally) while the application is still in long poll hunting mode or begin caching after the hunting period 2705 has completed and the application is in settled mode as in 2710. In general, if a decrease in time interval is detected, the response is not cached until the local or remote proxy can verify that a subsequent received response meets cacheability conditions.

In general, long poll hunting may or may not be performed by mobile apps or clients but the distributed system includes mechanisms to detect long poll hunting activity for application long polls and can simply ignore the long poll hunting requests and begin caching after the hunting period has elapsed and the long polls have settled at some constant or near constant interval value or apply logic to begin caching during the hunting period, thus enabling accelerated caching to enhance performance and improve user experience.

In process 2702, a decision is made to begin to cache content received from the host server. The decision can be made through the example processes shown in the example of FIG. 9 which depicts a flow chart illustrating example processes for determining whether to cache content from a particular host server (content source) by determining the frequency of polling requests made to the host server in step 2702 and/or by determining the frequency of content change at the host server in step 2704 The two steps can be used in conjunction or independently of one another in deciding whether content from the host server is to be cached, in step 2706

In process 2704, content from a content server is stored as cached elements in a local cache on the mobile device. In process 2706, a polling request to contact the content server is received by the distributed caching system. In process 2708, if it is determined that a radio of the mobile device is not activated and in process 2710, the cached elements are retrieved from the local cache to respond to the polling request without activating the radio even when a cache defeating mechanism is employed.

The cache defeat mechanism, or identifiers used intended to defeat cache addressed by such identifiers, can be employed by the content server (the server to which the polling requests using the identifiers are directed). In general, the cache defeating mechanism or identifiers intended for cache defeat can be detected from a syntax or pattern of a resource identifier included in the polling request identifying the content server.

For example, the resource identifier can include a URI or URL and the URI/URL is normalized by performing one or more of the following steps: converting the URI scheme and host to lower-case, capitalizing letters in percent-encoded escape sequences, removing a default port, or removing duplicate slashes. In addition, the identifier normalization process for an identifier employing cache defeat removes any portion of the identifier which is intended to defeat cache (e.g., typically a changing parameter between requests detectable by the format, pattern, or syntax of the parameter).

Note that the detection of cache defeat mechanisms or identifiers intended to defeat cache need not be determined with 100% certainty. Identifiers with certain characteristics (e.g., having parameters matching specific formats) which can in addition to be determined to be employing cache defeat may simply be treated as cache defeating or intended for defeating cache for the purposes of caching content over a wireless network; for example these may be managed in a distributed fashion.

Figure 28:
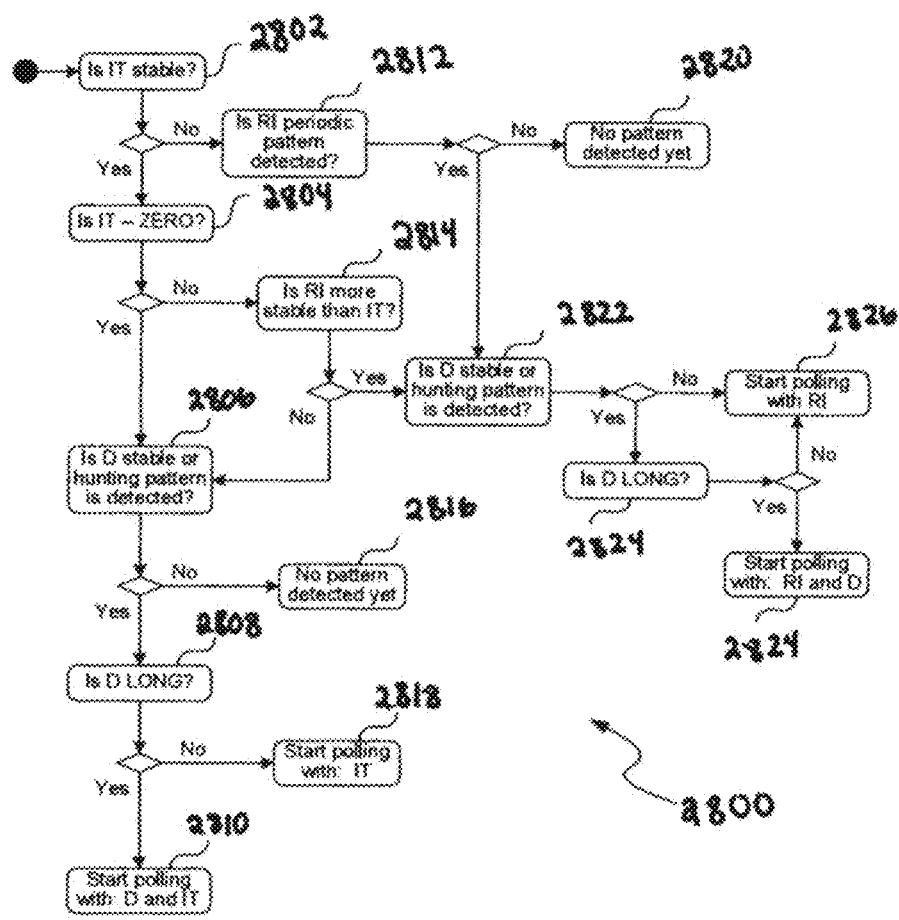
FIG. 28 depicts a flow diagram illustrating an example process for using request intervals to determine and to set a polling interval or rate at which a proxy server is to monitor an application server/content host on behalf of the mobile device (e.g., any wireless device).

FIG. 28 depicts a flow diagram 2800 illustrating an example process for using request intervals to determine and to set a polling interval or rate at which a proxy server is to monitor an application server/content host on behalf of the mobile device.

Figure 30A:
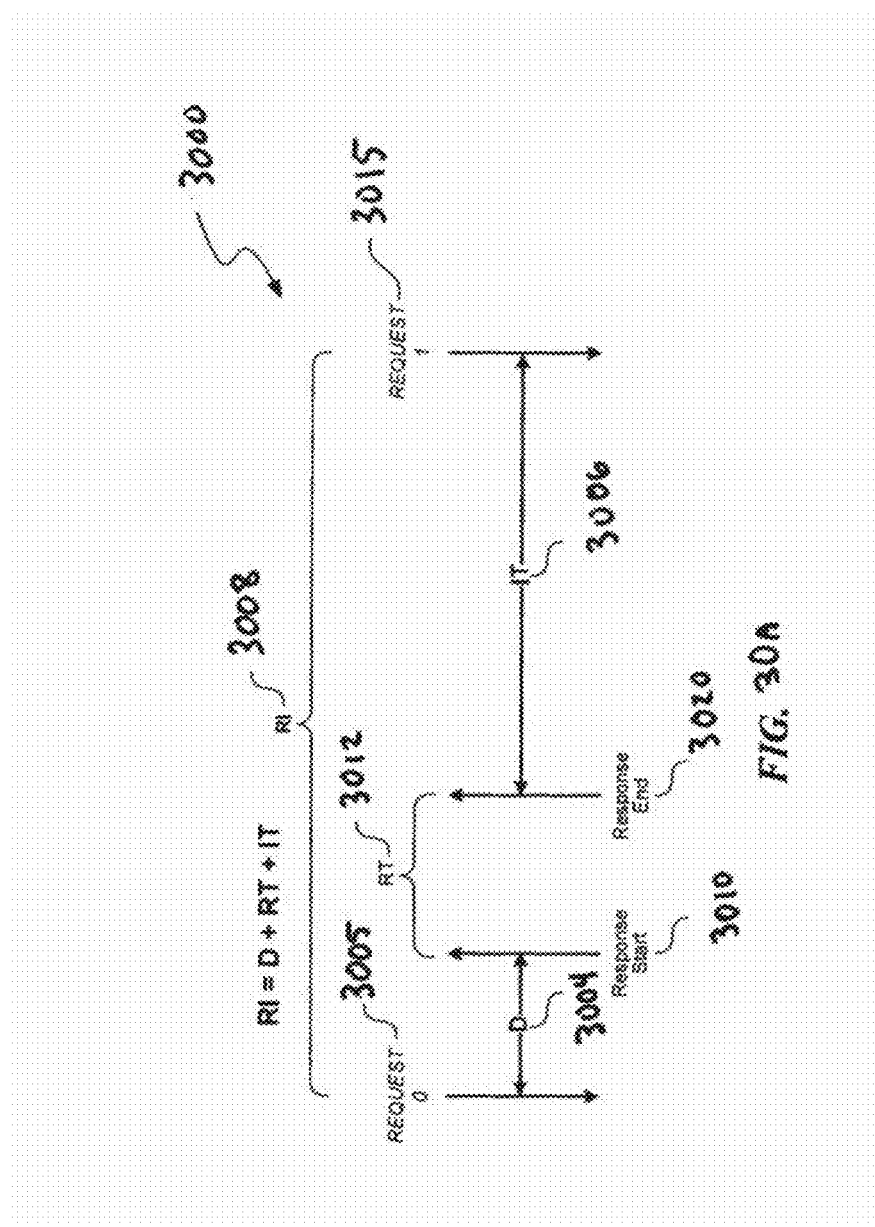
FIG. 30A depicts an example of a timing diagram showing timing characteristics for request-response sequences.

The flow diagram 2800 refers to various timing parameters of request/response sequences, shown diagrammatically in FIG. 30A-B. The timing parameters 'IT,' 'RI,' 'D,' 'RT' are defined as follows and illustrated in FIG. 30A-B.

1. RI—Request interval—Time between "Request Sent 0" and "Request Sent 1."
2. D—Delay—Time between 'Request sent' and "First bytes of response (HEADER) arrived."
3. IT—Idle time—Time between 'Whole Response content received 0' and 'Request Sent 1'.
4. RT—Response time—Time between "First bytes of response (HEADER) arrived." and 'Whole Response content received."

When the local proxy sets up a poll with the proxy server, the polling interval or rate can be specified via timing parameters RI, IT, D, or any combination of the above. Some examples of ways the local proxy can setup a poll with the proxy includes: a) specifying IT only—which can be used in case of stable IT intervals; b) specifying IT and D—this can be used in the case of stable IT and long D; c) RI only—in the case of stable RI (e.g., detected linear pattern); and d) RI and D—this may be used in the case of stable RI and long D.

Each of the setups can be selected based on the criteria shown in the flow diagram, starting at step 2802 where it is determined whether IT for a request of a given client/application (e.g., mobile application) is stable. If IT is not stable, in process 2812, it is determined whether RI is periodic and if not, no pattern has been detected yet in step 2820. RI is periodic, then the process continues to step 2822, as detailed below.

If IT is stable at 2802, it is determined whether 'IT' is zero in step 2804. If 'IT' is not zero at step 2804, it is determined whether 'RI' is more stable than 'IT' in step 2814. If not, the process continues to 2806. If so, the process proceeds to determine whether 'D' is stable or if long poll hunting pattern is detected in step 2822. If not, then the poll is setup for polling with 'RI' in step 2826. If at step 2822 D is stable and hunting pattern is detected, the process continues at step 2824 to determine whether 'D' is long, and if so, the poll is setup with both 'RI' and "D.' If not, the poll is just set up with 'RI in process 2826.

If 'IT' is detected to be zero at 2804, in step 2806 it is then determined whether 'D' is stable or if a hunting pattern (for a long poll) is detected. If so, in step 2808 it is determined whether 'D' is long, and if so, in step 2810 the intervals of 'D' and 'IT' can be used for polling. As such the determined 'D' and/or 'IT' can be specified to the proxy server, or other entity monitoring the content source on behalf of the mobile device or local proxy. If 'D' is determined to not be long in step 2808, the poll can be setup with just 'IT' in step 2818. However, if at 2806, 'D" is not detected to be stable and a hunting pattern is not detected, then no pattern has been detected as yet, as in step 2816.

A 'stable' interval can generally be used to refer to some level of repeatability or predictability in the interval within some tolerable threshold between two or more requests. For example, 'stable' could mean that two intervals are within 5%, 10%, 15%, or 20% of one another. In some instance, a larger differential may also be allowed. The threshold used to quality a 'stable' interval could be a static value or it could be a dynamic value which changes with real-time operating conditions, and/or a value which is varying based on device, user, OS, application, network operator, ISP, and/or other third party specifications, No stringent definition for 'stable' needs to be applied so long as the specified intervals used for polling of the proxy server on behalf of the mobile device does not significantly negatively impact the user's perception of performance or user experience.

Figure 29:
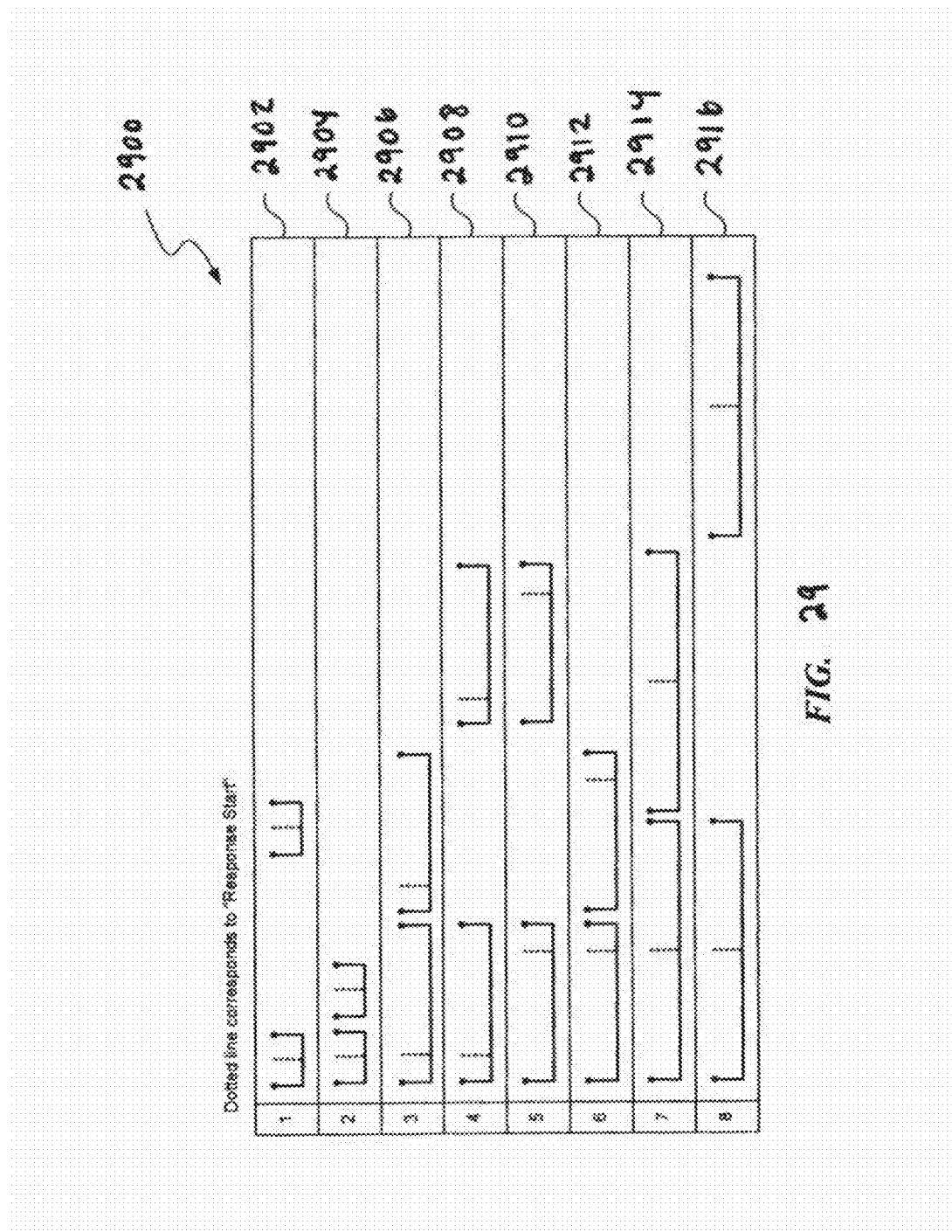
FIG. 29 depicts example timing diagrams showing timing characteristics for various types of request-response sequences.

FIG. 29 depicts example timing diagrams 2900 showing timing characteristics for various types of request-response sequences.

In FIG. 29, 8 time line combinations are illustrated, each containing 2 blocks of request-response sequences. In each sequence, the dotted line indicates a response in a request-response interval. Sequence 2902 is characterized by a short 'D', short 'RT', and long 'IT'. Thus sequence 2902 may be a typical poll. Sequence 2904 is characterized by a short 'D', a short 'RT', a short 'IT' and is indicative of a high polling rate. Sequence 2904 may also indicate that a user is actively interacting with the application and/or actively refreshing the application.

Sequence 2906 is characterized by a short 'D', a long 'RT' and short 'IT,' which can indicate possible streaming. Sequence 2908 is characterized by a short 'D', a long 'RT, and a long 'IT' which can indicate polling of large content. Sequence 2910 is characterized by a long 'D,' a short 'RT,' and a long 'IT, which may indicate a long poll with high latency allowed on the application level.

Sequence 2912, which has a long 'D', a short 'RT', and a short 'IT' may indicate a long poll. Sequence 2914, having a long 'D', long 'RT' and short 'IT' can indicate streaming or long poll of large content. Sequence 2916 has a long 'D' a 'long 'RT', and long 'IT' can be a combination of 2914 and 2910.

FIG. 30A depicts an example of a timing diagram 3000 showing timing characteristics for request and response sequences.

The present technology includes a distributed caching model which involves cooperation of the device-side proxy and server-side. In order for it to work after caching a response, the client-side component needs to notify the server-side proxy and also provide a rate that a particular resource (application server/content provider) must be polled at (to verify validity of cached content). After receiving this notification, the server-side proxy can then monitor the resource for changes (validating resource), and once a change is detected, the server-side component can notify the device-side component by sending an invalidation request.

The client-side component needs to provide a correct and suitable polling interval to the server-side proxy (e.g., the interval at which the server-side proxy is polling the resource to monitor it) for optimal performance, since if the polling interval is too low, the load is unnecessarily increased on the server-side proxy. By increasing the polling interval, the local proxy risks providing the expired/irrelevant information to the user at the user device.

As previously described, timing characteristics of request-responses sequences between a requesting client/application and content provider/application server can be used to determine application behavior and/or to categorize request type. Such information can be used to determine, identify, estimate, or predict an application's polling intervals such that an optimal polling interval at which server-side proxy needs to monitor the resource can be determined and provided to the server-side proxy.

The timing characteristics can include, for example, response/delay time to receive a response after a request has been sent and an idle time to send a subsequent request after the response has been received. The relationships of the various time intervals in a response-request sequence can be seen in the timing diagram 3000.

Each request-response time sequence can be described using all or some of the following events: 1) Start sending request (1705); 2) Request sent; 3) Response start (1710); 4) Response end (1720); and 5) Next request send (1715). The 'Response Start' 3010) indicates when the first bytes of response (HEADER) arrived and the 'Response end 3020' indicates when all response content has been received.

Using these events, the device-side can calculate the following intervals shown in 3000:

1. RI 3008—Request interval—Time between "Request Sent 0" and "Request Sent 1."
2. D 3004—Delay—Time between 'Request sent' and "First bytes of response (HEADER) arrived."
3. IT 3006—Idle time—Time between 'Whole Response content received 0" and 'Request Sent 1"
4. RT 3012—Response time—Time between "First bytes of response (HEADER) arrived." and 'Whole Response content received"

The relationship of the timing characteristic in a request-response sequence (RI=D+RT+IT) can be considered to extract application behavior information for use in caching content in a distributed fashion. Relative comparisons between different intervals can also be used to characterize the application and its requests.

In general, the device-side component of the distributed proxy can keep track of individual timing intervals in a request-response sequence and compare the values in a relative (e.g., bigger or smaller than another interval) or absolute manner (specific duration, long, short compared to a dynamic or static threshold value, etc.). The device-side component can track these interval values over time, check for stable components and determine or identify tendencies or patterns. For example, the device-side component can detect increasing or decreasing 'D' 3004 in the case of long poll hunting mode for long poll requests. FIG. 30B depicts an example of a timing diagram 3050 showing timing characteristics for request/response sequences characteristic of a long poll. Note that timing diagram 3050 may not be applicable to high latency long polls.

In one embodiment, a request can be detected, determined, or to be a long poll request based on a comparison of the response/delay time (D 3054) relative to the idle time (IT 3056) between request 0 3055 and response start time 3060. For example, the request can be detected to be a long poll request when the idle time is short compared to the response delay time (IT 3056<D 3054). The request can also be determined to be a long poll when IT 3056 is zero or substantially zero (~0).

In addition, the request can be determined or categorized as a long poll request if the idle time (IT 3056) indicates an immediate or near-immediate issuance of the subsequent request after receipt of the response (e.g., a short IT 3056).

In addition, a request can be determined to be a long poll if RI 3058=D 3054+RT 3062+IT 3056~D 3054+RT 3062. In one embodiment, the response time 'RT' 3062 can be used to determine bit rate (e.g., size in byte*8/time).

In general, different combinations of time intervals provide indications about polling pattern of the specific application or request and can be used by the device-side component to generate a polling interval for the server-side component to use in monitoring the content source.

Figure 31:
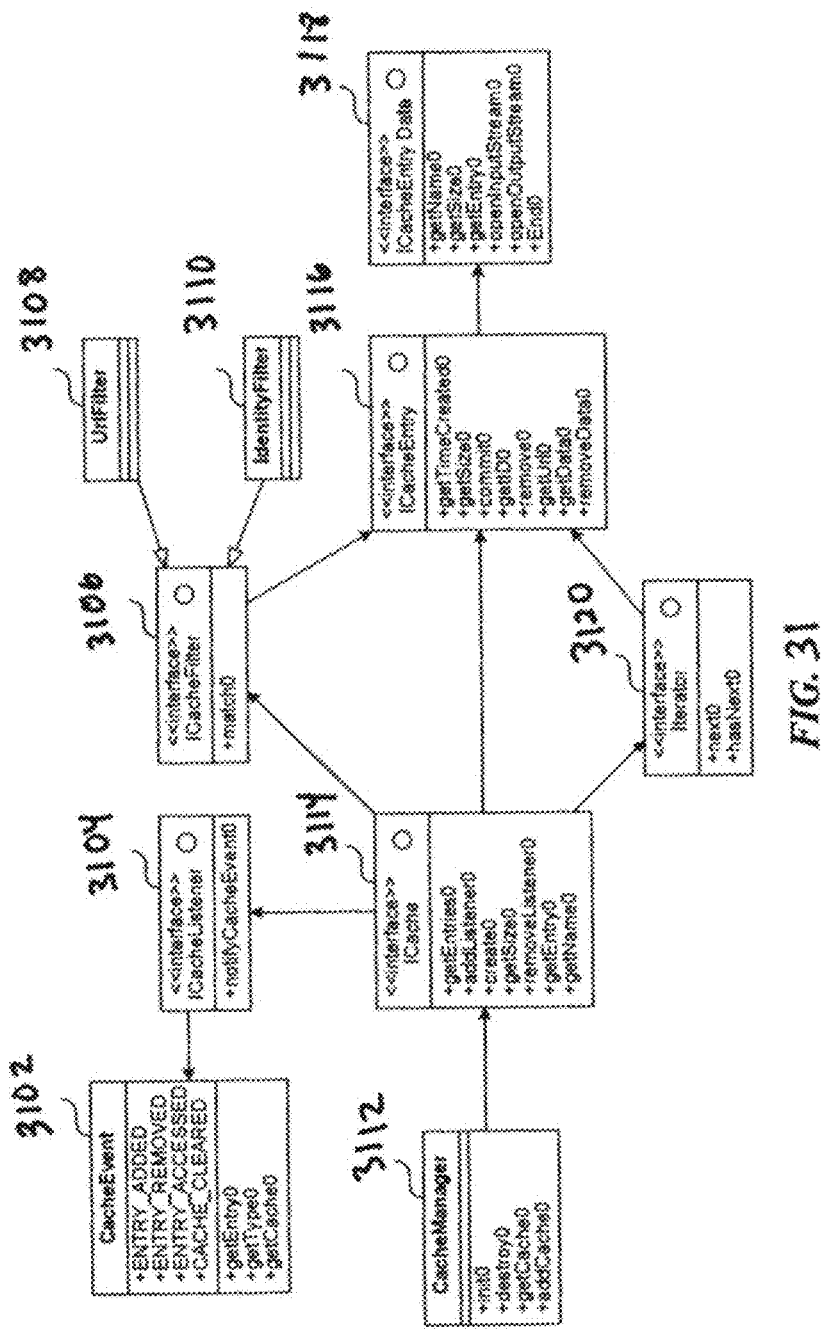
FIG. 31 depicts a diagram of an example of the component API layer for the cache store.

FIG. 31 depicts a diagram of an example of the component API layer for the cache store.

One example of the cache store component API layer can include the following entities: 1) Cache Manager 3112. Client facing entry point to the cache management system. This can allow registration of different caches for multiple applications/clients, providing them to relevant applications/clients when required. 2) ICache 3114. This entity represents a cache store, i.e., a mechanism for maintaining a pool of cache entries. Cache entries in the iCache can be queried, edited, removed, and/or updated with new entries. 3) ICacheListener 3104. This allows implementation of features in application/clients to enable receipt of cache related notifications. 4) CacheEvent 3102. This represents a cache related event. 5) Iterator 3120. This provides a mechanism for iterating on a collection of cache entries. 6) ICacheFilter 3106. This provides a mechanism for filtering cache entries. 7) UrlFilter 3108. This is a cache filter that allows performing cache lookups based on entry URIs. 8) IdentityFilter 3110. This is a cache filter that allows performing cache lookups based on entry IDs. 9) ICacheEntry 3116. This entity represents a single cache entry. Cache entry is identified either by ID or by URI; both generally must be unique in scope of a single cache. 10) ICacheEntryData 3118. This is a named data associated with some cache entry.

Figure 32:
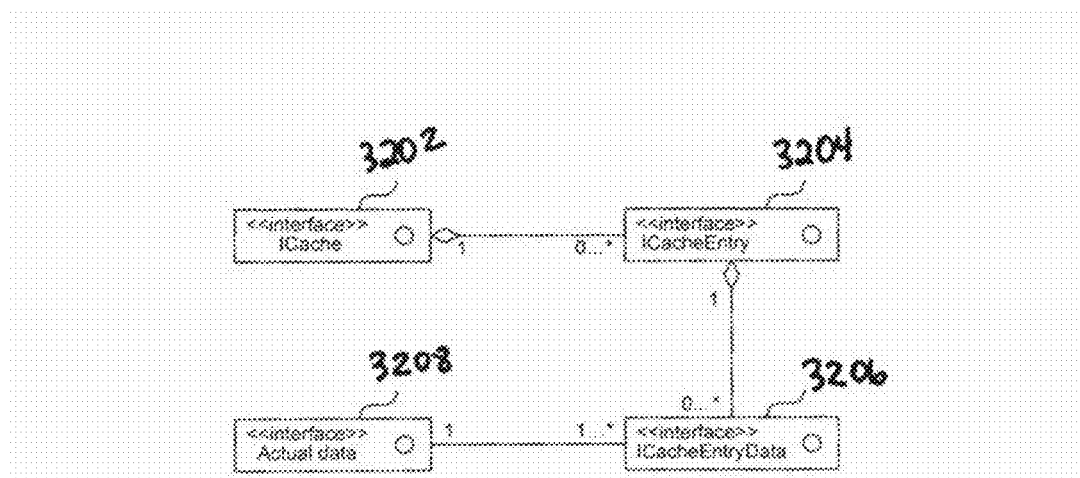
FIG. 32 depicts a diagram showing one example of the data model for the cache store.

FIG. 32 depicts a diagram showing one example of the data model for the cache store. Cache stores may be mobile platform specific. In one embodiment, cache stores can utilize hybrid storage, which can include the following components: 1) SQL file database for persisting cache entries, or 2) file system for persisting meta-data and binary response data. This configuration can be used for mobile platforms such as Android.

Figure 33:
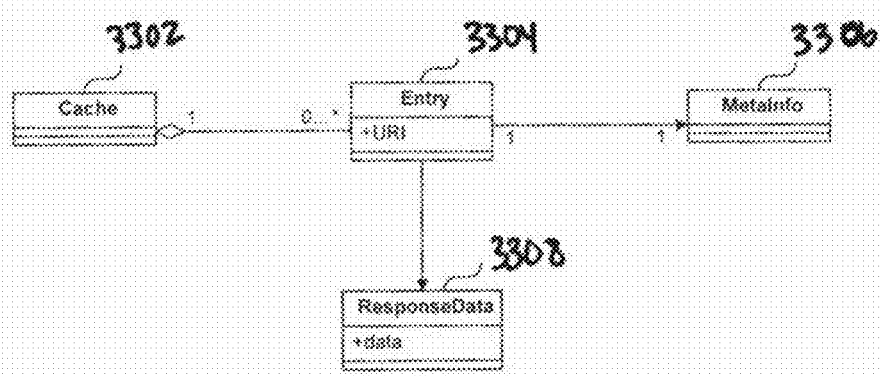
FIG. 33 depicts a conceptual diagram of one example of the data model of a cache entry in the cache store.

FIG. 33 depicts a conceptual diagram of one example of the data model of a cache entry 3304 in the cache store 3302. A given cache entry 3304 can be identified by an identifier (e.g., URI). In general, cache entries include a response data component (e.g., ResponseData field 2508) and any associated metadata (e.g., MetaInfo field 3306).

Figure 34A:
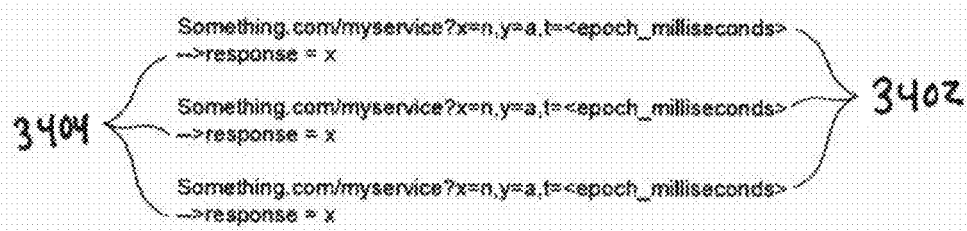
FIG. 34A-B depicts example request-response pairs showing cacheable responses addressed by identifiers with changing parameters.
Figure 34B:
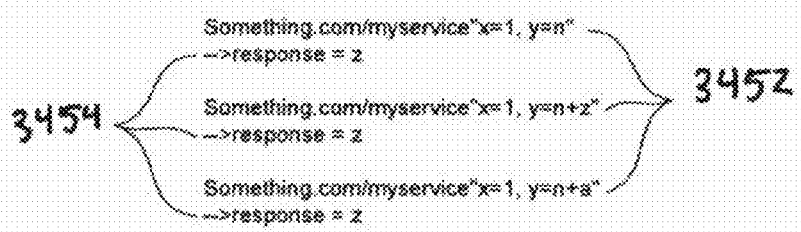

FIG. 34A-B depicts example request-response pairs showing cacheable responses 3404 and 3454 addressed by identifiers with changing parameters 3402 and 3452.

The request/response pairs shown in the examples of FIG. 34A illustrate timing parameters 3402 used for cache defeat since the responses 3404 received for each request is the same even though the timing parameters 3402 change each time. The resource identifier and the parameter 3402 can be identified as cache defeating upon the second time the 'response' is detected to be the same, or the third time, or a later subsequent time. The caching of the 'response=x' can similarly begin the second detected same response, the third detected same response, or a later subsequent detected same response.

Similarly, the request response pairs shown in the examples of FIG. 34B illustrate random parameters 3452 that are used for cache defeat since the responses 3454 received for each request is the same even though the random parameters 3452 in the identifiers are varying each time. The resource identifier and the parameter 3402 can be identified as cache defeating upon the second time the 'response' is detected to be the same, or the third time, or a later subsequent time. The caching of the 'response=x' can similarly begin the second detected same response, the third detected same response, or a later subsequent detected same response.

Although two types of changing parameters are shown (timing/date 3402 and random parameter 3452), other types of changing parameters may be used for cache defeat and can be similarly detected by the system.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." As used herein, the terms "connected," "coupled," or any variant thereof, means any connection or coupling, either direct or indirect, between two or more elements; the coupling of connection between the elements can be physical, logical, or a combination thereof. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or," in reference to a list of two or more items, covers all of the following interpretations of the word: any of the items in the list, all of the items in the list, and any combination of the items in the list.

The above detailed description of embodiments of the disclosure is not intended to be exhaustive or to limit the teachings to the precise form disclosed above. While specific embodiments of, and examples for, the disclosure are described above for illustrative purposes, various equivalent modifications are possible within the scope of the disclosure, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified to provide alternative or sub-combinations. Each of these processes or blocks may be implemented in a variety of different ways. Also, while processes or blocks are at times shown as being performed in series, these processes or blocks may instead be performed in parallel, or may be performed at different times. Further any specific numbers noted herein are only examples: alternative implementations may employ differing values or ranges.

The teachings of the disclosure provided herein can be applied to other systems, not necessarily the system described above. The elements and acts of the various embodiments described above can be combined to provide further embodiments.

Any patents and applications and other references noted above, including any that may be listed in accompanying filing papers, are incorporated herein by reference. Aspects of the disclosure can be modified, if necessary, to employ the systems, functions, and concepts of the various references described above to provide yet further embodiments of the disclosure.

These and other changes can be made to the disclosure in light of the above Detailed Description. While the above description describes certain embodiments of the disclosure, and describes the best mode contemplated, no matter how detailed the above appears in text, the teachings can be practiced in many ways. Details of the system may vary considerably in its implementation details, while still being encompassed by the subject matter disclosed herein. As noted above, particular terminology used when describing certain features or aspects of the disclosure should not be taken to imply that the terminology is being redefined herein to be restricted to any specific characteristics, features, or aspects of the disclosure with which that terminology is associated. In general, the terms used in the following claims should not be construed to limit the disclosure to the specific embodiments disclosed in the specification, unless the above Detailed Description section explicitly defines such terms. Accordingly, the actual scope of the disclosure encompasses not only the disclosed embodiments, but also all equivalent ways of practicing or implementing the disclosure under the claims.

While certain aspects of the disclosure are presented below in certain claim forms, the inventors contemplate the various aspects of the disclosure in any number of claim forms. For example, while only one aspect of the disclosure is recited as a means-plus-function claim under 35 U.S.C. §112, ¶6, other aspects may likewise be embodied as a means-plus-function claim, or in other forms, such as being embodied in a computer-readable medium. (Any claims intended to be treated under 35 U.S.C. §112, ¶6 will begin with the words "means for.") Accordingly, the applicant reserves the right to add additional claims after filing the application to pursue such additional claim forms for other aspects of the disclosure

What is claimed is:

1. A method for enhancing resource management in a wireless network through selective data compression and messaging alignment to reduce mobile data traffic and signaling traffic, the method, comprising:

compressing, using a compression dictionary, an uncompressed data chunk in a data stream to be transmitted over the wireless network to generate a compressed data chunk;

comparing sizes of the uncompressed data chunk with the compressed data chunk;

optimizing the data stream by batching multiple transactions for transmission over the wireless network such that a wireless connection need not be established in the wireless network every time each of the multiple transactions occurs;

wherein the data is individually batched for each of the users;

optimizing the data stream by delaying transmission thereof until detection of a trigger; and transmitting the optimized data stream comprising of the uncompressed data chunk or the compressed data chunk over the wireless network, depending on which is smaller in size, wherein the compression dictionary is updated if the compressed chunk is transmitted and wherein the compression dictionary is not updated if the uncompressed chunk is transmitted.

2. The method of claim 1, wherein a header is included in the optimized data stream to indicate which of the uncompressed data chunk and the compressed data chunk is transmitted.

3. The method of claim 1, wherein, the data stream is to be transmitted in a distributed traffic management system having a local proxy on a mobile device and a proxy server remote from the mobile device, wherein, the proxy server is able to establish wireless connectivity to the mobile device.

4. The method of claim 1, wherein, the compression dictionary is not transmitted if the uncompressed data chunk is transmitted in the optimized data stream.

5. The method of claim 3, wherein the compression dictionary is applied when the compressed data chunk is transmitted to decode the compressed data chunk.

6. The method of claim 3, wherein, synchronization is maintained across compressed data chunks and uncompressed data chunks sent between the proxy server and the mobile device.

7. The method of claim 1, wherein, the data stream runs above a transport layer and below a session layer.

8. The method of claim 3, wherein, the data stream is sent from the proxy server to the local proxy of the mobile device; wherein, the compression is performed by the proxy server.

9. The method of claim 8, wherein, the data stream includes cache-related content or information.

10. The method of claim 3, wherein, the data stream is sent from the local proxy of the mobile device to the proxy server; wherein, the compression is performed by the local proxy.

11. The method of claim 1, wherein the trigger is a radio up event on the mobile device.

12. The method of claim 1, wherein the trigger is receipt of a high priority data.

* * * * *